(12) United States Patent
Fukushima et al.

(10) Patent No.: US 8,617,724 B2
(45) Date of Patent: Dec. 31, 2013

(54) POLYMER COMPOUND AND LIGHT EMITTING DEVICE USING THE SAME

(75) Inventors: Daisuke Fukushima, Ushiku (JP); Kazuei Ohuchi, Tsukuba (JP); Brian Tierney, Cambridgeshire (GB); Natasha Conway, Cambridgeshire (GB); Mary McKiernan, Cambridgeshire (GB)

(73) Assignees: Sumitomo Chemical Company, Limited, Tokyo (JP); Cambridge Display Technology Limited, Cambridgeshire (GB)

( * ) Notice: Subject to any disclaimer, the term of this patent is extended or adjusted under 35 U.S.C. 154(b) by 87 days.

(21) Appl. No.: 13/016,847

(22) Filed: Jan. 28, 2011

(65) Prior Publication Data

US 2011/0187266 A1    Aug. 4, 2011

(30) Foreign Application Priority Data

Jan. 28, 2010   (JP) ................. P2010-016532

(51) Int. Cl.
    *H01L 51/54*      (2006.01)

(52) U.S. Cl.
    USPC ........... 428/690; 313/504; 313/505; 313/506; 257/40; 257/E51.05; 257/E51.026; 257/E51.032; 585/27; 528/394; 528/397; 528/422

(58) Field of Classification Search
    USPC .................. 428/690, 917; 313/504, 505, 506; 257/40, E51.05, E51.026, E51.032; 585/27; 528/394, 397, 422
    See application file for complete search history.

(56) References Cited

U.S. PATENT DOCUMENTS 5,777,070 A    7/1998   Inbasekaran et al.
2002/0106531 A1   8/2002   Naito (Continued)

FOREIGN PATENT DOCUMENTS

EP    2110399 A1   10/2009
GB    2454890 A    5/2009

(Continued)

OTHER PUBLICATIONS

Wing et al., Ter(9,9-diarylfluorene)s: Highly Efficient Blue Emitter with the Promising Electrochemical and Thermal Stability, 2002, Journal American Chemical Society, col. 124, paged 11576-11577.*

(Continued)

*Primary Examiner* — Gregory Clark
(74) *Attorney, Agent, or Firm* — Sughrue Mion, PLLC

(57) ABSTRACT

A polymer compound that, when used for fabrication of a light emitting device, results in an excellent luminance lifetime for the obtained light emitting device. A polymer compound comprising a constitutional unit represented by formula (1).

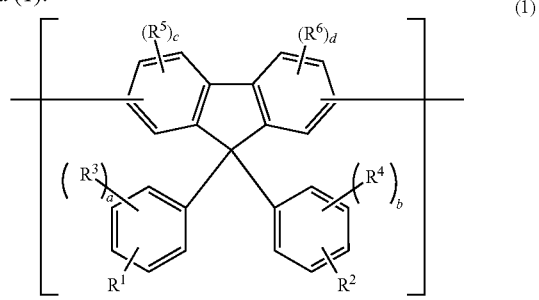

(1)

(In the formula, $R^1$ and $R^2$ each independently represent an unsubstituted alkyl group. $R^3$ and $R^4$ each independently represent a group other than an unsubstituted alkyl group. $R^5$ and $R^6$ each independently represent an unsubstituted or substituted alkyl, unsubstituted or substituted alkoxy or unsubstituted or substituted aryl group. The letters a and b each independently represent an integer of 0-4. The letters c and d each independently represent an integer of 0-3. When multiple $R^3$, $R^4$, $R^5$ and $R^6$ groups are present, they may be the same or different.)

13 Claims, 3 Drawing Sheets

(56) References Cited

U.S. PATENT DOCUMENTS

| | | | |
|---|---|---|---|
| 2004/0170863 A1* | 9/2004 | Kim et al. | 428/690 |
| 2006/0228576 A1 | 10/2006 | Burroughes et al. | |
| 2007/0252139 A1* | 11/2007 | Mckiernan et al. | 257/40 |
| 2008/0265755 A1* | 10/2008 | Yu et al. | 313/504 |
| 2010/0276674 A1 | 11/2010 | Conway et al. | |

FOREIGN PATENT DOCUMENTS

| | | | |
|---|---|---|---|
| JP | 2001-520289 A | | 10/2001 |
| JP | 2002-527553 A | | 8/2002 |
| JP | 2002-280183 A | | 9/2002 |
| JP | 2004-002654 A | | 1/2004 |
| JP | 2004-532325 A | | 10/2004 |
| JP | 2006-505647 A | | 2/2006 |
| JP | 2010-010438 A | | 1/2010 |
| JP | 2010-053349 A | | 3/2010 |
| JP | 2010-215886 A | | 9/2010 |
| WO | 02/092724 A1 | | 11/2002 |
| WO | 03/095586 A1 | | 11/2003 |
| WO | 2004/041902 A3 | | 5/2004 |
| WO | 2006/109083 A1 | | 10/2006 |
| WO | WO 2006/109083 | * | 10/2006 |
| WO | 2007/109518 A3 | | 9/2007 |
| WO | 2010/065178 A1 | | 6/2010 |

OTHER PUBLICATIONS

Andrew C. Grimsdale, et al., "Correlation Between Molecular Structure, Microscopic Morphology, and Optical Properties of Poly(tetraalkylindenofluorene)s", Advanced Functional Materials, 2002, pp. 729-733, vol. 12, No. 10, Scheme 1.

Sepas Setayesh, et al., "Polyflourenes with Polyphenylene Dendron Side Chains: Toward Non-Aggregating, Light-Emitting Polymers", Journal of American Chemical Society, 2001, pp. 946-953, vol. 123, Scheme 5.

Translation of the International Preliminary Report on Patentability issued Sep. 27, 2012 in International Application No. PCT/JP2011/051707 to Sumitomo Chemical Co., Ltd.

Extended European Search Report issued Apr. 23, 2013 in European Patent Application No. 11737138.5 to Sumitomo Chemical Co., Ltd., et al.

* cited by examiner

POLYMER COMPOUND AND LIGHT EMITTING DEVICE USING THE SAME

BACKGROUND OF THE INVENTION

1. Field of the Invention

The present invention relates to a polymer compound. More specifically, the present invention relates to a fluorene-based polymer compound and to a light emitting device using it.

2. Related Background Art

Light emitting devices such as organic electroluminescence devices have been an object of interest in recent years as their properties including low voltage driving and high luminance render them suitable for use in displays and the like. Luminescent materials and charge transport materials are used in the production of light emitting devices.

Polymer compounds that allow formation of organic layers by dissolution in solvents and coating are being studied as luminescent materials and charge transport materials, and as such polymer compounds there have been proposed polymer compounds that comprise constitutional units derived from fluorene having alkyl group substituents (Patent literature 1).

CITATION LIST

Patent Literature

[Patent literature 1] Japanese Patent Public Inspection No. 2001-520289

SUMMARY OF THE INVENTION

However, when the polymer compounds mentioned above are used to fabricate light emitting devices, the luminance lifetime of the light emitting devices are less than adequate.

It is therefore an object of the present invention to provide a polymer compound that, when used for fabrication of a light emitting device, results in an excellent luminance lifetime for the obtained light emitting device.

To achieve the objective mentioned above, the invention provides, firstly, a polymer compound comprising a constitutional unit represented by formula (1).

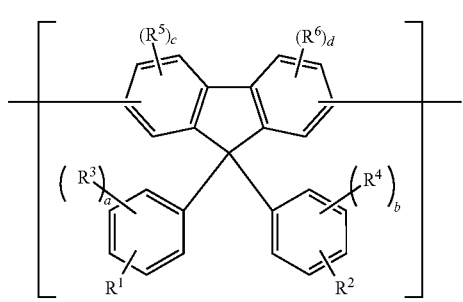

(In formula (1), $R^1$ and $R^2$ each independently represent an unsubstituted alkyl group. $R^3$ and $R^4$ each independently represent a group other than an unsubstituted alkyl group. $R^5$ and $R^6$ each independently represent an unsubstituted or substituted alkyl, unsubstituted or substituted alkoxy or unsubstituted or substituted aryl group. The letters a and b each independently represent an integer of 0-4. The letters c and d each independently represent an integer of 0-3. When multiple $R^3$, $R^4$, $R^5$ and $R^6$ groups are present, they may be the same or different.)

The constitutional unit represented by formula (1) is preferably a constitutional unit represented by formula (2).

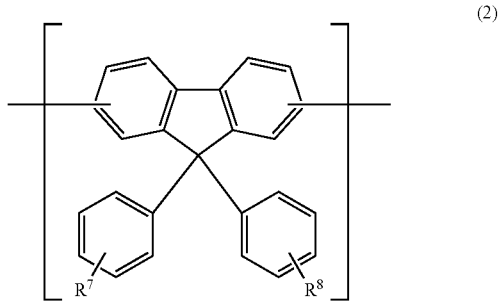

(In formula (2), $R^7$ and $R^8$ each independently represent an unsubstituted alkyl group.)

The constitutional unit represented by formula (2) is preferably a constitutional unit represented by formula (3), (4), (5), (3A), (4A) or (5A).

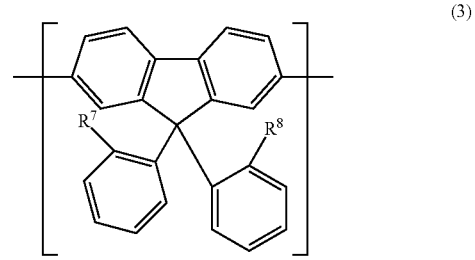

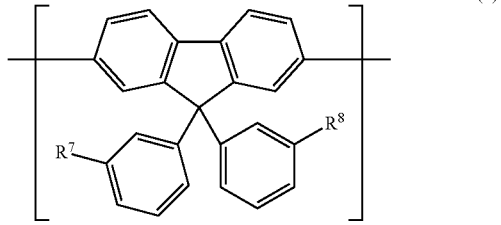

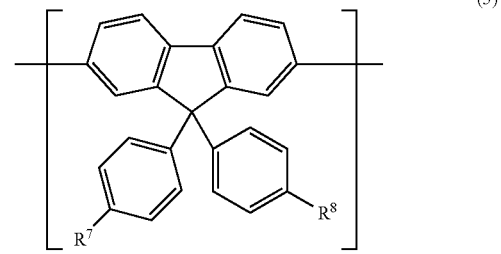

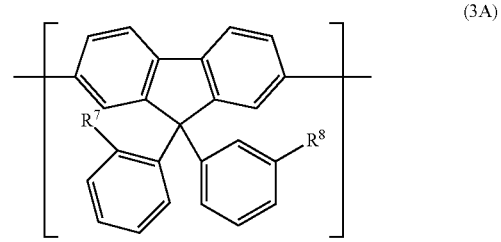

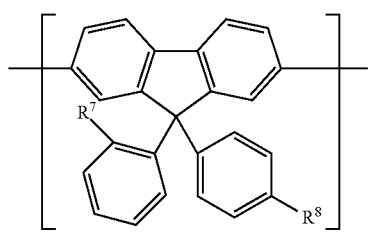
(4A)

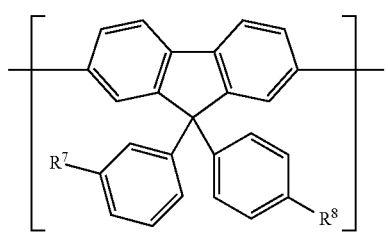
(5A)

(In formula (3), (4), (5), (3A), (4A) and (5A), $R^7$ and $R^8$ have the same meaning as above.)

The constitutional unit represented by formula (1) may also preferably be a constitutional unit represented by formula (2A).

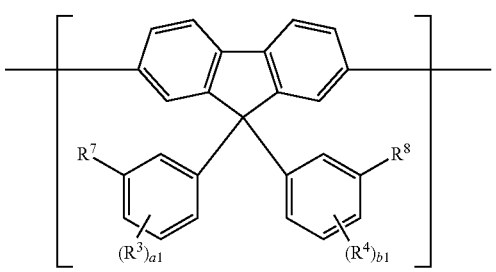
(2A)

(In formula (2A), $R^3$ and $R^4$ have the same meaning as above. $R^7$ and $R^8$ each independently represent an unsubstituted alkyl group. The letters a1 and b1 each independently represent an integer of 1-4. When multiple $R^3$ and $R^4$ groups are present, they may be the same or different.)

The polymer compound of the invention preferably further comprises one or more constitutional units selected from the group consisting of constitutional units represented by formula (6) and constitutional units represented by formula (7).

$$\mathrm{-\!\!\!+\!\!Ar^1\!\!+\!\!-}\qquad(6)$$

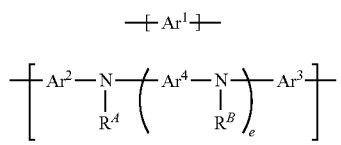
(7)

(In formula (6), $Ar^1$ represents an unsubstituted or substituted arylene or unsubstituted or substituted divalent heterocyclic group.

In formula (7), $Ar^2$, $Ar^3$ and $Ar^4$ each independently represent an unsubstituted or substituted arylene group, an unsubstituted or substituted divalent aromatic heterocyclic group, or an unsubstituted or substituted divalent group bonded to two aromatic rings by a single bond. $R^A$ and $R^B$ each independently represent hydrogen, an unsubstituted or substituted alkyl group, an unsubstituted or substituted aryl group, or an unsubstituted or substituted monovalent heterocyclic group. The letter e represents 0 or 1.)

In particular, the constitutional unit represented by formula (6) is preferably a constitutional unit represented by formula (8), (9) or (10).

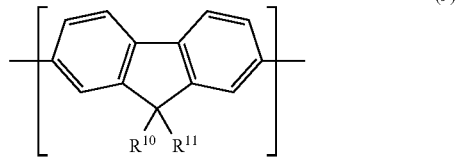
(8)

(9)

(10)

(In formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group. The letter f represents an integer of 0-4. Multiple $R^9$ groups may be the same or different.

In formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group. In formula (10), $R^{12}$ represents an unsubstituted alkyl, unsubstituted aryl, unsubstituted alkylaryl, unsubstituted alkoxyaryl or unsubstituted alkoxycarbonylaryl group. X is a single bond, —O—, —S— or —C($R^C$)$_2$—. $R^C$ represents an unsubstituted alkyl, unsubstituted aryl, unsubstituted alkylaryl or unsubstituted alkoxyaryl group, and the two $R^C$ groups may be the same or different.

The constitutional unit represented by formula (7) is preferably a constitutional unit represented by formula (14).

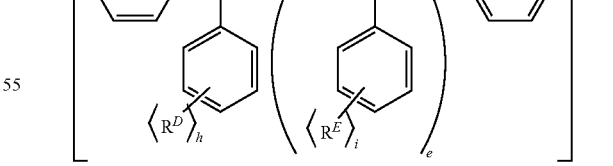
(14)

(In formula (7), $Ar^4$ has the same meaning as above. $R^D$ and $R^E$ each independently represent an unsubstituted alkyl, unsubstituted alkoxy, unsubstituted aryl, unsubstituted alkylaryl, unsubstituted alkoxyaryl or unsubstituted alkoxycarbonyl group. The letters h and i each independently represent an integer of 0-5. When multiple $R^D$ and $R^E$ groups are present, they may be the same or different. The letter e represents 0 or 1.)

The polymer compound of the invention more preferably further comprises one or more constitutional units selected from the group consisting of constitutional units represented by formula (11), constitutional units represented by formula (12) and constitutional units represented by formula (13).

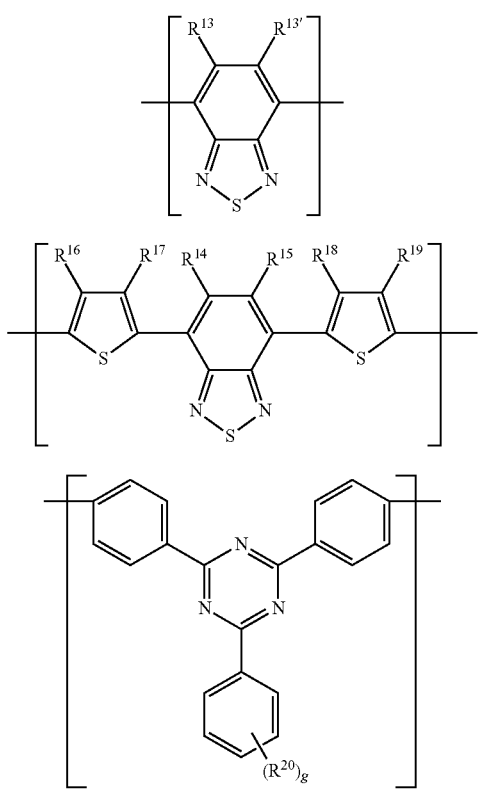

(In formula (11), $R^{13}$ and $R^{13'}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group.

In formula (12), $R^{14}$, $R^{15}$, $R^{16}$, $R^{17}$, $R^{18}$ and $R^{19}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group.

In formula (13), $R^{20}$ represents an unsubstituted alkyl, unsubstituted alkoxy, unsubstituted aryl, alkylaryl, unsubstituted alkoxyaryl or unsubstituted alkoxycarbonylaryl group. The letter g represents an integer of 0-5. Multiple $R^{20}$ groups may be the same or different.

From the above viewpoint, the polymer compound of the invention preferably consists of a constitutional unit represented by formula (1), and one or more constitutional units selected from the group consisting of constitutional units represented by formula (8), constitutional units represented by formula (9), constitutional units represented by formula (10) and constitutional units represented by formula (14).

The polymer compound of the invention may also preferably consist of a constitutional unit represented by formula (1), at least one constitutional unit selected from the group consisting of constitutional units represented by formula (8), constitutional units represented by formula (9), constitutional units represented by formula (10) and constitutional units represented by formula (14), and at least one constitutional unit selected from the group consisting of constitutional units represented by formula (11), constitutional units represented by formula (12) and constitutional units represented by formula (13).

The invention provides, secondly, a composition comprising at least one material selected from the group consisting of hole transport materials, electron transport materials and luminescent materials, and the aforementioned polymer compound of the invention, as well as a composition comprising the aforementioned polymer compound of the invention and a solvent. The luminescent material is preferably a triplet light emitting complex.

The invention provides, thirdly, a thin-film comprising the polymer compound of the invention.

The invention provides, fourthly, a light emitting device having electrodes consisting of an anode and a cathode, and a layer comprising the aforementioned polymer compound formed between the electrodes thereof.

By having the specific structures mentioned above, the polymer compound of the invention is a polymer compound that, when used to fabricate a light emitting device, results in an excellent luminance lifetime of the obtained light emitting device. Therefore, the polymer compound of the invention is useful, for example, as an electronic part material, such as a luminescent material or charge transport material. Thus, the polymer compound and light emitting device of the invention are useful for liquid crystal display backlights, curved or flat light sources for illumination, segment type display devices, dot matrix flat panel displays, and the like.

DETAILED DESCRIPTION OF THE INVENTION

Figure 1:
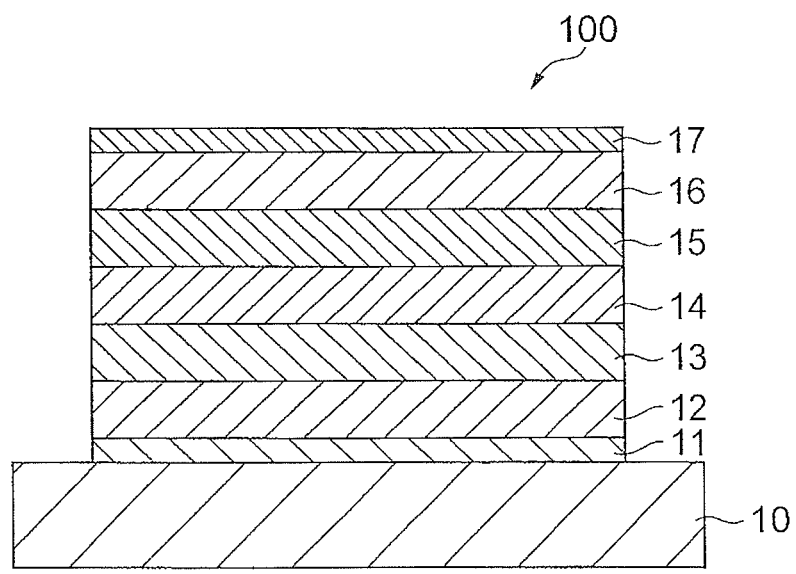
FIG. 1 is a schematic cross-sectional view of an embodiment of the light emitting device of the invention.

The terms used throughout the present specification will be explained first.

The term "constitutional unit" refers to a unit of which at least one is present in the polymer compound.

The term "n-valent heterocyclic group" (n being 1 or 2) refers to a group derived by removing n hydrogen atoms from a heterocyclic compound (especially an aromatic heterocyclic compound).

The term "heterocyclic compound" refers to an organic compound with a ring structure, wherein the devices composing the ring are not only carbon atoms but include a heteroatom such as an oxygen atom, sulfur atom, nitrogen atom, phosphorus atom or boron atom.

The term "arylene group" refers to an atomic group derived by removing 2 hydrogens from an aromatic hydrocarbon.

The term "aryl group" refers to an atomic group derived by removing one hydrogen from an aromatic hydrocarbon, and it includes groups with fused rings, and directly bonded independent benzene rings or two or more fused rings.

<Polymer Compound>
The following is a detailed description of the polymer compound of the preferable embodiment.

—Constitutional Unit Represented by Formula (1)—
The polymer compound of the invention comprises a constitutional unit represented by formula (1) above.

In formula (1), $R^1$ and $R^2$ each independently represent an unsubstituted alkyl group. The unsubstituted alkyl group may be a straight-chain, branched or cyclic group. Usually the unsubstituted alkyl group will have 1-20, preferably 1-15, more preferably 3-10 and even more preferably 4-8 carbon atoms. Unsubstituted alkyl groups include methyl, ethyl, n-propyl, isopropyl, n-butyl, isobutyl, tert-butyl, n-pentyl, isoamyl, n-hexyl, cyclohexyl, n-heptyl, n-octyl, 2-ethylhexyl, n-nonyl, n-decyl, 3,7-dimethyloctyl and lauryl. Since balance between solubility of the polymer compound in organic solvents and heat resistance is improved, they are preferably methyl, ethyl, n-propyl, isopropyl, n-butyl, isobutyl, tert-butyl, n-pentyl, isoamyl, n-hexyl, n-octyl, 2-ethylhexyl or 3,7-dimethyloctyl groups, and more preferably n-butyl, isobutyl, tert-butyl, n-pentyl, isoamyl, n-hexyl, n-octyl, 2-ethylhexyl or 3,7-dimethyloctyl groups.

In formula (1), $R^3$ and $R^4$ each independently represent a group other than an unsubstituted alkyl group. Groups other than unsubstituted alkyl groups are preferably unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen atoms, unsubstituted alkoxycarbonyl, unsubstituted carboxyl or cyano groups. More preferably they are substituted alkyl, unsubstituted or substituted alkoxy, unsubstituted or substituted aryl, unsubstituted or substituted monovalent heterocyclic or unsubstituted alkoxycarbonyl groups, even more preferably unsubstituted or substituted alkoxy, unsubstituted or substituted aryl or unsubstituted alkoxycarbonyl groups, and most preferably substituted aryl groups.

The unsubstituted or substituted alkoxy group may be straight-chain, branched or cyclic. The number of carbon atoms is usually 1-20, preferably 1-15, and more preferably 4-10, not including the number of carbon atoms of substituents. Unsubstituted or substituted alkoxy groups include methoxy, ethoxy, n-propyloxy, isopropyloxy, n-butyloxy, isobutyloxy, tert-butyloxy, n-pentyloxy, n-hexyloxy, cyclohexyloxy, n-heptyloxy, n-octyloxy, 2-ethylhexyloxy, n-nonyloxy, n-decyloxy, 3,7-dimethyloctyloxy, lauryloxy, trifluoromethoxy, pentafluoroethoxy, perfluorobutoxy, perfluorohexyloxy, perfluorooctyloxy, methoxymethyloxy, 2-methoxyethyloxy and 2-ethoxyethyloxy groups. Since balance between solubility of the polymer compound in the organic solvent and heat resistance is improved, n-butyloxy, n-pentyloxy, n-hexyloxy, n-octyloxy, 2-ethylhexyloxy, n-decyloxy, 3,7-dimethyloctyloxy and 2-ethoxyethyloxy groups are preferred.

The number of carbon atoms in the unsubstituted or substituted aryl group is usually 6-60, preferably 6-48, more preferably 6-20 and even more preferably 6-10, not including the number of carbon atoms of substituents. Unsubstituted or substituted aryl groups include phenyl, 1-naphthyl, 2-naphthyl, 1-anthracenyl, 2-anthracenyl, 9-anthracenyl, 1-pyrenyl, 2-pyrenyl, 4-pyrenyl, 2-perylenyl, 3-perylenyl, 2-fluorenyl, 3-fluorenyl, 4-fluorenyl, 1-biphenylenyl, 2-biphenylenyl, 2-phenanthrenyl, 9-phenanthrenyl, 2-phenylphenyl, 3-phenylphenyl, 4-phenylphenyl, and these groups whose hydrogen(s) is replaced with alkyl, alkoxy, alkyloxycarbonyl, acyl, N,N-dialkylamino, N,N-diarylamino, cyano, nitro, chlorine, fluorine or the like. Since the balance between solubility of the polymer compound in the organic solvent and heat resistance is improved, phenyl groups and alkyl-substituted phenyl groups are preferred.

Alkyl-substituted phenyl groups include 2-methylphenyl, 3-methylphenyl, 4-methylphenyl, 3-n-butylphenyl, 4-n-butylphenyl, 4-tert-butylphenyl, 3-n-hexylphenyl, 4-n-hexylphenyl, 4-n-octylphenyl, 3,5-dimethylphenyl, 3-n-hexyl-5-methylphenyl and 3,5-dihexylphenyl.

The number of carbon atoms in the unsubstituted or substituted aryloxy group is usually 6-60 and preferably 7-48, not including the number of carbon atoms of substituents. Unsubstituted or substituted aryloxy groups include phenoxy, 1-naphthyloxy, 2-naphthyloxy, 1-anthracenyloxy, 9-anthracenyloxy, 1-pyrenyloxy, and these groups whose hydrogen(s) is replaced with alkyl, alkoxy, alkyloxycarbonyl, acyl, N,N-dialkylamino, N,N-diarylamino, cyano, nitro, chlorine or fluorine or the like.

The number of carbon atoms in the unsubstituted or substituted monovalent heterocyclic group is usually 4-60 and preferably 4-20, not including the number of carbon atoms of substituents. Unsubstituted or substituted monovalent heterocyclic groups include thienyl, pyrrolyl, furyl, pyridyl, piperidyl, quinolyl, isoquinolyl, pyrimidyl, triazinyl, and these groups whose hydrogen(s) is replaced with alkyl, alkoxy or the like. Of these, thienyl, pyridyl, quinolyl, isoquinolyl, pyrimidyl, triazinyl and these groups whose hydrogen(s) is replaced with alkyl, alkoxy or the like are preferred, and more preferred are pyridyl, pyrimidyl, triazinyl and these groups whose hydrogen(s) is replaced with alkyl, alkoxy or the like.

The substituted amino groups may be amino groups substituted with one or more groups selected from the group consisting of unsubstituted alkyl, unsubstituted or substituted aryl and unsubstituted or substituted monovalent heterocyclic groups. The definitions and examples of unsubstituted alkyl, unsubstituted or substituted aryl and unsubstituted or substituted monovalent heterocyclic groups are the same as above. The number of carbon atoms of the substituted amino group will usually be 1-50, is preferably 2-30, and more preferably 12-24. Substituted amino groups include methylamino, dimethylamino, di-n-propylamino, diisopropylamino, di-n-butylamino, di-tert-butylamino, dicyclohexylamino, di-n-octylamino, phenylamino, diphenylamino, di(4-methylphenyl)amino and di(4-tert-butylphenyl)amino.

The substituted silyl groups may be silyl groups substituted with 1-3 groups selected from the group consisting of unsubstituted alkyl, unsubstituted or substituted aryl and unsubstituted or substituted monovalent heterocyclic groups. The definitions and examples of unsubstituted alkyl, unsubstituted or substituted aryl and unsubstituted or substituted monovalent heterocyclic groups are the same as above. The number of carbon atoms in the substituted silyl group is usually 1-60 and preferably 3-48. Substituted silyl groups include trimethylsilyl, triethylsilyl, tri-n-propylsilyl, tri-isopropylsilyl, dimethyl-isopropylsilyl, tert-butyldimethylsilyl, triphenylsilyl, tri-p-xylylsilyl, tribenzylsilyl, diphenylmethylsilyl, tert-butyldiphenylsilyl and dimethylphenylsilyl.

Halogen atoms include fluorine, chlorine, bromine and iodine atoms, with fluorine atoms being preferred.

The number of carbon atoms of the unsubstituted alkoxycarbonyl group is usually 2-60 and preferably 2-10. Unsubstituted alkoxycarbonyl groups include methoxycarbonyl, ethoxycarbonyl, n-propyloxycarbonyl, isopropyloxycarbonyl, n-butyloxycarbonyl and tert-butyloxycarbonyl.

In formula (1), $R^5$ and $R^6$ each independently represent an unsubstituted or substituted alkyl, unsubstituted or substituted alkoxy or unsubstituted or substituted aryl group.

The definitions and examples of unsubstituted alkyl groups represented by $R^5$ and $R^6$ are the same as the definitions and examples of unsubstituted alkyl groups represented by $R^1$ and $R^2$.

The substituted alkyl groups represented by $R^5$ and $R^6$ may be straight-chain, branched or cyclic. The number of carbon atoms is usually 1-20, preferably 1-15 and more preferably 1-10, not including the number of carbon atoms of substituents. The substituted alkyl groups may include alkyl groups substituted with halogen atoms, such as trifluoromethyl, pentafluoroethyl, perfluorobutyl, perfluorohexyl and perfluorooctyl, alkyl groups substituted with aryl groups, such as phenylmethyl and 4-(4-hexylphenyl)butyl, and alkyl groups substituted with alkoxy groups such as ethyloxymethyl and ethyloxyethyl.

The definitions and examples of unsubstituted or substituted alkoxy groups and unsubstituted and substituted aryl groups represented by $R^5$ and $R^6$ are, respectively, the same definitions and examples of unsubstituted or substituted alkoxy groups and unsubstituted and substituted aryl groups represented by $R^3$ and $R^4$.

In formula (1), a and b each independently represent an integer of 0-4, preferably represent an integer of 0-2, more preferably represent 0 or 1, and even more preferably represent 0.

In formula (1), c and d each independently represent an integer of 0-3, preferably represent an integer of 0 or 1, and even more preferably represent 0.

Since luminance lifetime is better when the polymer compound is used for fabrication of a light emitting device, the constitutional unit represented by formula (1) is preferably a constitutional unit represented by formula (2), more preferably a constitutional unit represented by formula (3), (4), (5), (3A), (4A) or (5A), more preferably a constitutional unit represented by formula (3), (4), (3A), (4A) or (5A) above, particularly preferably a constitutional unit represented by formula (4), (4A) or (5A) above, and most preferably a constitutional unit represented by formula (4) above.

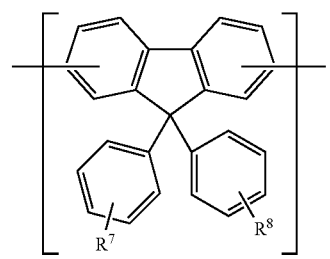

(2)

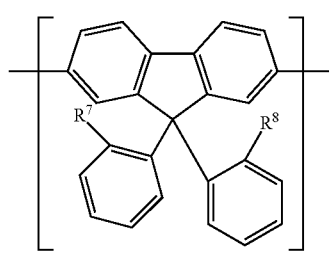

(3)

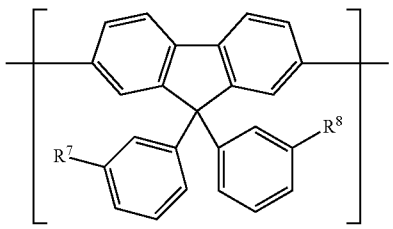

(4)

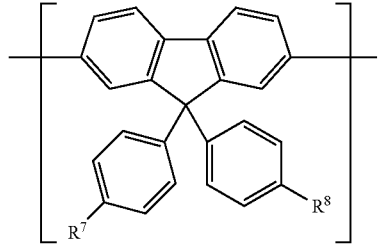

(5)

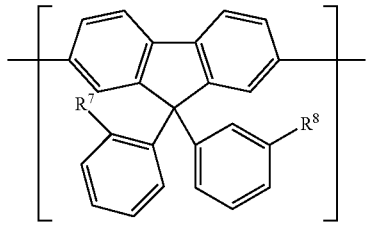

(3A)

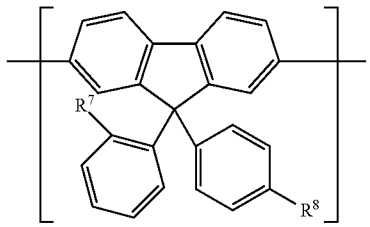

(4A)

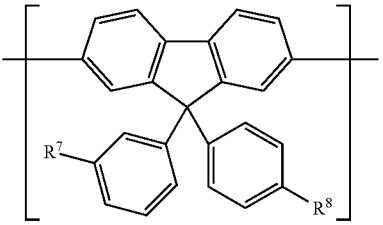

(5A)

(In formulas (2), (3), (4), (5), (3A), (4A) and (5A), respectively, $R^7$ and $R^8$ represent unsubstituted alkyl groups.)

The definitions and examples of unsubstituted alkyl groups represented by $R^7$ and $R^8$ in formulas (2), (3), (4), (5), (3A), (4A) and (5A) are the same as the definitions and examples of unsubstituted alkyl groups represented by $R^1$ and $R^2$ in formula (1).

Also, since the heat resistance of the polymer compound and driving voltage of the obtained light emitting device are better, the constitutional unit represented by formula (1) may preferably be a constitutional unit represented by formula (2A):

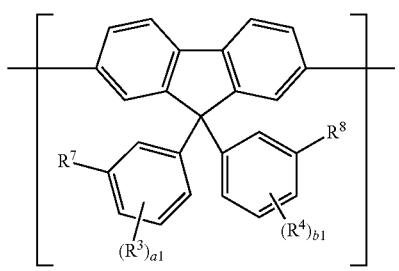

(2A)

(In (2A), $R^3$, $R^4$, $R^7$ and $R^8$ have the same meaning as above. a1 and b1 each independently represent an integer of 1-4. When multiple $R^3$ and $R^4$ groups, respectively, are present each of them may be the same or different).

The symbols a1 and b1 in formula (2A) each independently represent an integer of 1-4, preferably represent 1 or 2, more preferably represent 1. Further more preferably both a1 and b1 represent 1.

From the viewpoint of the luminance lifetime of the obtained light emitting device, the constitutional unit represented by formula (1) is preferably a constitutional unit represented by any of formulas (1A-1)-(1A-6), formulas (1B-1)-(1B-19), formulas (1C-1)-(1C-8), formulas (1D-1)-(1D-6), formulas (1E-1)-(1E-4), formulas (1F-1)-(1F-5), formulas (1G-1)-(1G-12) or formulas (1H-1)-(1H-9), more preferably a constitutional unit represented by any of formulas (1A-1)-(1A-6), formulas (1B-1)-(1B-19), formulas (1C-1)-(1C-8), formulas (1D-1)-(1D-6), formulas (1E-1)-(1E-4), formulas (1F-1)-(1F-5) or formulas (1G-1)-(1G-12), even more preferably a constitutional unit represented by any of formulas (1A-1)-(1A-6), formulas (1B-1)-(1B-19), formulas (1C-1)-(1C-8), formulas (1D-1)-(1D-6), formulas (1E-1)-(1E-4) or formulas (1F-1)-(1F-5), particularly preferably a constitutional unit represented by any of formulas (1A-1)-(1A-6), formulas (1B-1)-(1B-19), formulas (1D-1)-(1D-6), formulas (1E-1)-(1E-4) or formulas (1F-1)-(1F-5), most preferably a constitutional unit represented by any of formulas (1B-1)-(1B-19), formulas (1E-1)-(1E-4) or formulas (1F-1)-(1F-5), and most especially a constitutional unit represented by any of formulas (1B-1)-(1B-19).

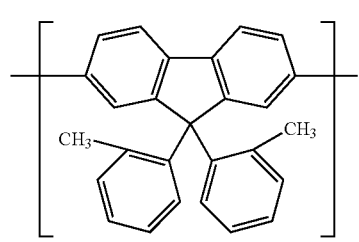

(1A-1)

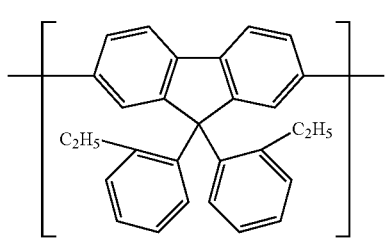

(1A-2)

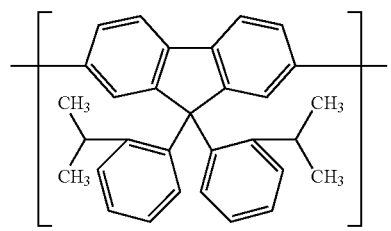

(1A-3)

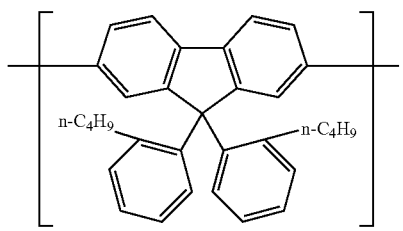

(1A-4)

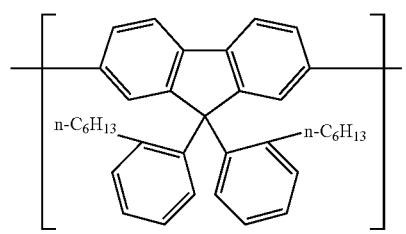

(1A-5)

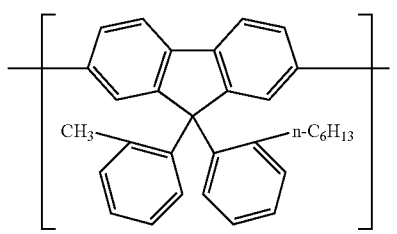

(1A-6)

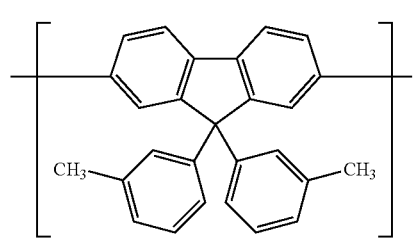

(1B-1)

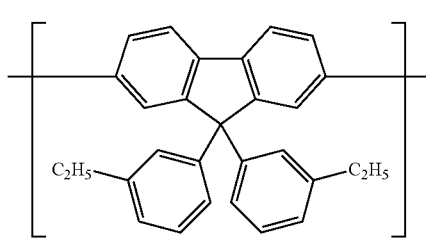

(1B-2)

-continued
(1B-3) 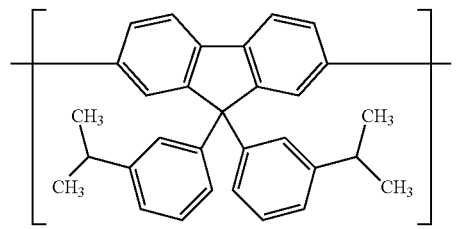
(1B-4) 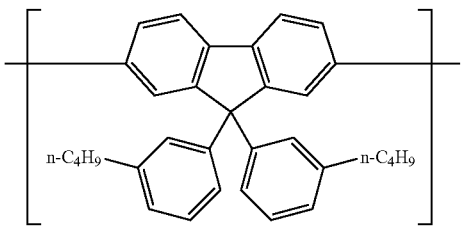
(1B-5) 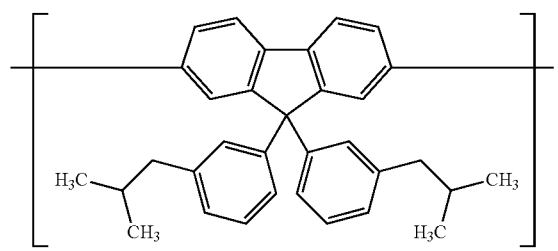
(1B-6) 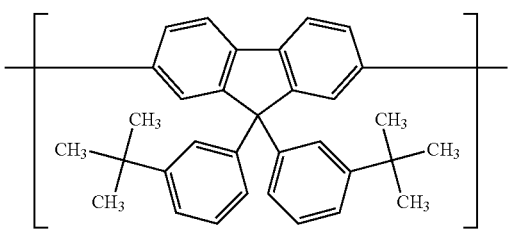
(1B-7) 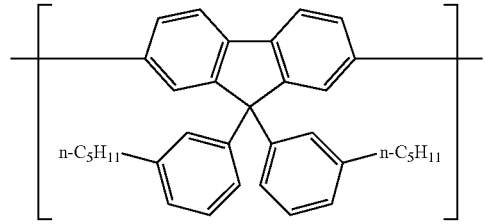
(1B-8) 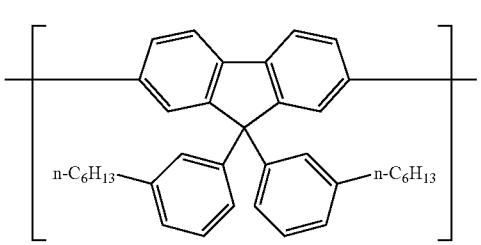
(1B-9) 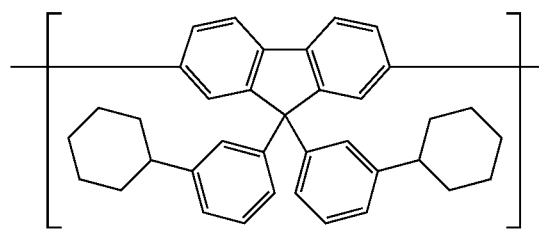
(1B-10) 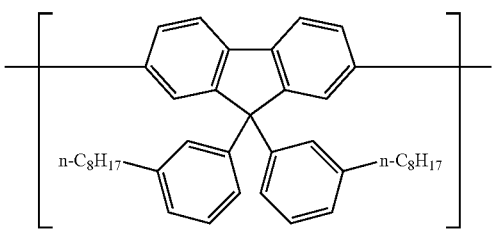
(1B-11) 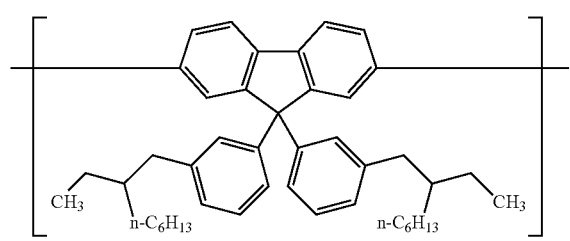
(1B-12) 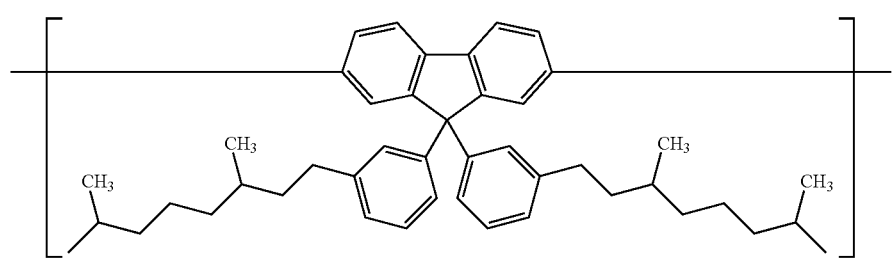

-continued
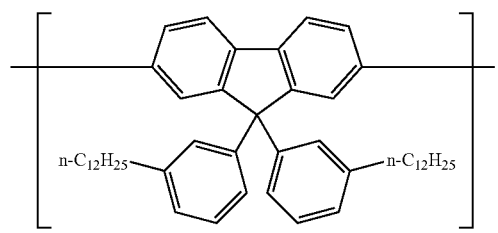
(1B-13)
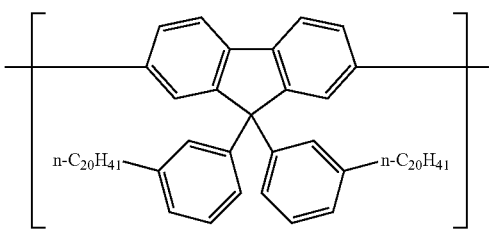
(1B-14)
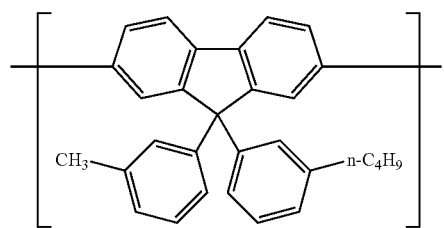
(1B-15)
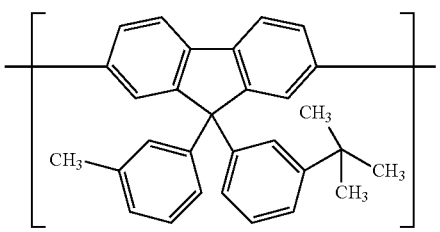
(1B-16)
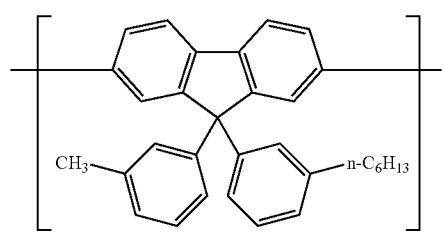
(1B-17)
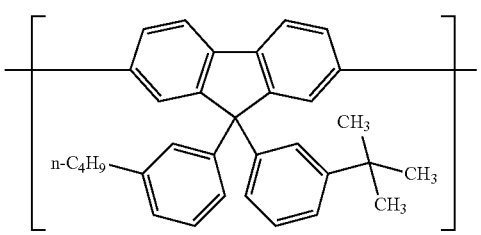
(1-B-18)
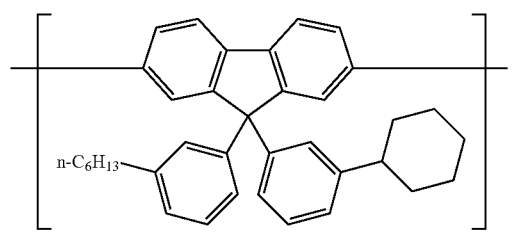
(1B-19)
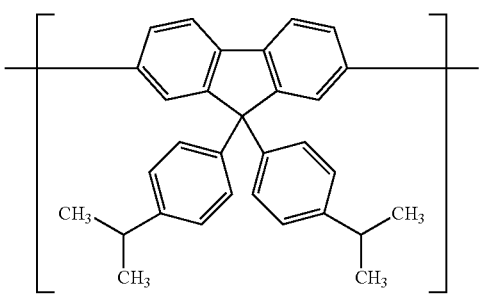
(1C-1)
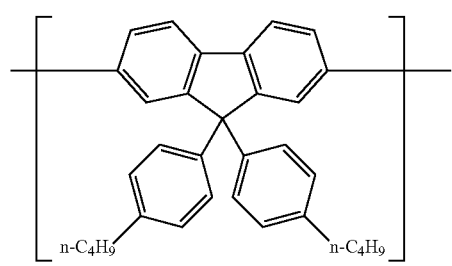
(1C-2)
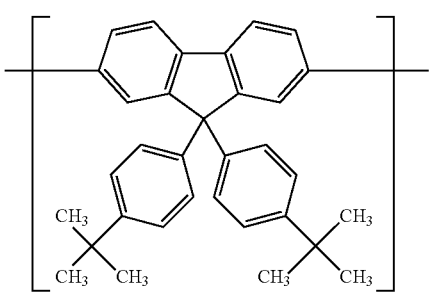
(1C-3)
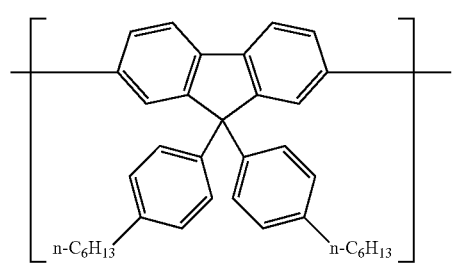
(1C-4)
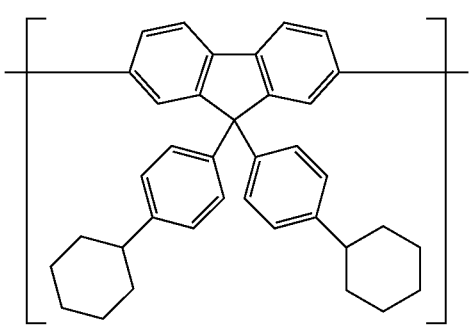
(1C-5)

-continued
(1C-6)
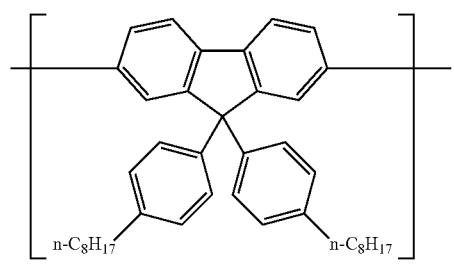
(1C-7)
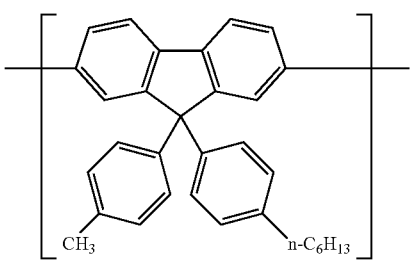
(1C-8)
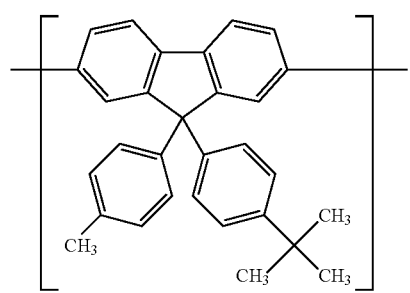
(1D-1)
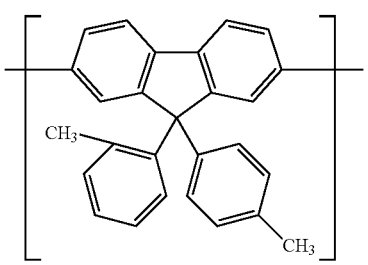
(1D-2)
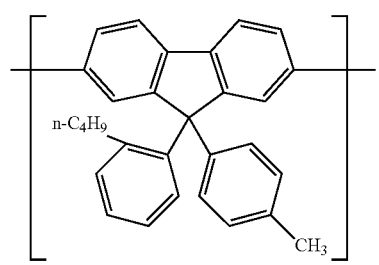
(1D-3)
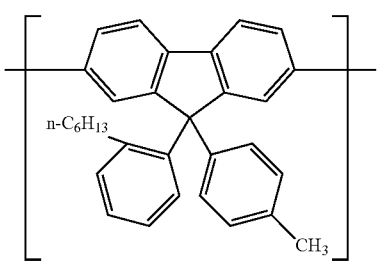
(1D-4)
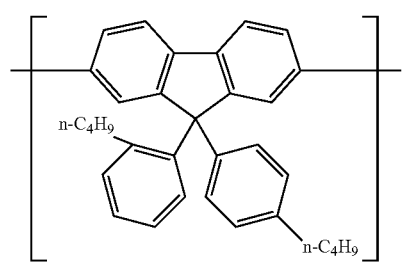
(1D-5)
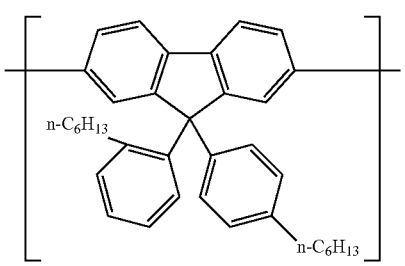
(1D-6)
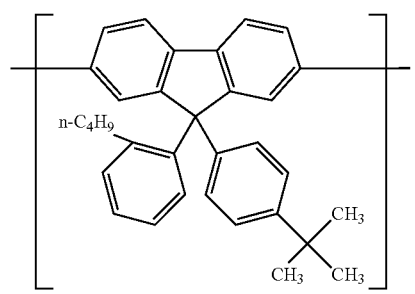
(1E-1)
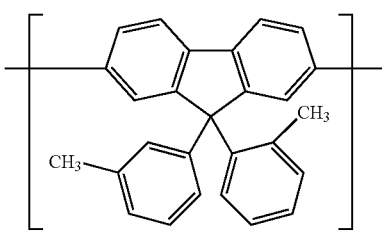
(1E-2)
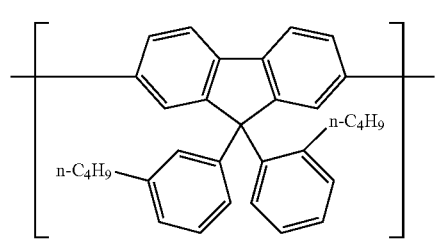
(1E-3)
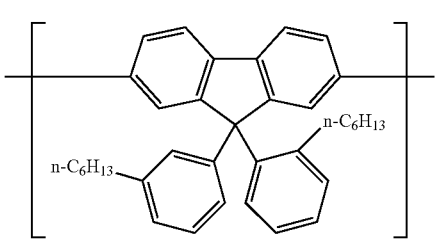

-continued
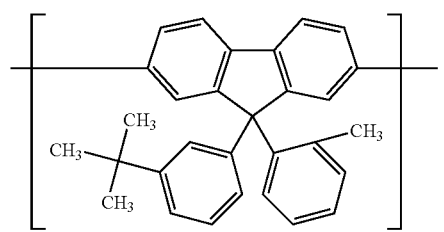
(1E-4)
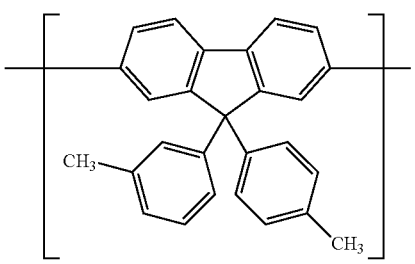
(1F-1)
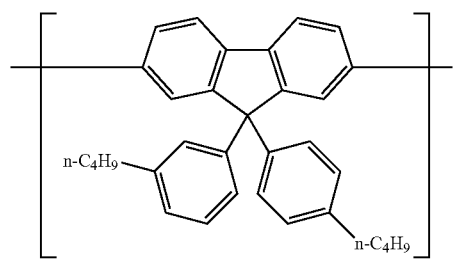
(1F-2)
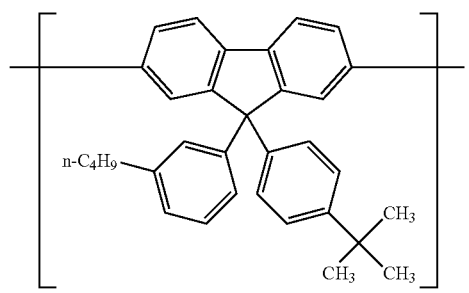
(1F-3)
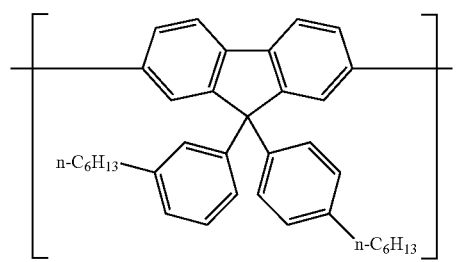
(1F-4)
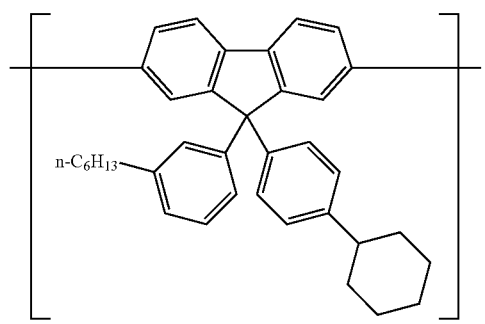
(1F-5)
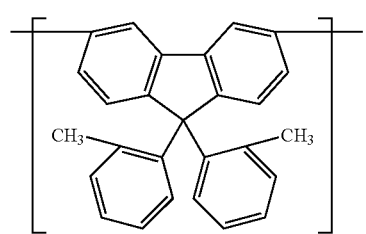
(1G-1)
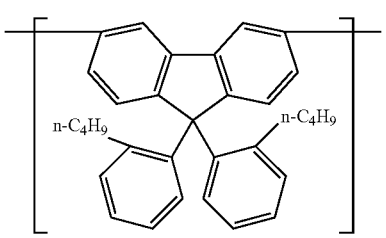
(1G-2)
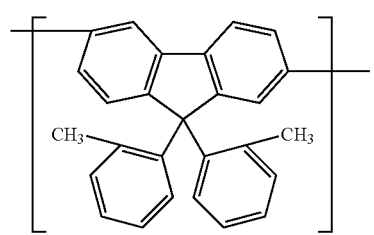
(1G-3)
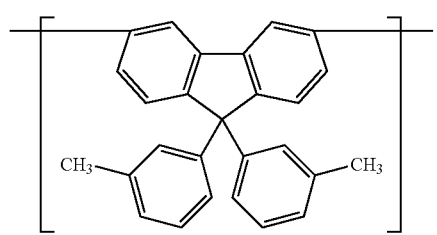
(1G-4)
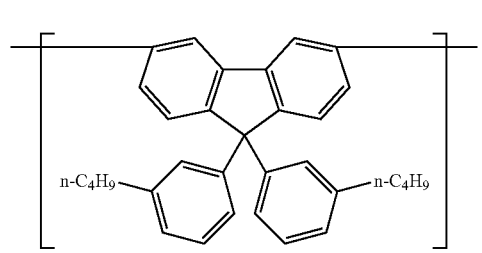
(1G-5)
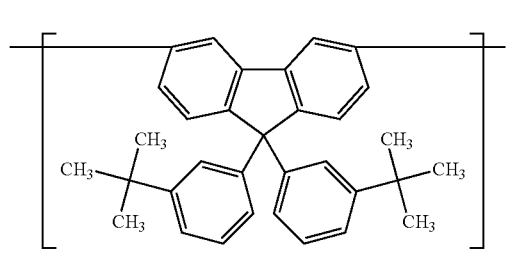
(1G-6)

-continued
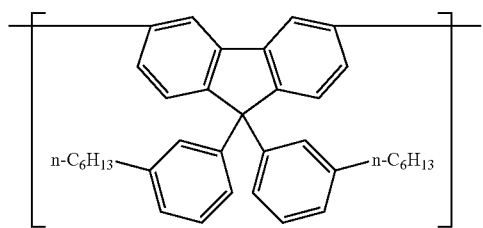
(1G-7)
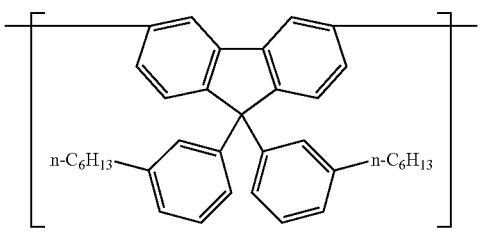
(1G-8)
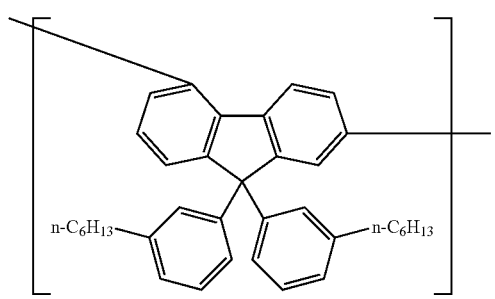
(1G-9)
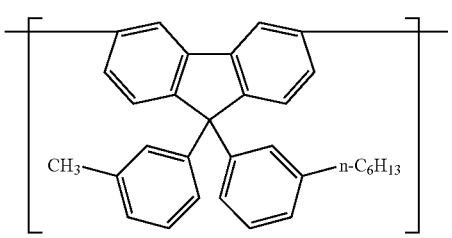
(1G-10)
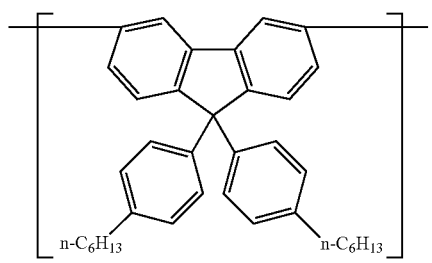
(1G-11)
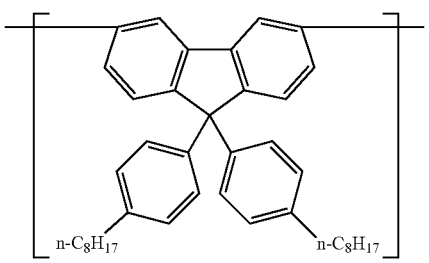
(1G-12)
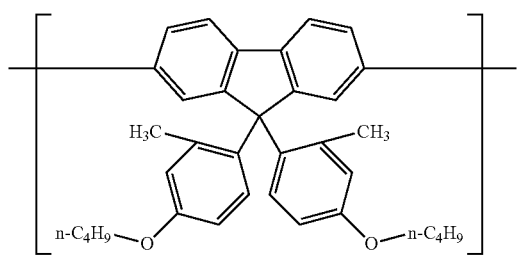
(1H-1)
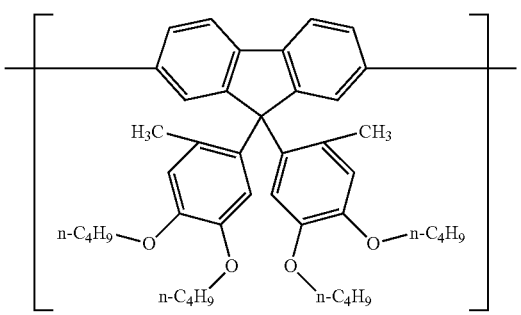
(1H-2)
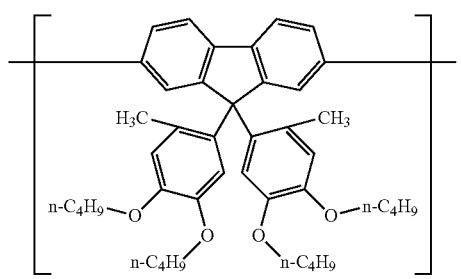
(1H-3)
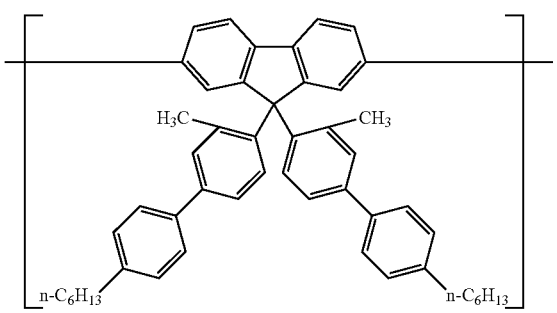
(1H-4)

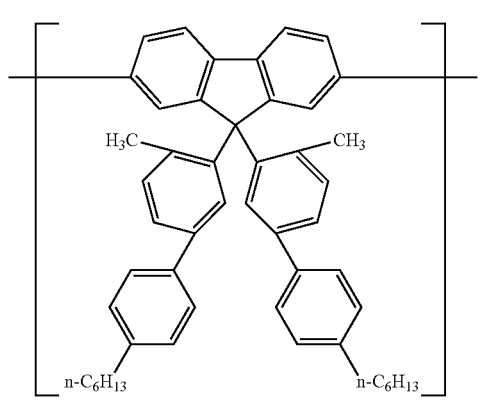 (1H-5)

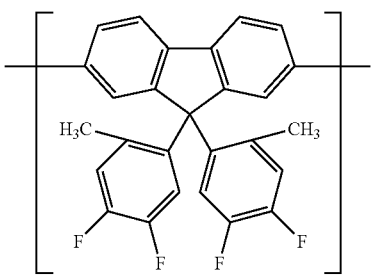 (1H-6)

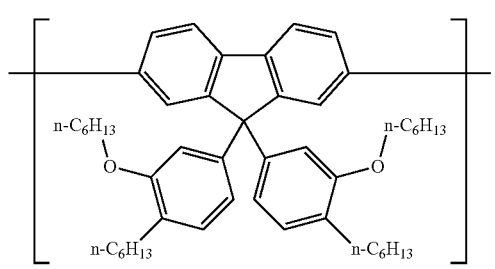 (1H-7)

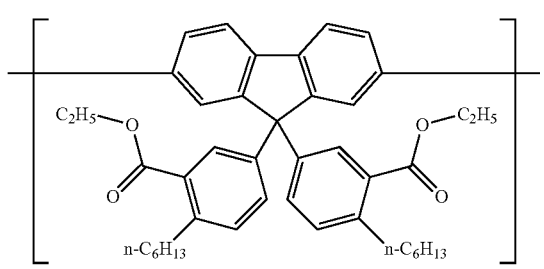 (1H-8)

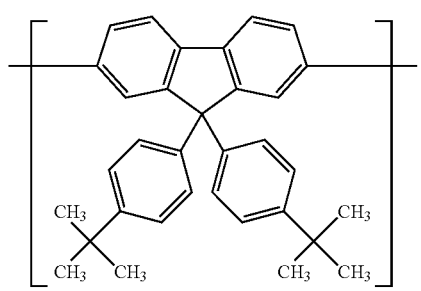 (1H-9)

From the viewpoint of heat resistance of the polymer compound and driving voltage of the obtained light emitting device, the constitutional unit represented by formula (1) is preferably a constitutional unit represented by any of formulas (1J-6)-(1J-30). Of these, more preferably the constitutional unit is represented by any of formulas (1J-6)-(1J-9), formulas (1J-14)-(1J-17) or formulas (1J-20)-(1J-25) and, even more preferably, the constitutional unit is represented by any of formulas (1J-14)-(1J-17) or formulas (1J-22)-(1J-25). Additionally, especially preferably a constitutional unit represented by any of formulas (1J-16), formulas (1J-17) or formulas (1J-22)-(1J-25), and most preferably a constitutional unit represented by any of formulas (1J-16) or formulas (1J-17).

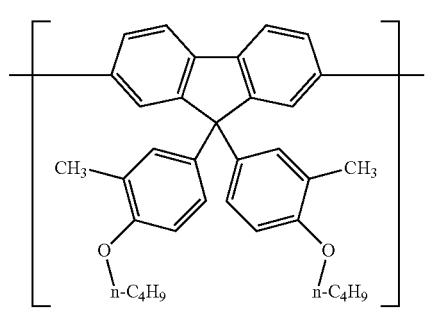 (1J-6)

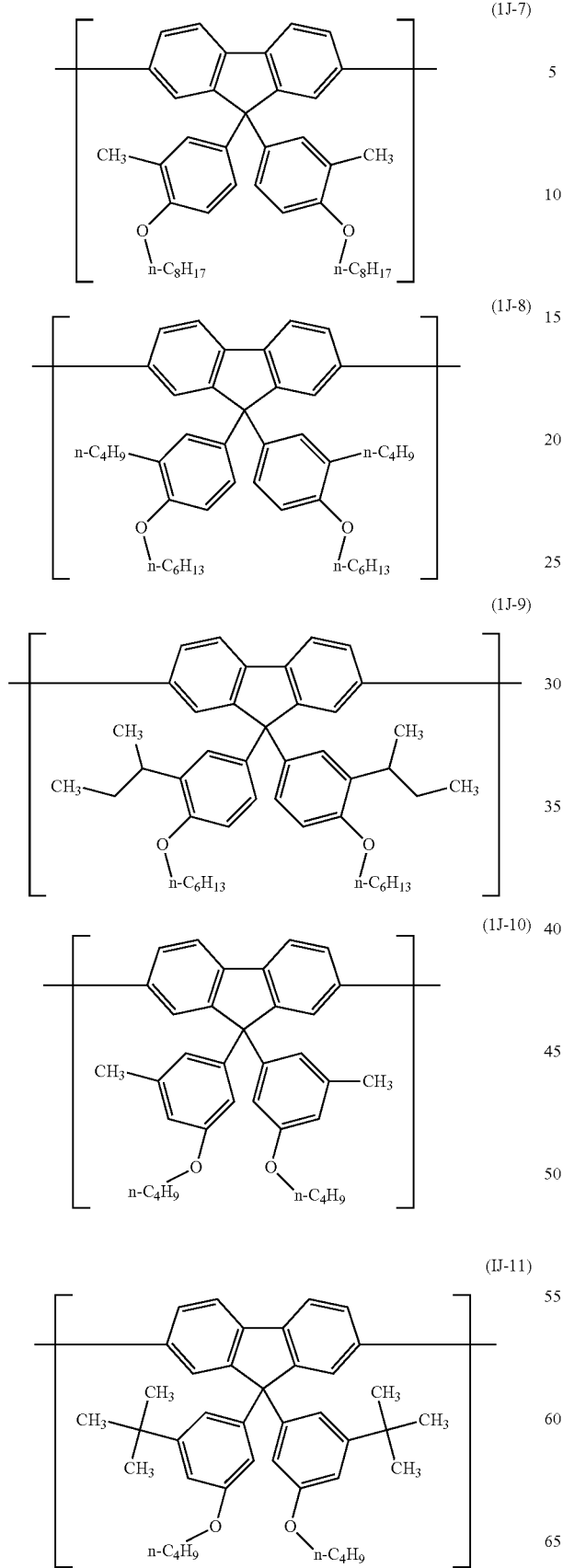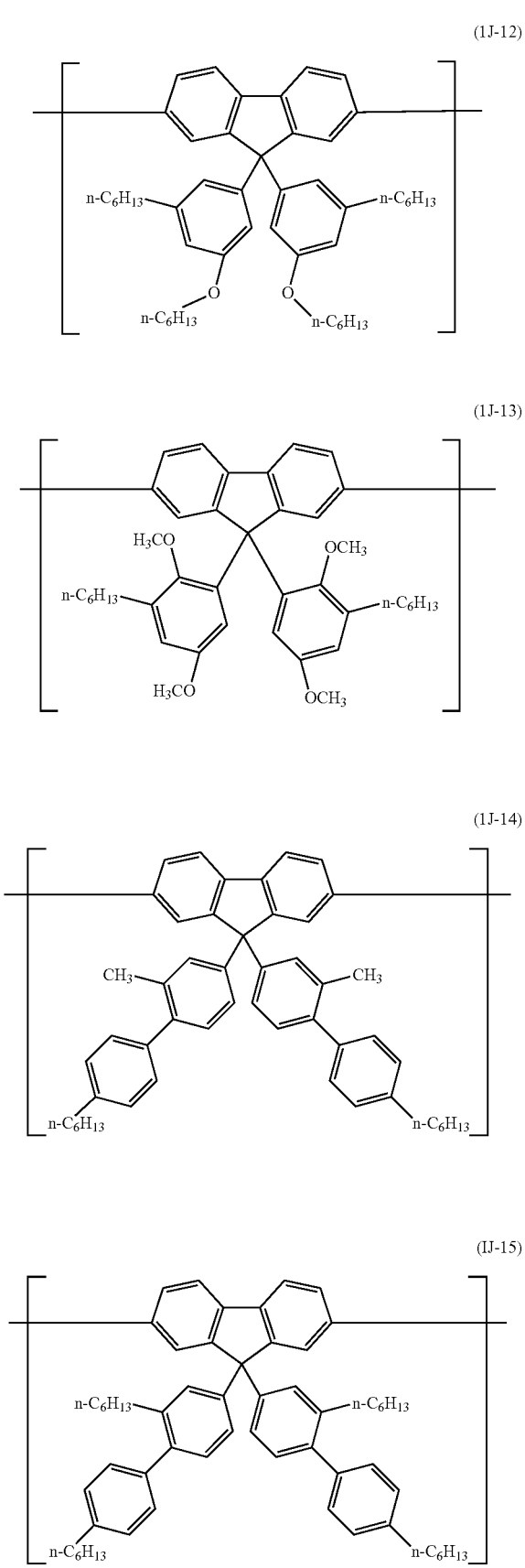

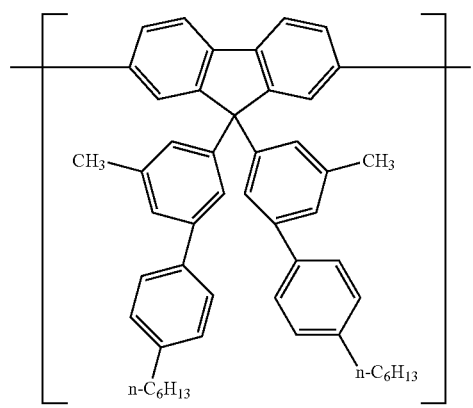
(IJ-16)
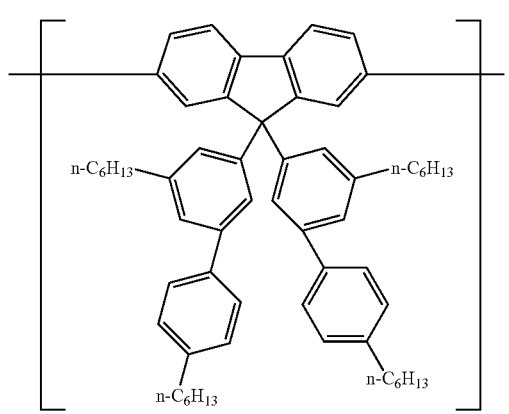
(IJ-17)
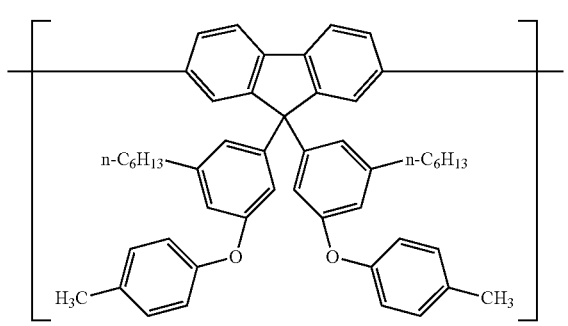
(IJ-18)
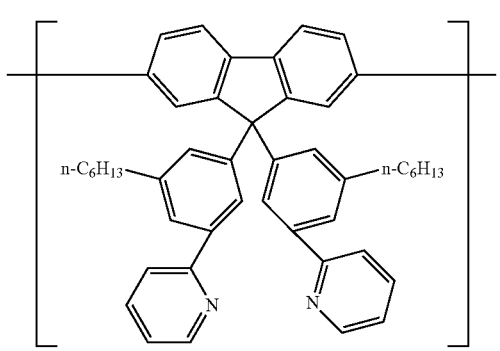
(IJ-19)
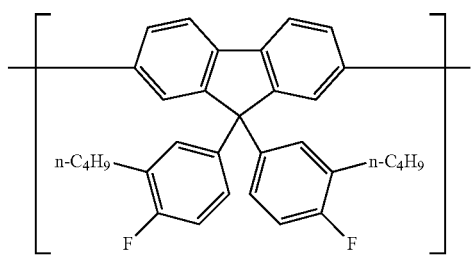
(1J-20)
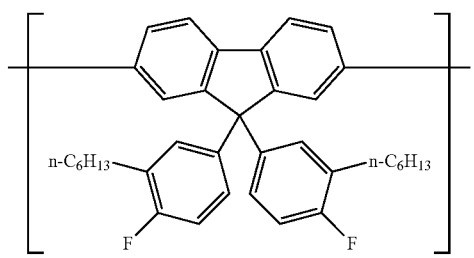
(1J-21)
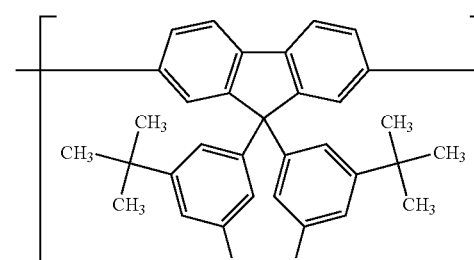
(1J-22)
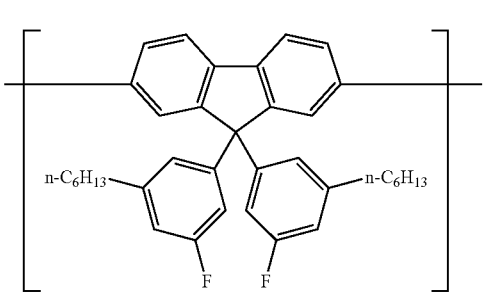
(1J-23)
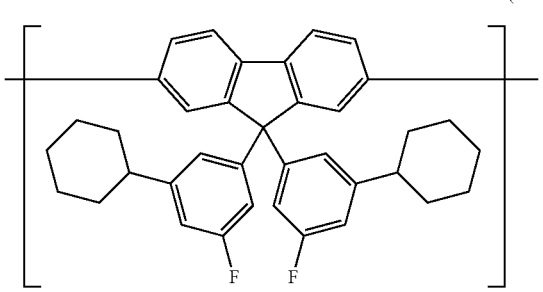
(1J-24)
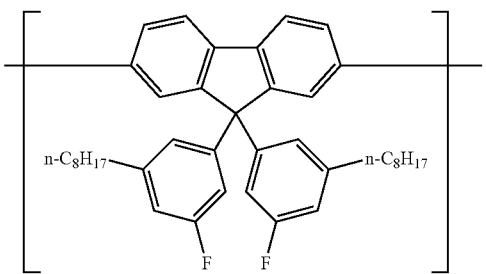
(1J-25)

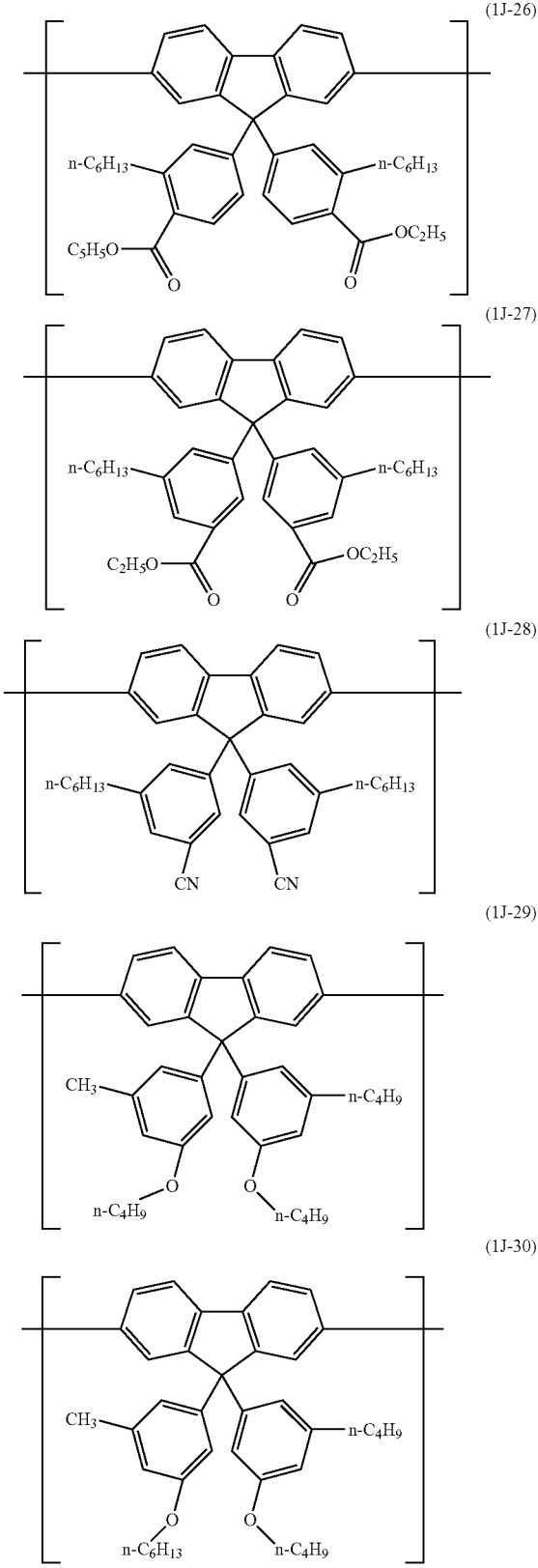

units selected from the group consisting of constitutional units represented by formula (6) and constitutional units represented by formula (7), in addition to a constitutional unit represented by formula (1).

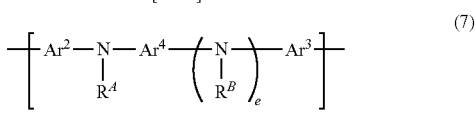

(In formula (6), $Ar^1$ represents an unsubstituted or substituted arylene or unsubstituted or substituted divalent heterocyclic group. In formula (7), $Ar^2$, $Ar^3$ and $Ar^4$ each independently represent an unsubstituted or substituted arylene group, an unsubstituted or substituted divalent aromatic heterocyclic group, or an unsubstituted or substituted divalent group linked to a divalent aromatic ring by a single bond. $R^A$ and $R^B$ each independently represent hydrogen, an unsubstituted or substituted alkyl group, an unsubstituted or substituted aryl group, or an unsubstituted or substituted monovalent heterocyclic group. The letter e represents 0 or 1.)

In formula (6), $Ar^1$ represents an unsubstituted or substituted arylene or unsubstituted or substituted divalent heterocyclic group. This is with the proviso that the constitutional unit represented by formula (6) differs from the constitutional unit represented by formula (1).

The number of carbon atoms of the unsubstituted or substituted arylene group represented by $Ar^1$ is usually 6-60, preferably 6-30, more preferably 6-18 and even more preferably 6-14, not including the number of carbon atoms of substituents. The unsubstituted or substituted arylene group may be an unsubstituted or substituted phenylene group such as 1,4-phenylene, 1,3-phenylene or 1,2-phenylene, an unsubstituted or substituted naphthalenediyl group such as 1,4-naphthalenediyl, 1,5-naphthalenediyl or 2,6-naphthalenediyl, an unsubstituted or substituted anthracenediyl group such as 1,4-anthracenediyl, 1,5-anthracenediyl, 2,6-anthracenediyl or 9,10-anthracenediyl, an unsubstituted or substituted phenanthrenediyl group such as 2,7-phenanthrenediyl, an unsubstituted or substituted naphthacenediyl group such as 1,7-naphthacenediyl, 2,8-naphthacenediyl or 5,12-naphthacenediyl, an unsubstituted or substituted fluorenediyl group such as 2,7-fluorenediyl or 3,6-fluorenediyl, an unsubstituted or substituted pyrenediyl group such as 1,6-pyrenediyl, 1,8-pyrenediyl, 2,7-pyrenediyl or 4,9-pyrenediyl, or an unsubstituted or substituted perylenediyl group such as 3,9-perylenediyl or 3,10-perylenediyl, an unsubstituted or substituted chrysenediyl group such as 2,8-chrysenediyl or 6,12-chrysenediyl, or an unsubstituted or substituted triphenylenediyl group such as 2,7-triphenylenediyl or 2,11-triphenylenediyl. An unsubstituted or substituted phenylene, unsubstituted or substituted naphthalenediyl, unsubstituted or substituted fluorenediyl or unsubstituted or substituted pyrenediyl group is preferable, and an unsubstituted or substituted phenylene or unsubstituted or substituted fluorenediyl group is more preferable.

The number of carbon atoms of the unsubstituted or substituted divalent aromatic heterocyclic group represented by $Ar^1$ is usually 4-60, preferably 4-30, more preferably 5-22 and most preferably 5-12, not including the number of carbon atoms of substituents. The unsubstituted or substituted divalent aromatic heterocyclic group may be an unsubstituted or substituted pyridinediyl group such as 2,5-pyridinediyl or Since the luminance lifetime of the obtained light emitting device is improved, the polymer compound in the present description preferably comprises one or more constitutional 2,6-pyridinediyl, an unsubstituted or substituted furanediyl group such as 2,5-furanediyl, an unsubstituted or substituted quinolinediyl group such as 2,6-quinolinediyl, an unsubstituted or substituted isoquinolinediyl group such as 1,4-isoquinolinediyl or 1,5-isoquinolinediyl, an unsubstituted or substituted quinoxalinediyl group such as 5,8-quinoxalinediyl, an unsubstituted or substituted carbazolediyl group such as 2,7-carbazolediyl or 3,6-carbazolediyl, an unsubstituted or substituted phenoxazinediyl group such as 3,7-phenoxazinediyl, an unsubstituted or substituted phenothiazinediyl group such as 3,7-phenothiazinediyl, an unsubstituted or substituted dibenzosiloldiyl group such as 2,7-dibenzosiloldiyl, an unsubstituted or substituted thiophenydiyl group such as 2,5-thiophendiyl, an unsubstituted or substituted dibenzoborol group such as 3,7-dibenzoboroldiyl, preferably an unsubstituted or substituted carbazolediyl or unsubstituted or substituted phenoxazinediyl group, and more preferably an unsubstituted or substituted phenoxazinediyl group.

When the aforementioned arylene or divalent aromatic heterocyclic group has a substituent, the substituent is preferably an unsubstituted or substituted alkyl, unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen, unsubstituted alkoxycarbonyl, unsubstituted carboxyl or cyano group, and more preferably an unsubstituted alkyl, unsubstituted alkoxy, unsubstituted aryl, unsubstituted alkylaryl, unsubstituted alkoxyaryl or unsubstituted alkoxycarbonylaryl group.

The definitions and examples of unsubstituted or substituted alkyl groups that may serve as substituents above are the same definitions and examples for the unsubstituted or substituted alkyl groups represented by $R^5$ and $R^6$.

The definitions and examples of unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen and alkoxycarbonyl groups that may serve as substituents are the same definitions and examples for the unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen and alkoxycarbonyl groups represented by $R^3$ and $R^4$.

From the viewpoint of extending the luminance lifetime of the obtained light emitting device, the constitutional unit represented by formula (6) is preferably a constitutional unit represented by formula (8), (9) or (10).

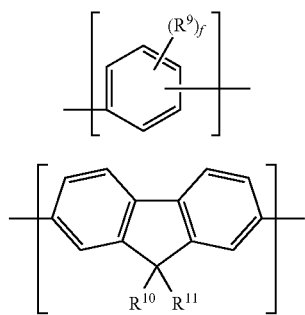

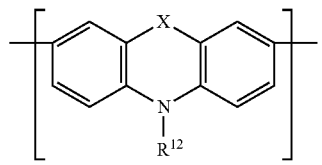

(In the formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group. The letter f represents an integer of 0-4. Multiple $R^9$ groups may be the same or different.

In the formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group.

In the formula (10), $R^{12}$ represents an unsubstituted alkyl, unsubstituted aryl, unsubstituted alkylaryl, unsubstituted alkoxyaryl or unsubstituted alkoxycarbonylaryl group. X is a single bond, —O—, —S— or —C($R^C$)$_2$—. $R^C$ represents an unsubstituted alkyl, unsubstituted aryl, unsubstituted alkylaryl or unsubstituted alkoxyaryl group, and the two $R^C$ groups may be the same or different.)

In formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group, preferably an unsubstituted alkyl, unsubstituted alkoxy, unsubstituted alkylaryl or unsubstituted alkoxyaryl group, more preferably an unsubstituted alkyl or unsubstituted alkoxy group and most preferably an unsubstituted alkyl group. The definitions and examples of unsubstituted alkyl groups represented by $R^9$ are the same as the definitions and examples of unsubstituted alkyl groups represented by $R^1$ and $R^2$.

The unsubstituted alkoxy group represented by $R^9$ may be straight-chain, branched or cyclic, and the number of carbon atoms is usually 1-20, preferably 1-15 and more preferably 4-10. Unsubstituted alkoxy groups include methoxy, ethoxy, n-propyloxy, isopropyloxy, n-butyloxy, isobutyloxy, tert-butyloxy, n-pentyloxy, n-hexyloxy, cyclohexyloxy, n-heptyloxy, n-octyloxy, 2-ethylhexyloxy, n-nonyloxy, n-decyloxy, 3,7-dimethyloctyloxy and lauryloxy, and from the viewpoint of improving balance between solubility of the polymer compound in organic solvents and heat resistance, n-butyloxy, n-pentyloxy, n-hexyloxy, n-octyloxy, 2-ethylhexyloxy, n-decyloxy and 3,7-dimethyloctyloxy groups are preferred.

The number of carbon atoms of the unsubstituted aryl group represented by $R^9$ is usually 6-60, preferably 6-48, more preferably 6-20 and even more preferably 6-10. Unsubstituted aryl groups include phenyl, 1-naphthyl, 2-naphthyl, 1-anthracenyl, 2-anthracenyl, 9-anthracenyl, 1-pyrenyl, 2-pyrenyl, 4-pyrenyl, 2-perylenyl, 3-perylenyl, 2-fluorenyl, 3-fluorenyl, 4-fluorenyl, 1-biphenylenyl, 2-biphenylenyl, 2-phenanthrenyl, 9-phenanthrenyl, 2-phenylphenyl, 3-phenylphenyl and 4-phenylphenyl groups.

An unsubstituted alkylaryl group represented by $R^9$ is an unsubstituted aryl group represented by $R^9$ substituted with an unsubstituted alkyl group represented by $R^9$, and for example, this includes 2-methylphenyl, 3-methylphenyl, 4-methylphenyl, 3-n-butylphenyl, 4-n-butylphenyl, 4-tert-butylphenyl, 3-n-hexylphenyl, 4-n-hexylphenyl, 4-n-octylphenyl, 3,5-dimethylphenyl, 4-n-butyl-2,6-dimethylphenyl and 4-tert-butyl-2,6-dimethylphenyl, among which 3-n-butylphenyl, 4-n-butylphenyl, 4-tert-butylphenyl, 3-n- hexylphenyl, 4-n-hexylphenyl, 4-n-octylphenyl, 4-n-butyl-2,6-dimethylphenyl and 4-tert-butyl-2,6-dimethylphenyl are preferred.

An unsubstituted alkoxyaryl group represented by $R^9$ is an unsubstituted aryl group represented by $R^9$ substituted with an unsubstituted alkoxy group represented by $R^9$, and for example, this includes 2-methoxyphenyl, 3-methoxyphenyl, 4-methoxyphenyl, 4-n-butyloxyphenyl, 3-n-hexyloxyphenyl, 4-n-hexyloxyphenyl and 4-n-octyloxyphenyl, among which 4-n-butyloxyphenyl, 3-n-hexyloxyphenyl and 4-n-hexyloxyphenyl are preferred.

An unsubstituted alkoxycarbonylaryl group represented by $R^9$ is an unsubstituted aryl group represented by $R^9$ substituted with an unsubstituted alkoxycarbonyl group represented by $R^3$ or $R^4$, and for example, this includes 2-methoxycarbonylphenyl, 3-methoxycarbonylphenyl, 4-methoxycarbonylphenyl, 3-ethoxycarbonylphenyl, 4-ethoxycarbonylphenyl, 3-n-butoxycarbonylphenyl and 4-n-butoxycarbonylphenyl, among which 3-ethoxycarbonylphenyl and 4-ethoxycarbonylphenyl are preferred.

In formula (8), f represents an integer of 0-4, and it preferably represents an integer of 0-2.

Constitutional units represented by formula (8) include constitutional units represented by formulas (1K-1)-(1K-9) and formulas (1L-1)-(1L-12).

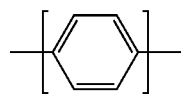
(1K-1)

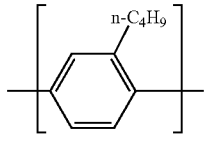
(1K-2)

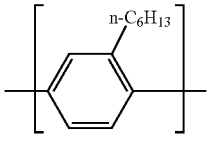
(1K-3)

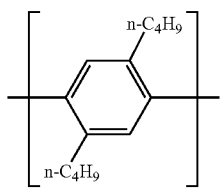
(1K-4)

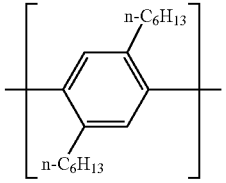
(1K-5)

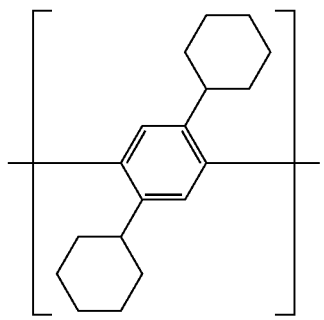
(1K-6)

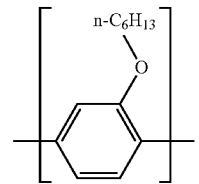
(1K-7)

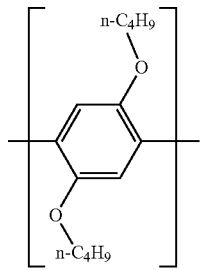
(1K-8)

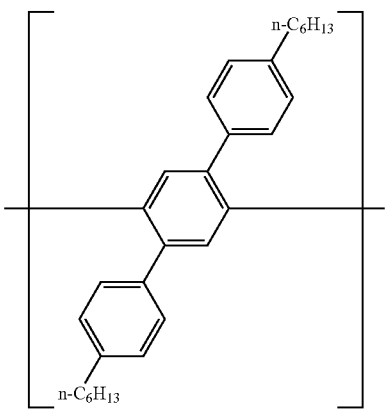
(1K-9)

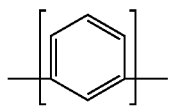
(1L-1)

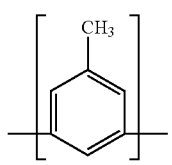
(1L-2)

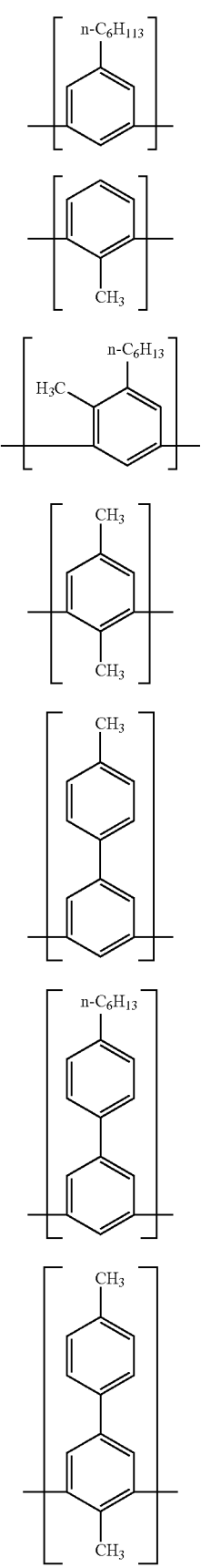

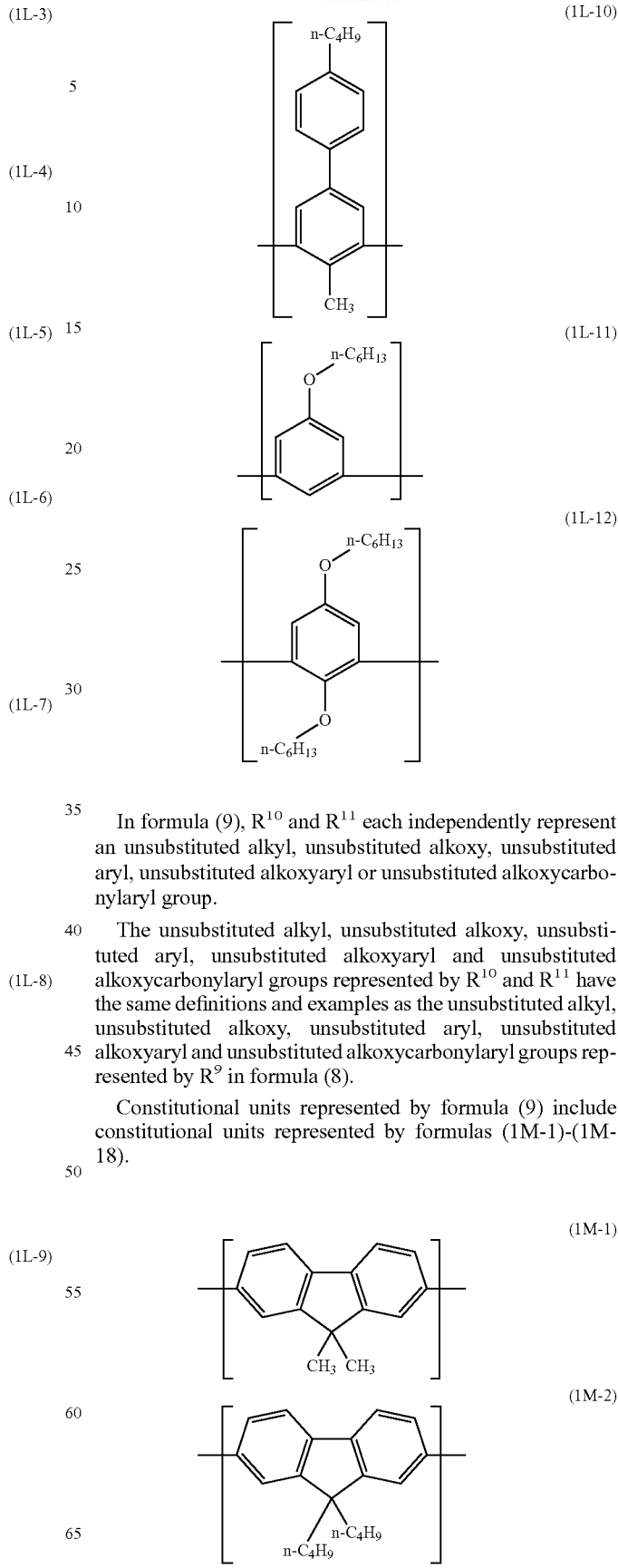

In formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group.

The unsubstituted alkyl, unsubstituted alkoxy, unsubstituted aryl, unsubstituted alkoxyaryl and unsubstituted alkoxycarbonylaryl groups represented by $R^{10}$ and $R^{11}$ have the same definitions and examples as the unsubstituted alkyl, unsubstituted alkoxy, unsubstituted aryl, unsubstituted alkoxyaryl and unsubstituted alkoxycarbonylaryl groups represented by $R^9$ in formula (8).

Constitutional units represented by formula (9) include constitutional units represented by formulas (1M-1)-(1M-18).

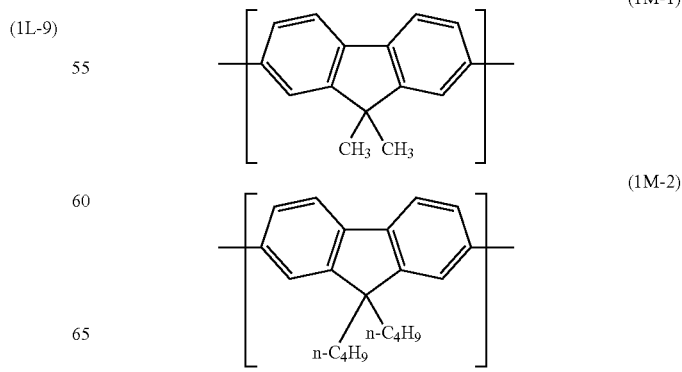

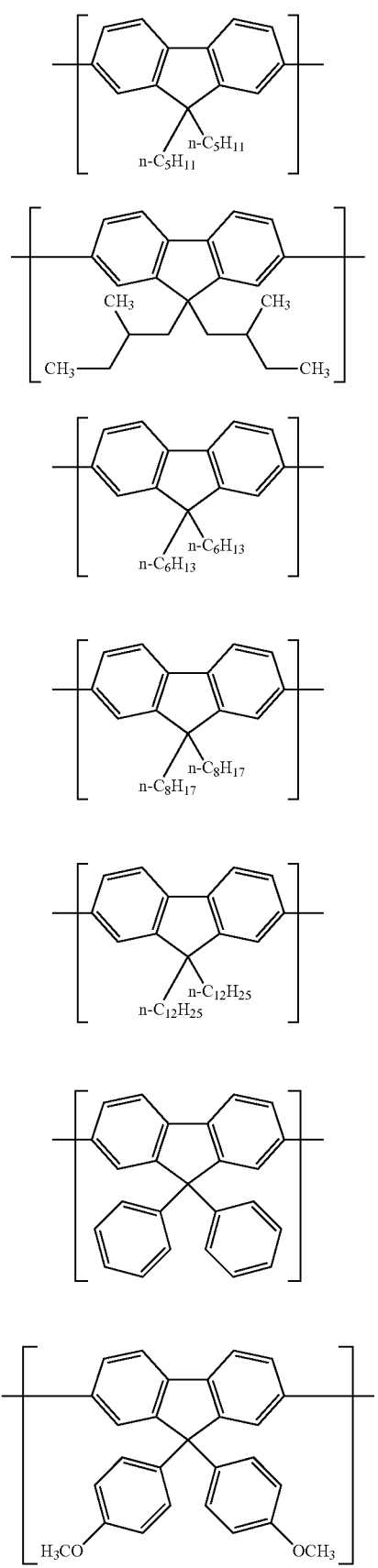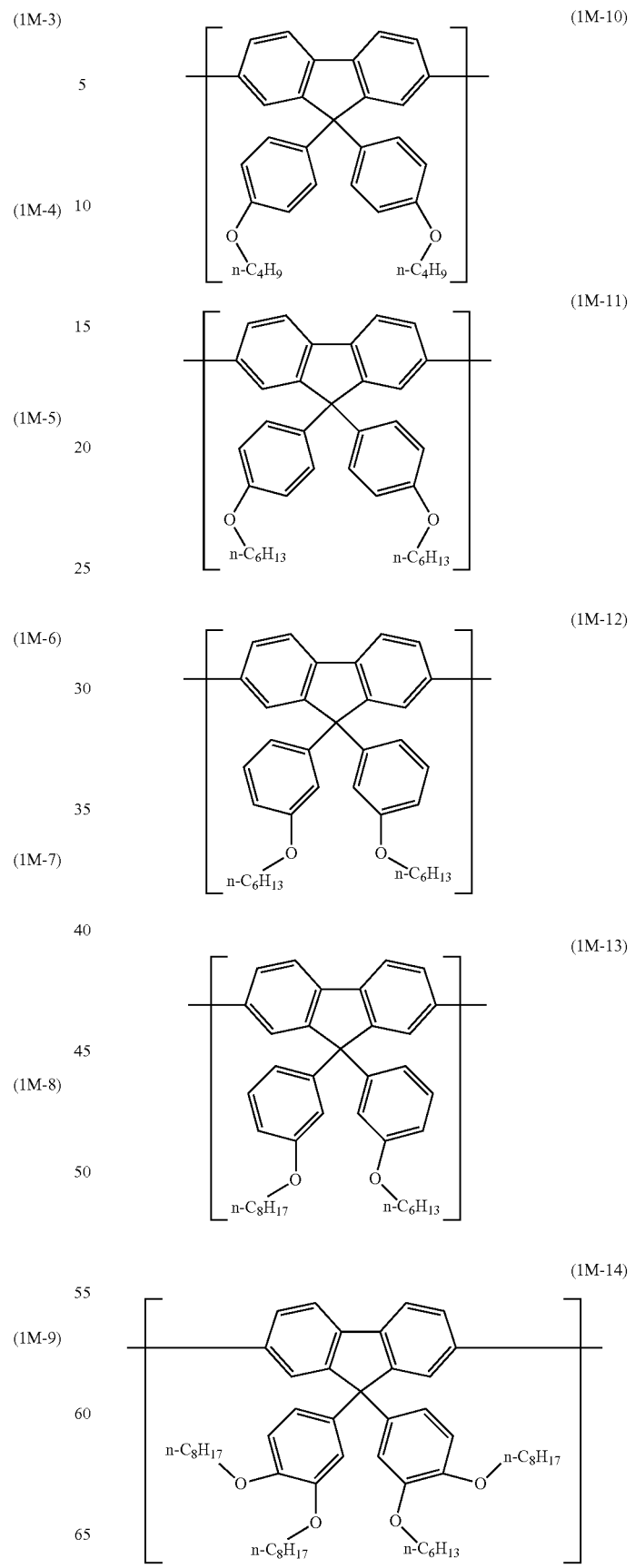

-continued

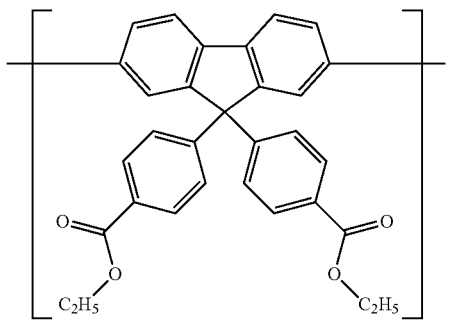
(1M-15)

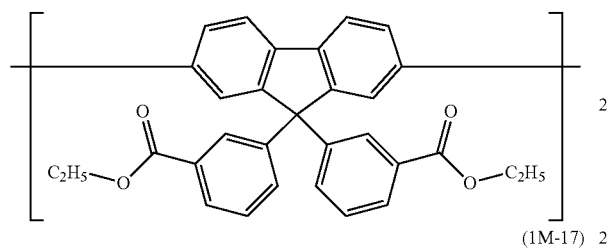
(1M-16)

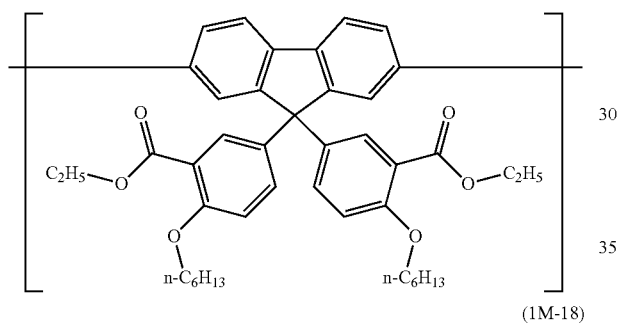
(1M-17)

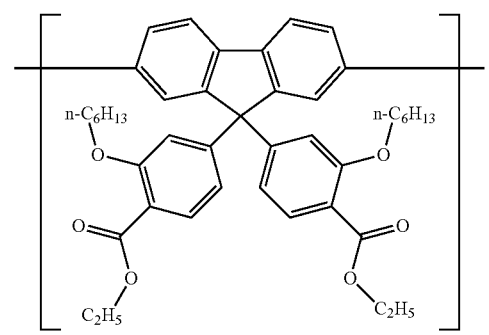
(1M-18)

In formula (10), $R^{12}$ represents an unsubstituted alkyl, unsubstituted aryl, alkylaryl, unsubstituted alkoxyaryl or unsubstituted alkoxycarbonylaryl group. The definitions and examples of unsubstituted alkyl, unsubstituted aryl, unsubstituted alkylaryl, unsubstituted alkoxyaryl and unsubstituted alkoxycarbonylaryl groups are the same as the definitions and examples of unsubstituted alkyl, unsubstituted aryl, unsubstituted alkylaryl, unsubstituted alkoxyaryl and unsubstituted alkoxycarbonylaryl groups represented by $R^9$ in formula (8).

In formula (10), X is a single bond, —O—, —S— or —C($R^C$)$_2$—, preferably —O— or —S—, and more preferably —O—. $R^C$ represents an unsubstituted alkyl, unsubstituted aryl, unsubstituted alkylaryl or unsubstituted alkoxyaryl group. The definitions and examples of unsubstituted alkyl, unsubstituted aryl, unsubstituted alkylaryl and unsubstituted alkoxyaryl groups are the same as the definitions and examples of unsubstituted alkyl, unsubstituted aryl, unsubstituted alkylaryl and unsubstituted alkoxyaryl groups represented by $R^9$ in formula (8).

Constitutional units represented by formula (10) include constitutional units represented by formulas (1N-1)-(1N-17).

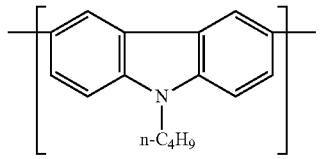
(1N-1)

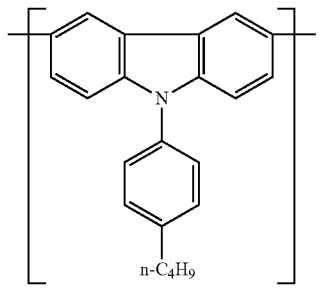
(1N-2)

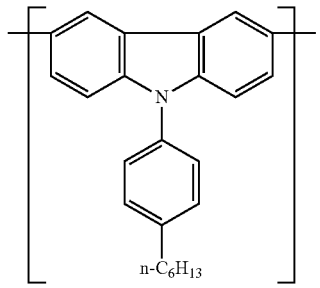
(1N-3)

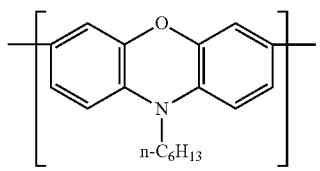
(1N-4)

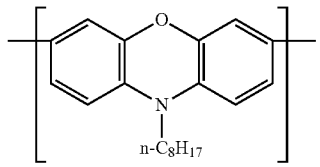
(1N-5)

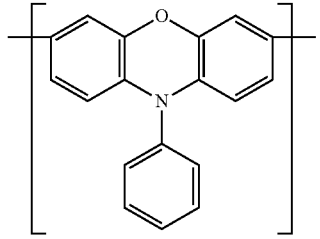
(1N-6)

(1N-7)
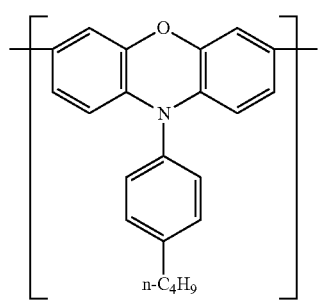
(1N-8)
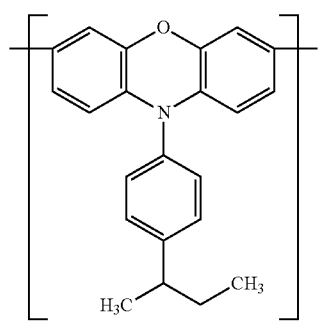
(1N-9)
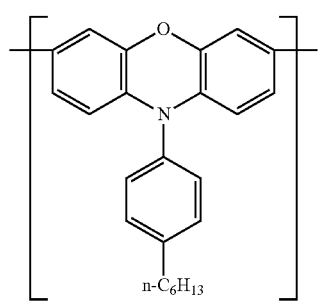
(1N-10)
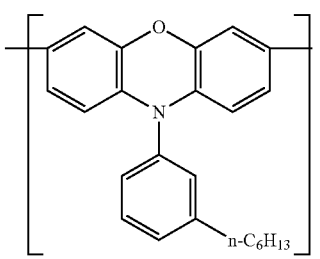
(1N-11)
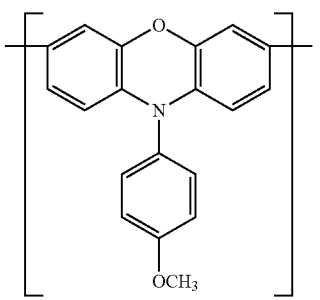
(1N-12)
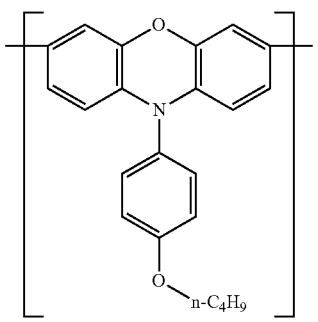
(1N-13)
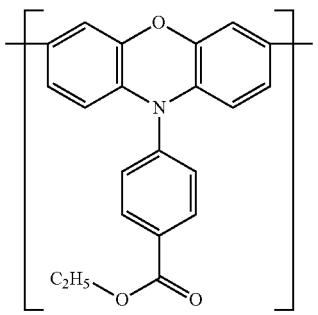
(1N-14)
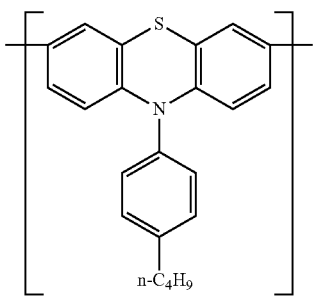
(1N-15)
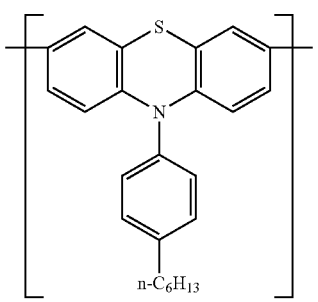
(1N-16)
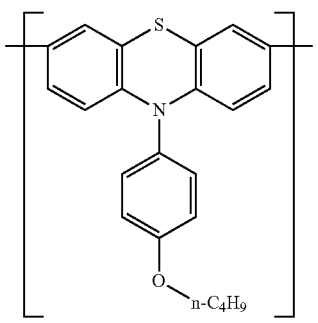

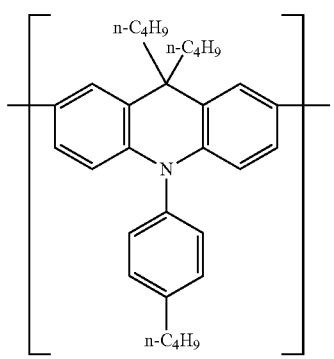

(1N-17)

In formula (7), $Ar^2$, $Ar^3$ and $Ar^4$ each independently represent an unsubstituted or substituted arylene group, an unsubstituted or substituted divalent aromatic heterocyclic group, or an unsubstituted or substituted divalent group linked to two aromatic rings by single bonds.

The number of carbon atoms of the unsubstituted or substituted arylene group represented by $Ar^2$, $Ar^3$ and $Ar^4$ is usually 6-60, preferably 6-30, more preferably 6-18, even more preferably 6-10 and most preferably 6, not including the number of carbon atoms of substituents. Examples of unsubstituted arylene groups include phenylene groups such as 1,3-phenylene and 1,4-phenylene, naphthalenediyl groups such as 1,4-naphthalenediyl and 2,6-naphthalenediyl, anthracenediyl groups such as 9,10-anthracenediyl, phenanthrenediyl groups such as 2,7-phenanthrenediyl, naphthacenediyl groups such as 5,12-naphthacenediyl, fluorenediyl groups such as 2,7-fluorenediyl, perylenediyl groups such as 3,8-perylenediyl and chrysenediyl groups such as 2,8-chrysenediyl and 6,12-chrysenediyl.

The number of carbon atoms of the unsubstituted or substituted divalent heterocyclic groups represented by $Ar^2$, $A^3$ and $Ar^4$ is usually 4-60, preferably 4-20, more preferably 4-9 and even more preferably 4 or 5, not including the number of carbon atoms of substituents. Unsubstituted divalent heterocyclic groups include pyrrolediyl groups such as N-methyl-2,5-pyrrolediyl, furanediyl groups such as 2,5-furanediyl, pyridinediyl groups such as 2,5-pyridinediyl and 2,6-pyridinediyl, quinolinediyl groups such as 2,4-quinolinediyl and 2,6-quinolinediyl, isoquinolinediyl groups such as 1,4-isoquinolinediyl and 1,5-isoquinolinediyl, phenoxazinediyl groups such as 3,7-phenoxazinediyl and carbazolediyl groups such as 3,6-carbazolediyl.

Unsubstituted divalent groups having two aromatic rings linked thereto by single bonds, represented by $Ar^2$, $Ar^3$ and $Ar^4$, include groups represented by formulas (7A-1)-(7A-4), preferably groups represented by formulas (7A-1)-(7A-3) and more preferably groups represented by formula (7A-1).

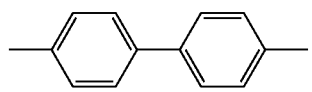

(7A-1)

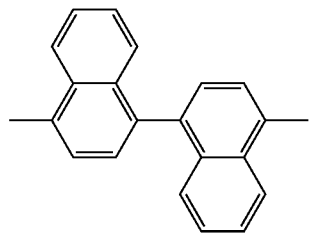

(7A-2)

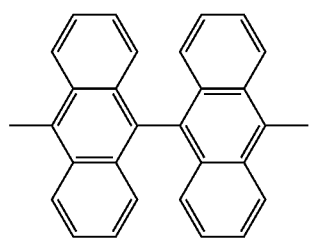

(7A-3)

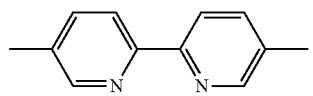

(7A-4)

When $Ar^2$, $Ar^3$ and $Ar^4$ have substituents, the substituents are preferably unsubstituted or substituted alkyl, unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen, unsubstituted alkoxycarbonyl, unsubstituted carboxyl or cyano groups, more preferably unsubstituted alkyl, unsubstituted alkoxy, unsubstituted aryl, unsubstituted alkylaryl, unsubstituted alkoxyaryl or unsubstituted alkoxycarbonylaryl groups, and even more preferably unsubstituted alkyl or unsubstituted alkylaryl groups.

The definitions and examples of unsubstituted or substituted alkyl groups are the same definitions and examples for the unsubstituted or substituted alkyl groups represented by $R^5$ and $R^6$.

The definitions and examples of unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen and unsubstituted alkoxycarbonyl groups are each the same as the definitions and examples of unsubstituted or substituted alkoxy, unsubstituted or substituted aryl, unsubstituted or substituted aryloxy, unsubstituted or substituted monovalent heterocyclic, unsubstituted or substituted amino, unsubstituted or substituted silyl, halogen and unsubstituted alkoxycarbonyl groups represented by $R^3$ and $R^4$.

$Ar^2$ and $Ar^3$ are preferably unsubstituted or substituted arylene groups, more preferably unsubstituted or substituted 1,3-phenylene, unsubstituted or substituted 1,4-phenylene, unsubstituted or substituted 1,4-naphthalenediyl or unsubstituted or substituted 2,6-naphthalenediyl groups, even more preferably unsubstituted or substituted 1,4-phenylene or unsubstituted or substituted 1,4-naphthalenediyl groups, and most preferably unsubstituted or substituted 1,4-phenylene groups.

$Ar^4$ is preferably an unsubstituted or substituted arylene group or an unsubstituted or substituted divalent group having two aromatic rings linked by single bonds, more preferably an unsubstituted or substituted 1,3-phenylene, unsubstituted or substituted 1,4-phenylene, unsubstituted or substituted 1,4-naphthalenediyl, unsubstituted or substituted 2,7-fluorenediyl, unsubstituted or substituted 9,10-anthracenediyl or unsubstituted or substituted 6,12-chrysenediyl group, or an unsubstituted or substituted group represented by formula (7A-1) above, even more preferably an unsubstituted or substituted 1,4-phenylene or substituted 1,4-naphthalenediyl, unsubstituted or substituted 2,7-fluorenediyl or 9,10-anthracenediyl group, or an unsubstituted or substituted group represented by formula (7A-1), and yet more preferably an unsubstituted 1,4-phenylene or substituted 2,7-fluorenediyl group, or an unsubstituted group represented by formula (7A-1).

$R^A$ and $R^B$ in formula (7) each independently represent hydrogen, an unsubstituted or substituted alkyl group, an unsubstituted or substituted aryl group, or an unsubstituted or substituted monovalent heterocyclic group. The definitions and examples of unsubstituted or substituted alkyl groups are the same definitions and examples for the unsubstituted or substituted alkyl groups represented by $R^5$ and $R^6$. The definitions and examples of unsubstituted or substituted aryl and unsubstituted or substituted monovalent heterocyclic groups are each the same as the definitions and examples of unsubstituted or substituted aryl and unsubstituted or substituted monovalent heterocyclic groups represented by $R^3$ and $R^4$.

In formula (7), e is 0 or 1 and preferably 1.

From the viewpoint of the luminance lifetime of the obtained light emitting device, the constitutional unit represented by formula (7) is preferably a constitutional unit represented by formula (14).

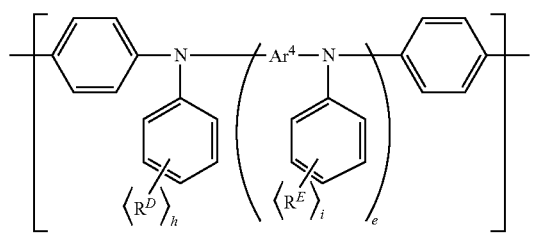

(14)

(In the formula, $Ar^4$ has the same meaning as above. $R^D$ and $R^E$ each independently represent an unsubstituted alkyl, unsubstituted alkoxy, unsubstituted aryl, unsubstituted alkylaryl, unsubstituted alkoxyaryl or unsubstituted alkoxycarbonyl group. The letters h and i each independently represent an integer of 0-5. When multiple $R^D$ and $R^E$ groups are present, they may be the same or different. The letter e has the same meaning as above.)

In formula (14), $R^D$ and $R^E$ each independently represent an unsubstituted alkyl, unsubstituted alkoxy, unsubstituted aryl, unsubstituted alkylaryl, unsubstituted alkoxyaryl or unsubstituted alkoxycarbonyl group.

The definitions and examples of unsubstituted alkyl groups are the same as the definitions and examples of unsubstituted alkyl groups represented by $R^1$ and $R^2$.

The definitions and examples of unsubstituted alkoxy, unsubstituted aryl, unsubstituted alkylaryl and unsubstituted alkoxyaryl groups are the same as the definitions and examples of unsubstituted alkoxy, unsubstituted aryl, unsubstituted alkylaryl and unsubstituted alkoxyaryl groups represented by $R^9$ in formula (8).

The definitions and examples of unsubstituted alkoxycarbonyl groups are the same as the definitions and examples of unsubstituted alkoxycarbonyl groups represented by $R^3$ and $R^4$ in formula (1).

In formula (14), h and i each independently represent an integer of 0-5, preferably represent an integer of 1-3, and even more preferably represent 1 or 3.

Constitutional units represented by formula (14) include constitutional units represented by formulas (1Q-1)-(1Q-30).

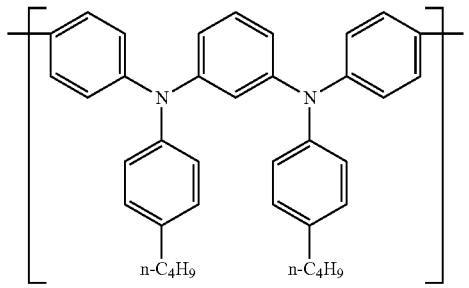

(1Q-1)

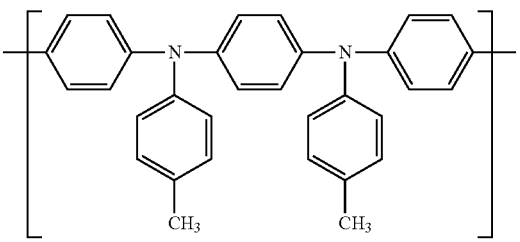

(1Q-2)

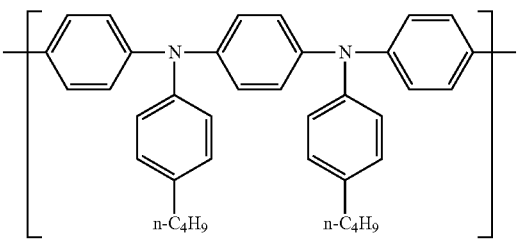

(1Q-3)

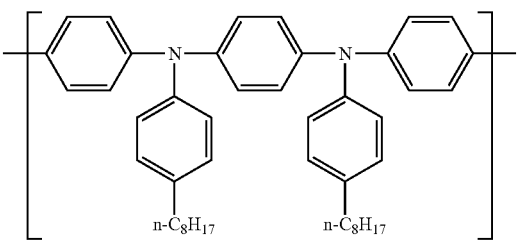

(1Q-4)

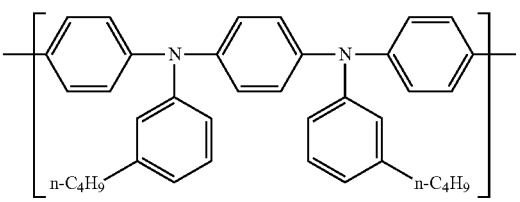

(1Q-5)

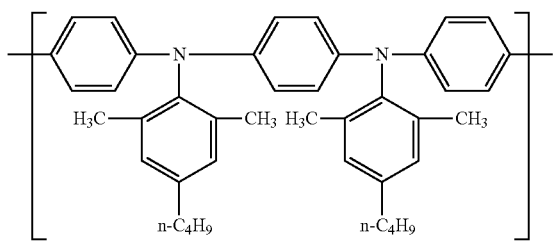
(1Q-6)
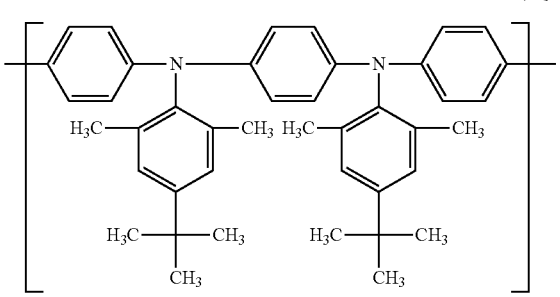
(1Q-7)
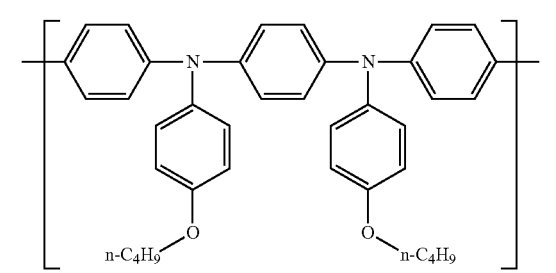
(1Q-8)
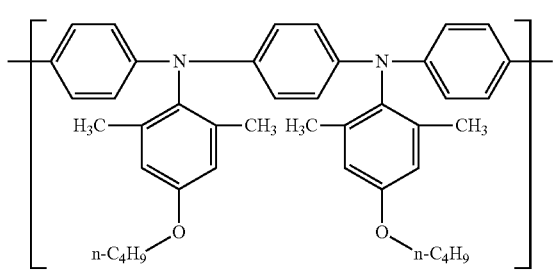
(1Q-9)
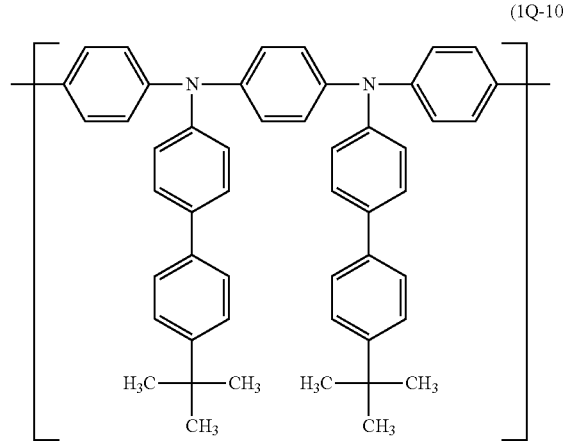
(1Q-10)
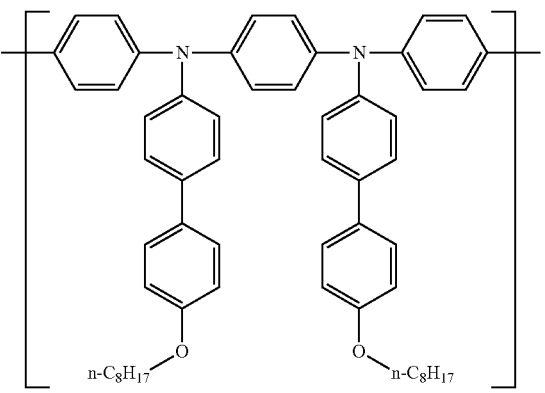
(1Q-11)
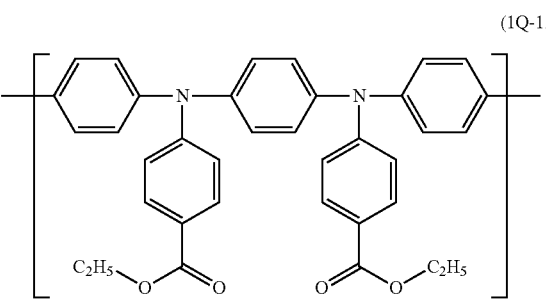
(1Q-12)
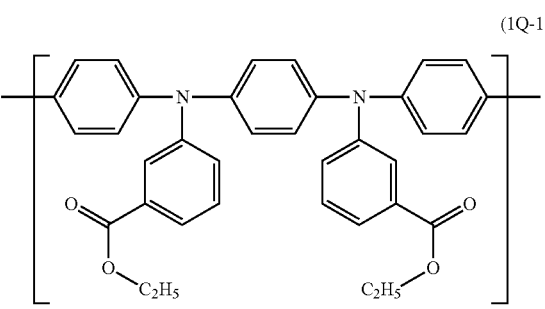
(1Q-13)
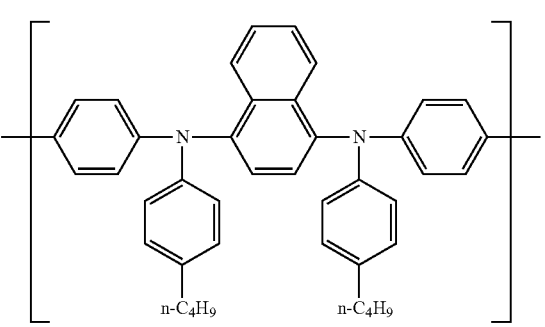
(1Q-14)

(1Q-15)
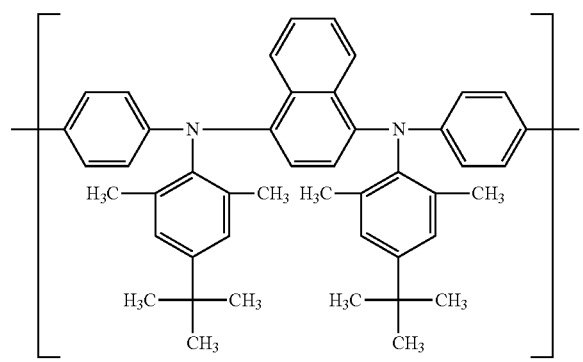
(1Q-16)
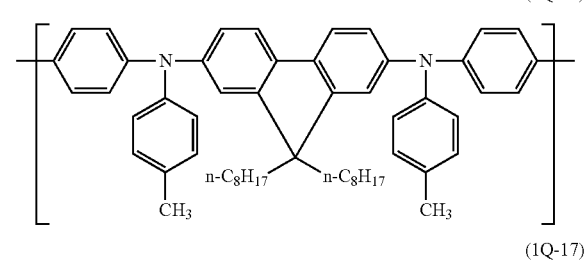
(1Q-17)
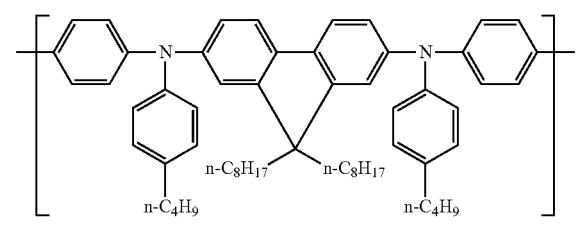
(1Q-18)
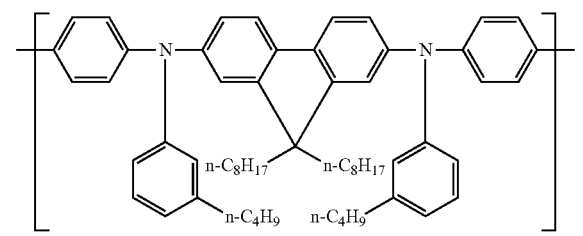
(1Q-19)
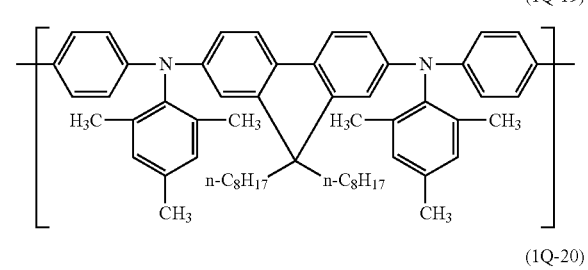
(1Q-20)
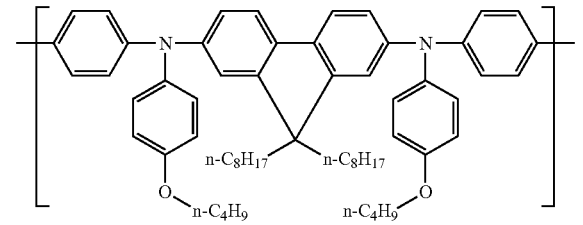
(1Q-21)
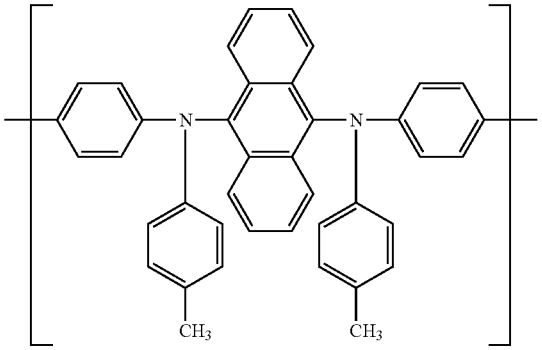
(1Q-22)
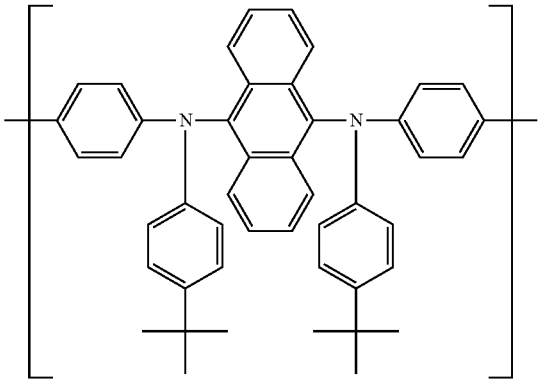
(1Q-23)
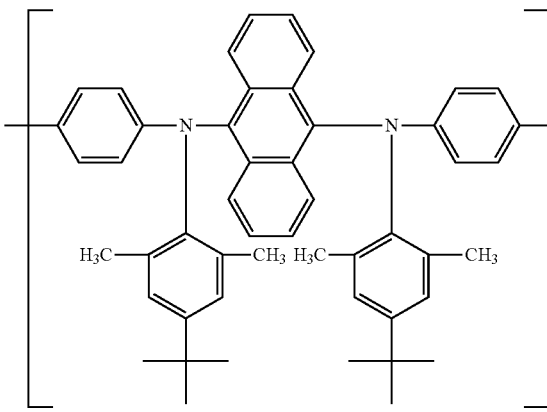
(1Q-24)
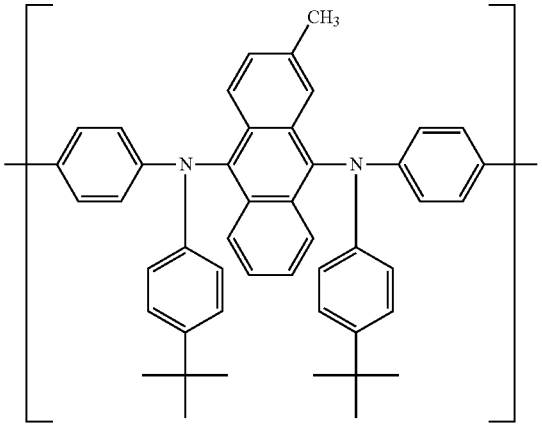

-continued

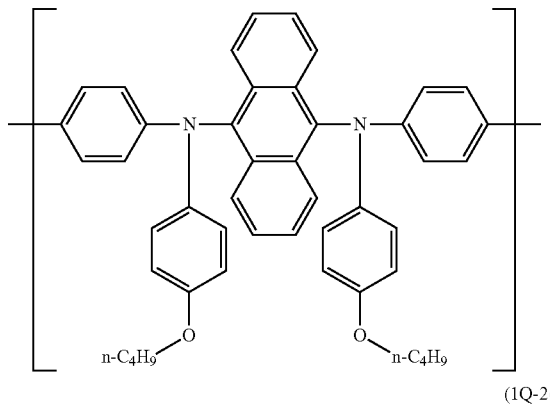
(1Q-25)

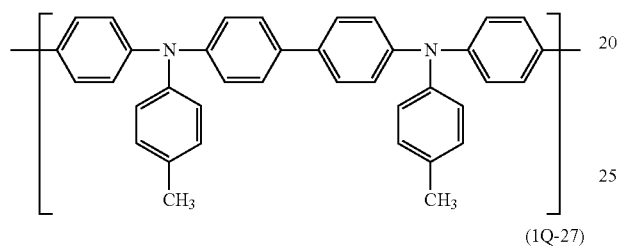
(1Q-26)

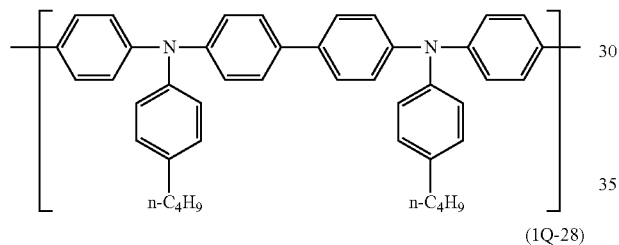
(1Q-27)

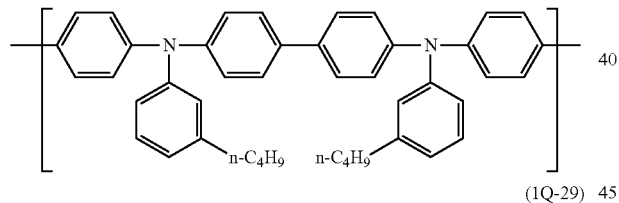
(1Q-28)

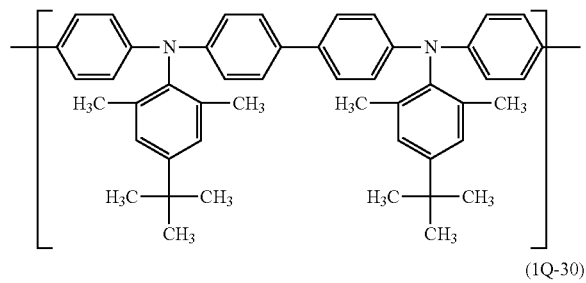
(1Q-29)

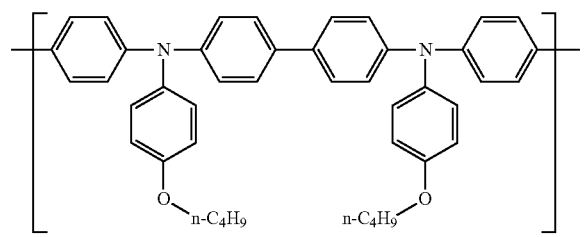
(1Q-30)

The polymer compound of the invention preferably comprises at least one constitutional unit selected from the group consisting of constitutional units represented by formula (11), constitutional units represented by formula (12) and constitutional units represented by formula (13), and more preferably it comprises a constitutional unit represented by formula (13), so that the driving voltage of the obtained light emitting device will be favorable.

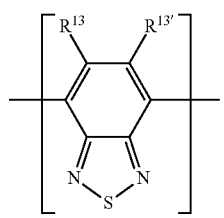
(11)

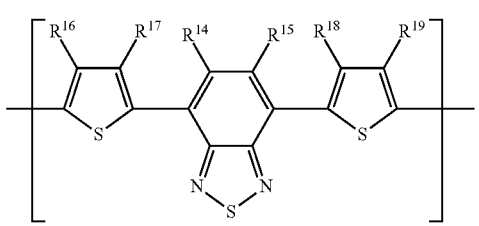
(12)

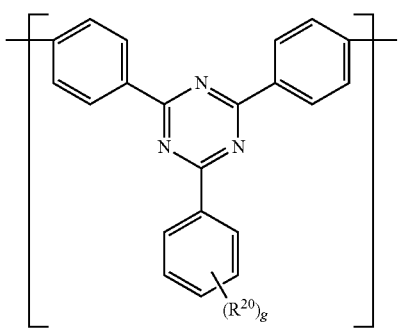
(13)

(In the formula (11), $R^{13}$ and $R^{13'}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group. In the formula (12), $R^{14}$, $R^{15}$, $R^{16}$, $R^{17}$, $R^{18}$ and $R^{19}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group.
In the formula (13), $R^{20}$ represents an unsubstituted alkyl, unsubstituted alkoxy, unsubstituted aryl, alkylaryl, unsubstituted alkoxyaryl or unsubstituted alkoxycarbonylaryl group. The letter g represents an integer of 0-5. Multiple $R^{20}$ groups may be the same or different.)

In formula (11), $R^{13}$ and $R^{13'}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group.

The definitions and examples of unsubstituted alkyl groups are the same as the definitions and examples of unsubstituted alkyl groups represented by $R^1$ and $R^2$.

The definitions and examples of unsubstituted alkoxy, unsubstituted aryl, unsubstituted alkylaryl, unsubstituted alkoxyaryl and unsubstituted alkoxycarbonylaryl groups are the same as the definitions and examples of unsubstituted alkoxy, unsubstituted aryl, unsubstituted alkylaryl, unsubstituted alkoxyaryl and unsubstituted alkoxycarbonylaryl groups represented by $R^9$ in formula (8).

Constitutional units represented by formula (11) include constitutional units represented by formulas (1S-1)-(1S-7).

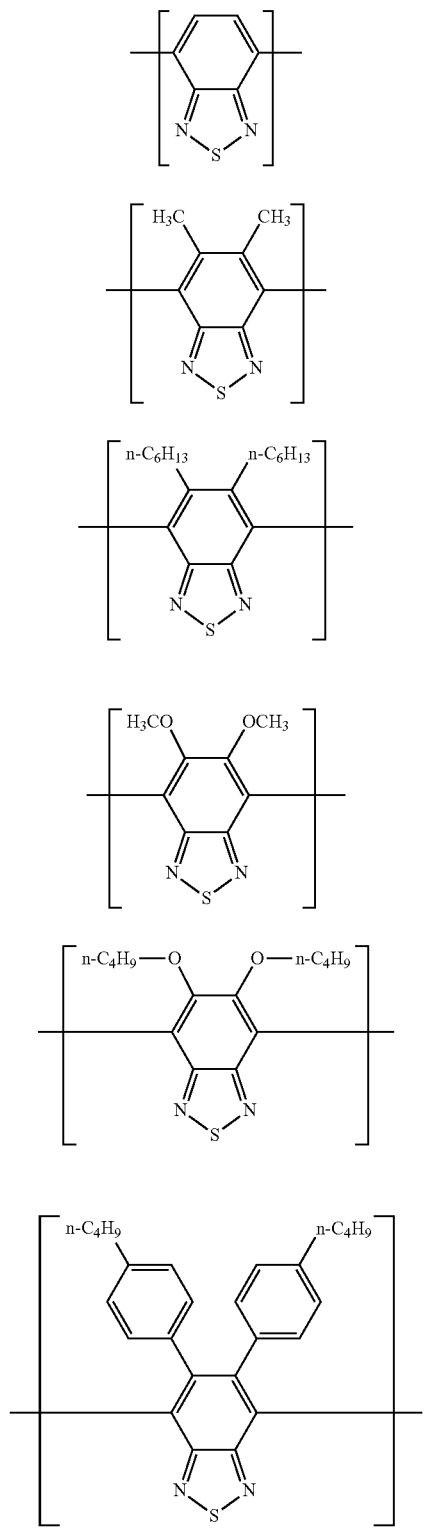

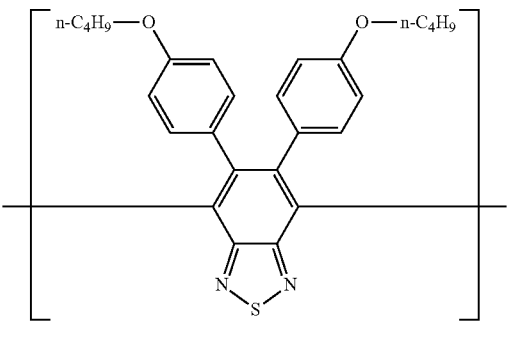

In formula (12), $R^{14}$, $R^{15}$, $R^{16}$, $R^{17}$, $R^{18}$ and $R^{19}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group.

The definitions and examples of unsubstituted alkyl groups are the same as the definitions and examples of unsubstituted alkyl groups represented by $R^1$ and $R^2$.

The definitions and examples of unsubstituted alkoxy, unsubstituted aryl, unsubstituted alkylaryl, unsubstituted alkoxyaryl and unsubstituted alkoxycarbonylaryl groups are the same as the definitions and examples of unsubstituted alkoxy, unsubstituted aryl, unsubstituted alkylaryl, unsubstituted alkoxyaryl and unsubstituted alkoxycarbonylaryl groups represented by $R^9$ in formula (8).

Constitutional units represented by formula (12) include constitutional units represented by formulas (1T-1)-(1T-8).

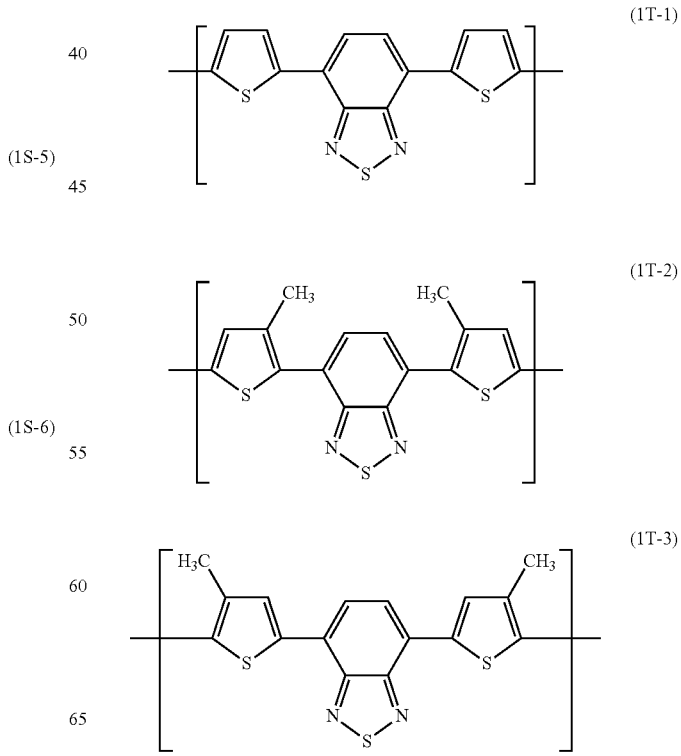

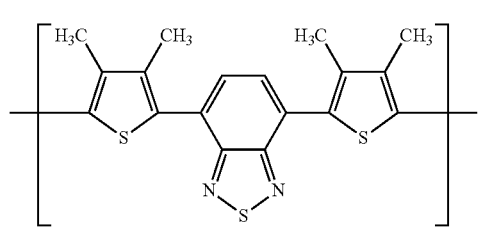

(1T-4)

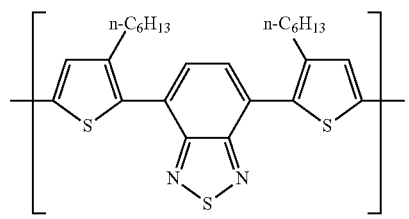

(1T-5)

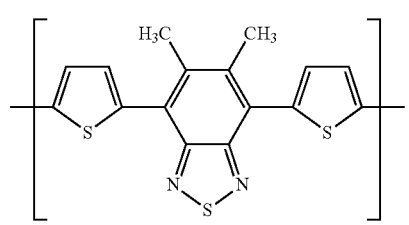

(1T-6)

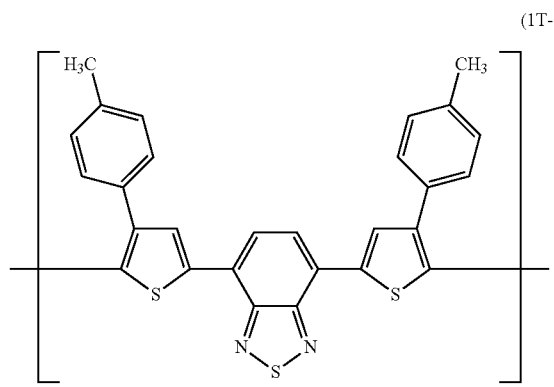

(1T-7)

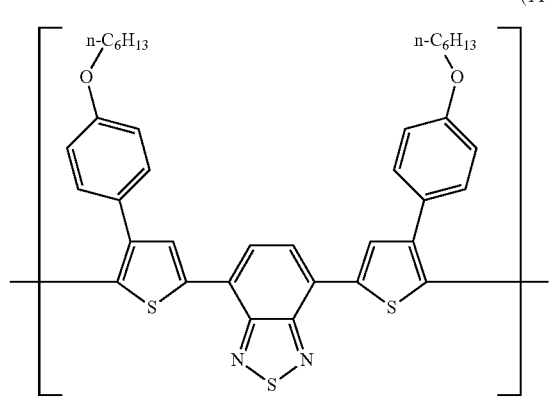

(1T-8)

In formula (13), $R^{20}$ represents an unsubstituted alkyl, unsubstituted alkoxy, unsubstituted aryl, unsubstituted alkylaryl, unsubstituted alkoxyaryl or unsubstituted alkoxycarbonylaryl group.

The definitions and examples of unsubstituted alkyl groups are the same as the definitions and examples of unsubstituted alkyl groups represented by $R^1$ and $R^2$.

The definitions and examples of unsubstituted alkoxy, unsubstituted aryl, unsubstituted alkylaryl, unsubstituted alkoxyaryl and unsubstituted alkoxycarbonylaryl groups are the same as the definitions and examples of unsubstituted alkoxy, unsubstituted aryl, unsubstituted alkylaryl, unsubstituted alkoxyaryl and unsubstituted alkoxycarbonylaryl groups represented by $R^9$ in formula (8).

In formula (13), g represents an integer of 0-5, preferably an integer of 1-3, and more preferably 1.

Constitutional units represented by formula (13) include constitutional units represented by formulas (1R-1)-(1R-6).

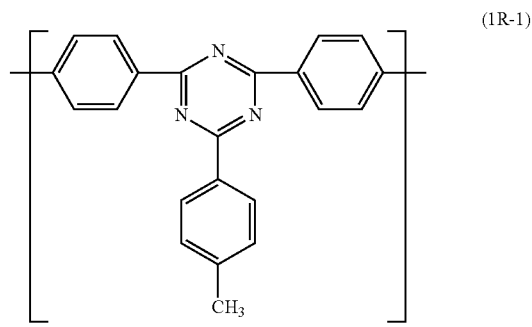

(1R-1)

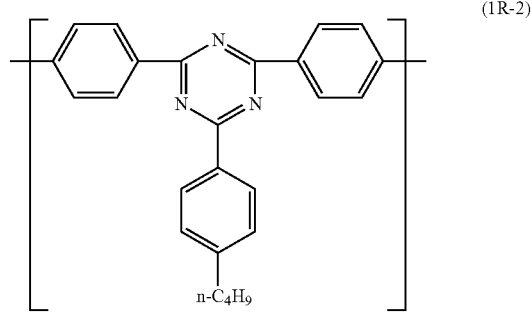

(1R-2)

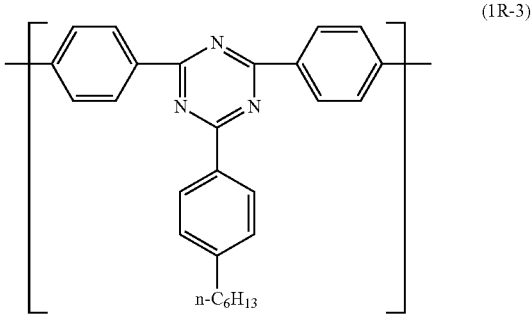

(1R-3)

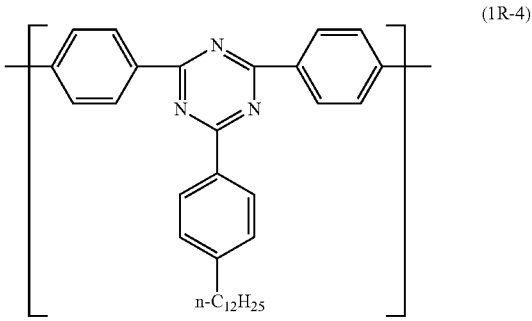

(1R-4)

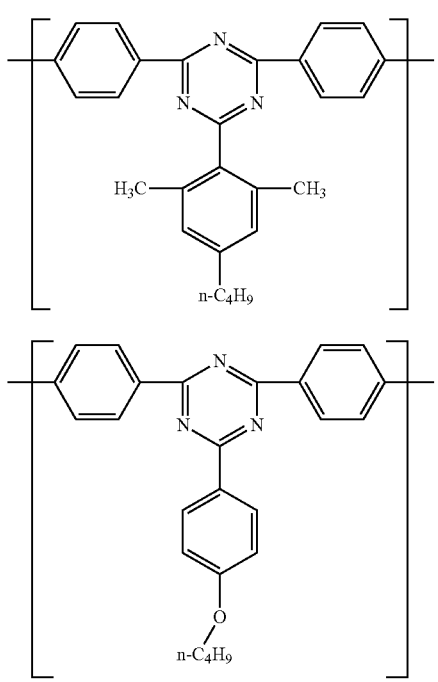

(1R-5)

(1R-6)

In particular, the polymer compound of the present embodiment is preferably a polymer compound comprising a constitutional unit represented by formula (1), and one or more constitutional units selected from the group consisting of constitutional units represented by formula (8), constitutional units represented by formula (9), constitutional units represented by formula (10) and constitutional units represented by formula (14).

In that case, the total number of moles of constitutional units represented by formula (1), constitutional units represented by formula (8), constitutional units represented by formula (9), constitutional units represented by formula (10) and constitutional units represented by formula (14) in the polymer compound of the invention is preferably 80-100%, more preferably 90-100% and even more preferably 95-100%, with respect to the total number of moles of all of the constitutional units.

In particular, as such a polymer compound, a polymer compound comprising one or more constitutional units represented by formula (1), one or more constitutional units represented by formula (9), and one or more constitutional units represented by formula (10), a polymer compound comprising one or more constitutional units represented by formula (1), one or more constitutional units represented by formula (9), and one or more constitutional units represented by formula (14), a polymer compound comprising one or more constitutional units represented by formula (1), one or more constitutional units represented by formula (10), and one or more constitutional units represented by formula (14), or a polymer compound comprising one or more constitutional units represented by formula (1), one or more constitutional units represented by formula (9), one or more constitutional units represented by formula (10), and one or more constitutional units represented by formula (14) is preferable.

Especially, a polymer compound comprising one or more constitutional units represented by formula (1), one or more constitutional units represented by formula (9), and one or more constitutional units represented by formula (10), or a polymer compound comprising one or more constitutional units represented by formula (1), one or more constitutional units represented by formula (9), one or more constitutional units represented by formula (10), and one or more constitutional units represented by formula (14) is more preferable.

Furthermore, the polymer compound of the present embodiment is also preferably a polymer compound comprising a constitutional unit represented by formula (1), one or more constitutional units selected from the group consisting of constitutional units represented by formula (8), constitutional units represented by formula (9), constitutional units represented by formula (10) and constitutional units represented by formula (14), and one or more constitutional units selected from the group consisting of constitutional units represented by formula (11), constitutional units represented by formula (12), and constitutional units represented by formula (13).

As such, in case the polymer compound includes one or more constitutional units selected from the group consisting of constitutional units represented by formula (11), constitutional units represented by formula (12), and constitutional units represented by formula (13), the total number of moles of constitutional units represented by formula (1), one or more constitutional units selected from the group consisting of constitutional units represented by formula (9), constitutional units represented by formula (10), and constitutional units represented by formula (14), and one or more constitutional units selected from the group consisting of constitutional units represented by formula (11), constitutional units represented by formula (12), and constitutional units represented by formula (13) is preferably 80-100%, more preferably 90-100% and even more preferably 95-100%, with respect to the total number of moles of all of the constitutional units.

As a polymer compound in this case, a polymer compound consisting of one or more constitutional units represented by formula (1), one or more constitutional units represented by formula (8), and one or more constitutional units represented by formula (13), or a polymer compound consisting of one or more constitutional units represented by formula (1), one or more constitutional units represented by formula (8), one or more constitutional units represented by formula (14), and one or more constitutional units represented by formula (13) is more preferable. In particular, a polymer compound consisting of one or more constitutional units represented by formula (1), one or more constitutional units represented by formula (8), and one or more constitutional units represented by formula (13) is further more preferable.

The polystyrene equivalent number-average molecular weight (Mn) of the polymer compound of the present embodiment, as measured by gel permeation chromatography (hereinafter, "GPC") will usually be $1 \times 10^3$-$1 \times 10^8$ and is preferably $1 \times 10^4$-$1 \times 10^6$. In addition, the polystyrene equivalent weight-average molecular weight (Mw) of the polymer compound of the invention will usually be $1 \times 10^3$-$1 \times 10^8$, and from the viewpoint of obtaining favorable film formability, it is preferably $1 \times 10^4$-$5 \times 10^6$, more preferably $3 \times 10^4$-$1 \times 10^6$ and even more preferably $5 \times 10^4$-$5 \times 10^5$.

If the end groups of the polymer compound of the present embodiment remain as polymerizing active groups, the luminescence property and usable life may potentially be reduced when the polymer compound is used to fabricate a light emitting device, and therefore stable groups are preferred as the end groups. The end groups are preferably groups that have conjugated bonds with the main chain, and these include groups bonded to aryl or monovalent heterocyclic groups via carbon-carbon bonds (specifically, the substituents denoted by formula 10 of Japanese Unexamined Patent Application Publication HEI No. 9-45478).

The polymer compound of the present embodiment may be a block copolymer, random copolymer, alternating copolymer or graft copolymer, or it may even be in another form.

The following polymer compounds (P-1)-(P-11) may be mentioned as preferable polymer compounds of the invention. For example, polymer compound (P-1) is a copolymer comprising a constitutional unit represented by formula (4) and a constitutional unit represented by formula (5) in the molar ratio Q1:Q2, and polymer compounds (P-2)-(P-11) are similar. Here, $R^3$, $R^4$, $R^7$, $R^8$, $R^9$, $R^{10}$, $R^{11}$, $R^{12}$, $R^{13}$, $R^{13'}$, $R^{20}$, $R^D$, $R^E$, $Ar^4$, a1, b1, e, f, g, h and i have the same meaning as above. Also, Q1-Q29 are numbers satisfying the following formulas attached to the chemical formulas indicating each compound.

Polymer compound (P-1)

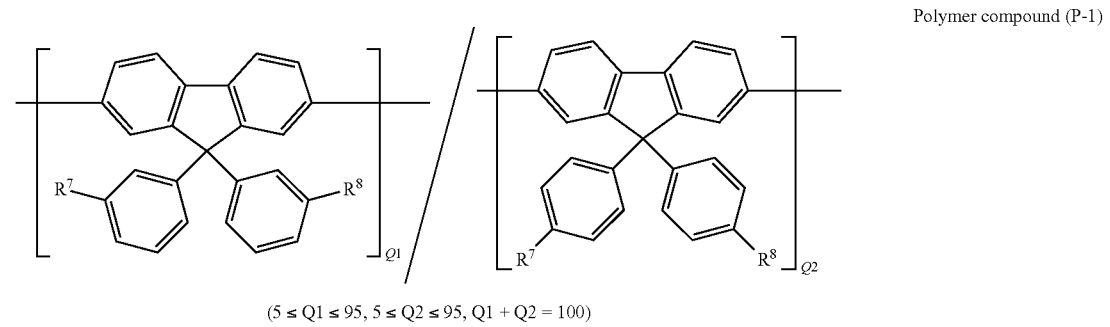

$(5 \leq Q1 \leq 95, 5 \leq Q2 \leq 95, Q1 + Q2 = 100)$

Polymer compound (P-2)

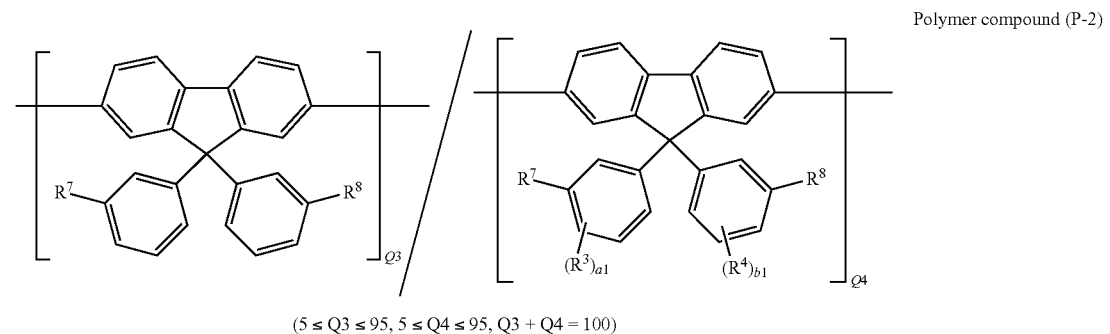

$(5 \leq Q3 \leq 95, 5 \leq Q4 \leq 95, Q3 + Q4 = 100)$

Polymer compound (P-3)

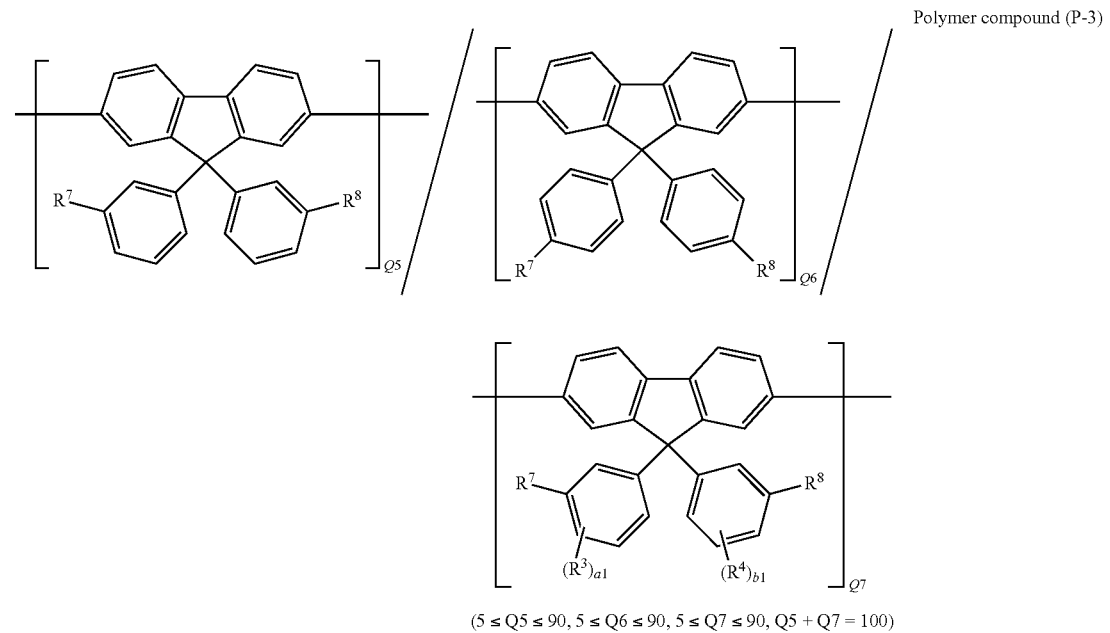

$(5 \leq Q5 \leq 90, 5 \leq Q6 \leq 90, 5 \leq Q7 \leq 90, Q5 + Q7 = 100)$

-continued
Polymer compound (P-4)
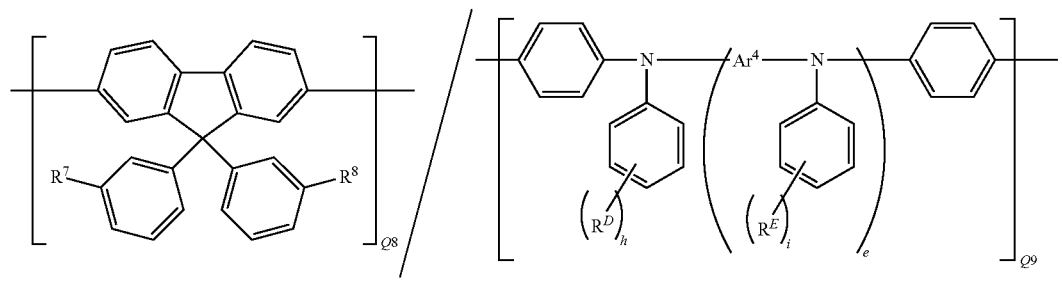
$(5 \leq Q8 \leq 95, 5 \leq Q9 \leq 95, Q8 + Q9 = 100)$
Polymer compound (P-5)
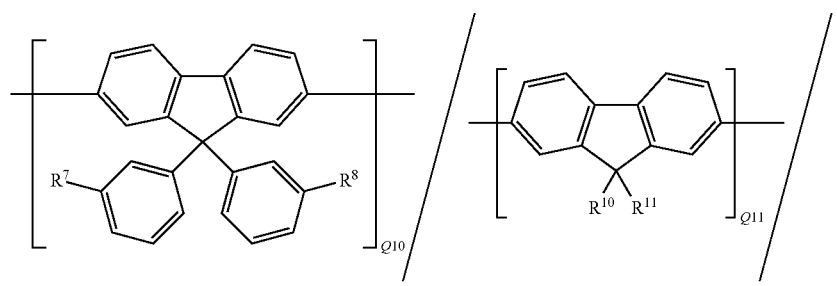
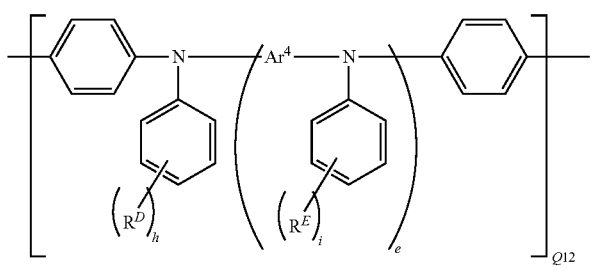
$(5 \leq Q10 \leq 94, 5 \leq Q11 \leq 94, 1 \leq Q12 \leq 50, Q10 + Q11 + Q12 = 100)$
Polymer compound (P-6)
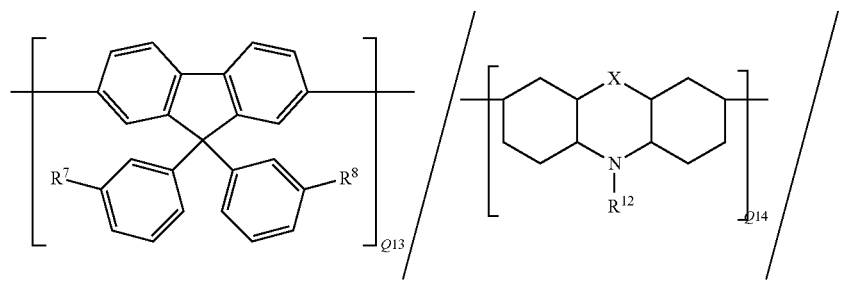
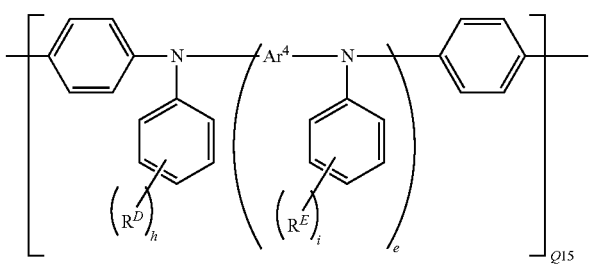
$(50 \leq Q13 \leq 98, 1 \leq Q14 \leq 49, 1 \leq Q15 \leq 49, Q13 + Q14 + Q15 = 100)$ -continued
Polymer compound (P-7)
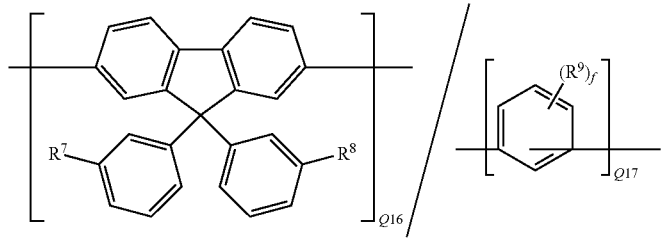
$5 \leq Q16 \leq 95, 5 \leq Q17 \leq 95, Q16 + Q17 = 100)$
Polymer compound (P-8)
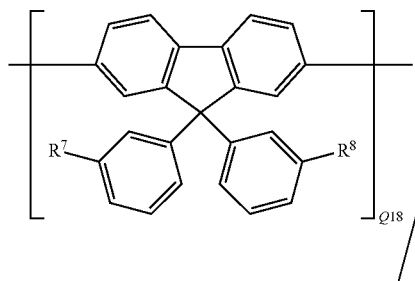 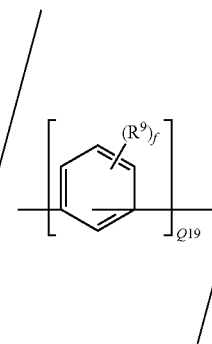 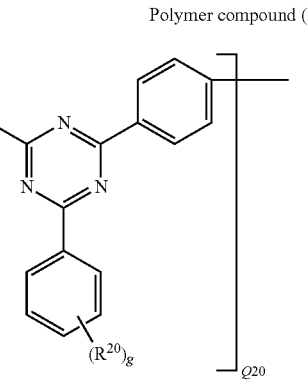
$5 \leq Q18 \leq 94, 5 \leq Q19 \leq 94, 1 \leq Q20 \leq 30, Q18 + Q19 + Q20 = 100)$
Polymer compound (P-9)
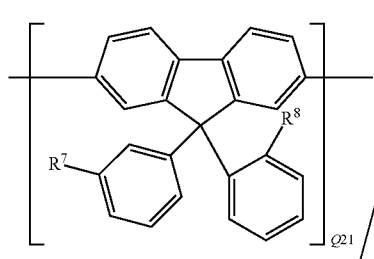 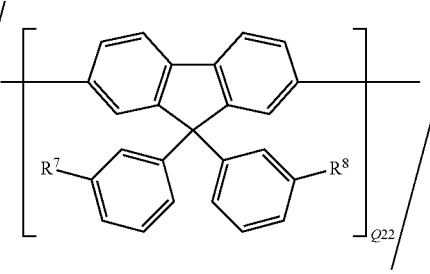
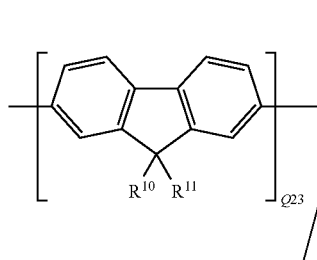 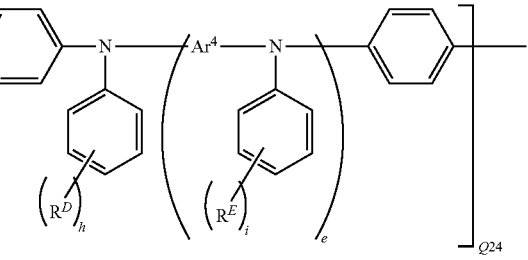
$(5 \leq Q21 \leq 89, 5 \leq Q22 \leq 89, 5 \leq Q23 \leq 89, 1 \leq Q24 \leq 30, Q21 + Q22 + Q23 + Q24 = 100)$
Polymer compound (P-10)
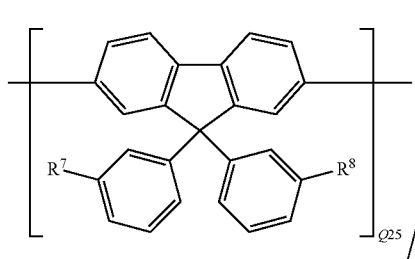 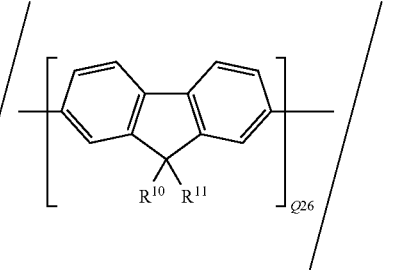

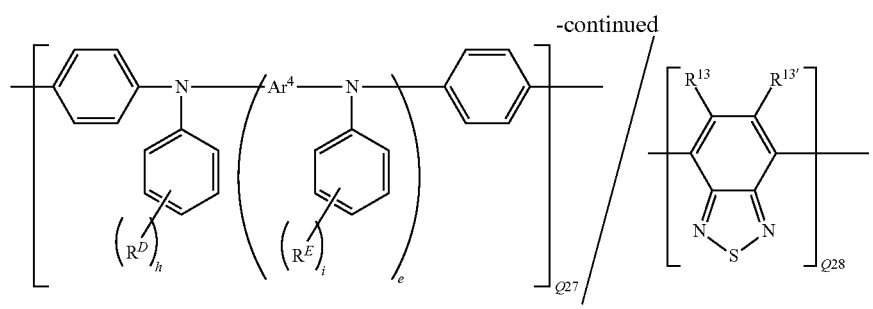
$(5 \leq Q25 \leq 93, 5 \leq Q26 \leq 93, 1 \leq Q27 \leq 30, 1 \leq Q28 \leq 50, Q25 + Q26 + Q27 + Q28 = 100)$
Polymer compound (P-11)
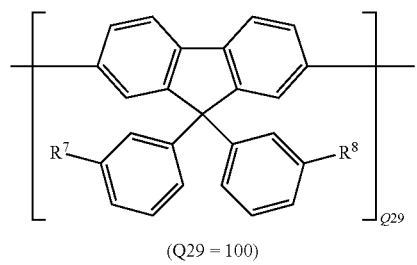
$(Q29 = 100)$
A specific example of the polymer compound of the present embodiment include the polymer compound (PA-1)-(PA-13) below.
Polymer compound (PA-1)
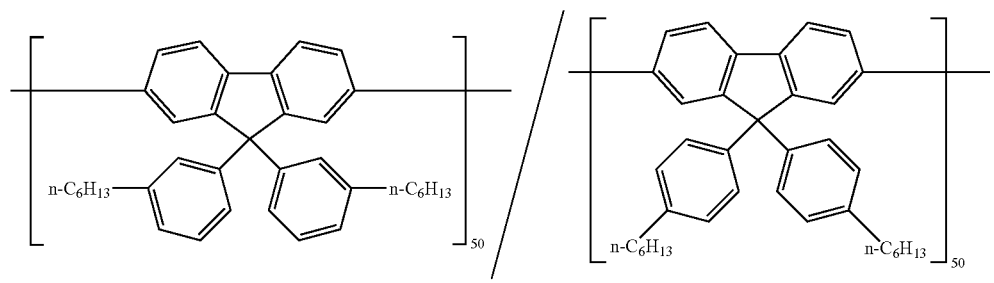
Polymer compound (PA-2)
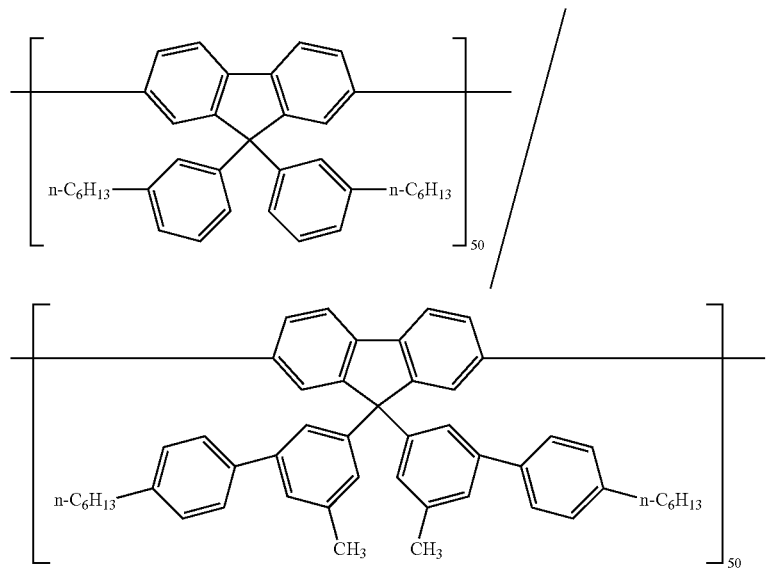

Polymer compound (PA-3)
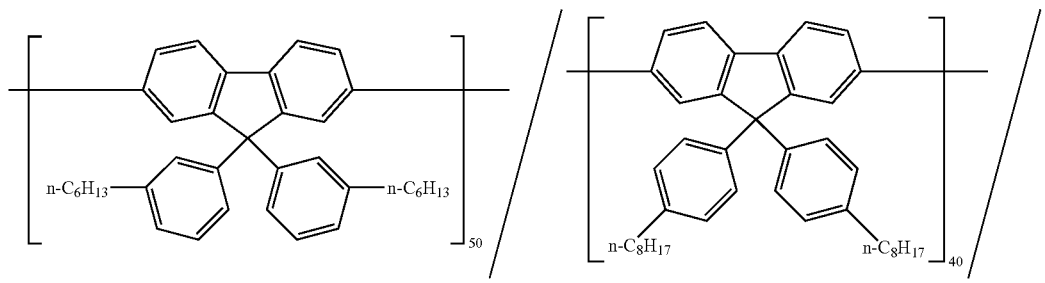
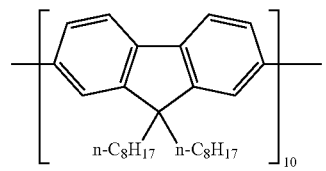
Polymer compound (PA-4)
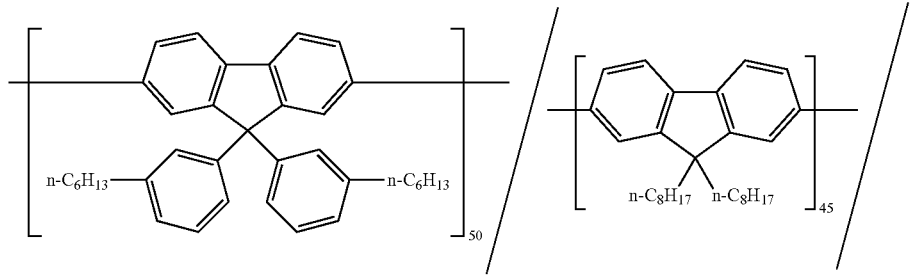
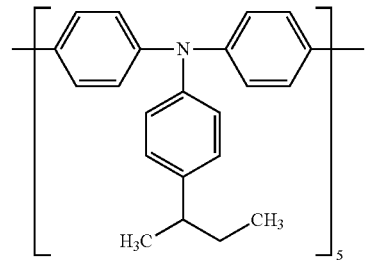
Polymer compound (PA-5)
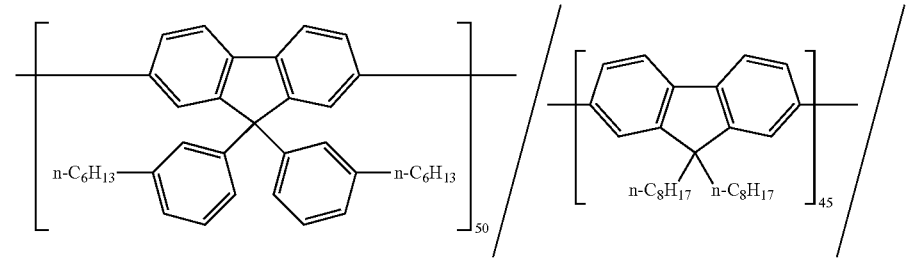
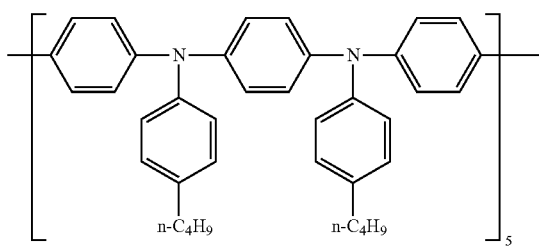

-continued
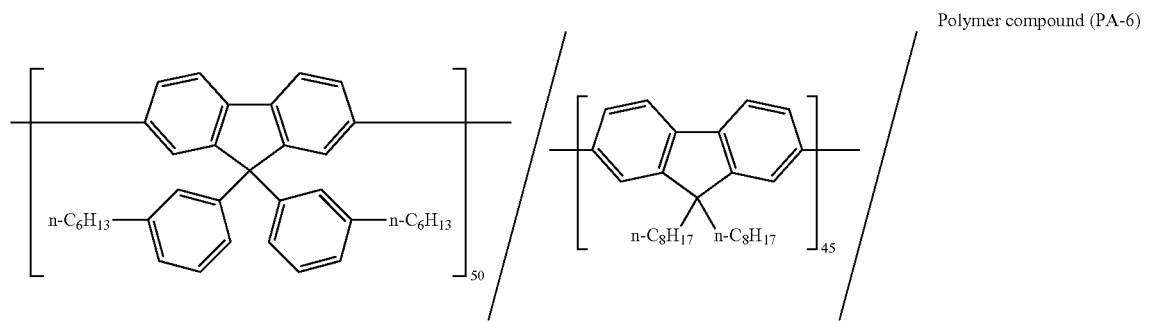
Polymer compound (PA-6)
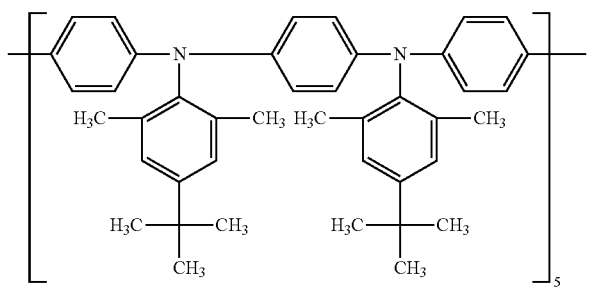
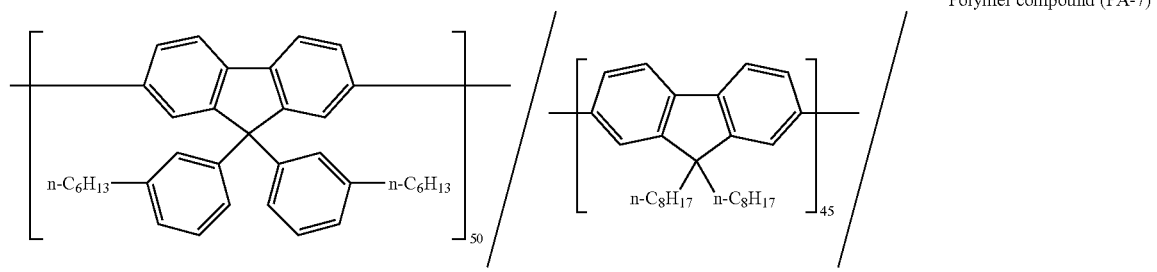
Polymer compound (PA-7)
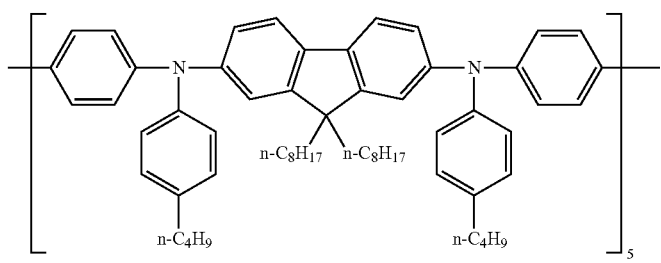
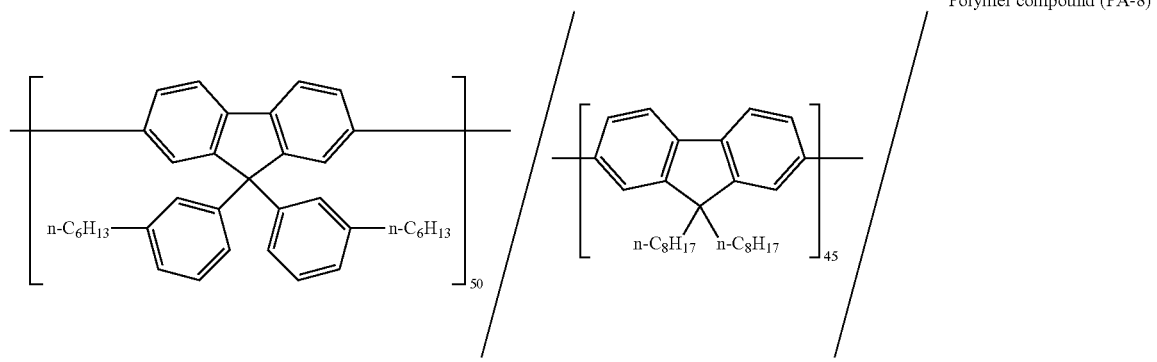
Polymer compound (PA-8)

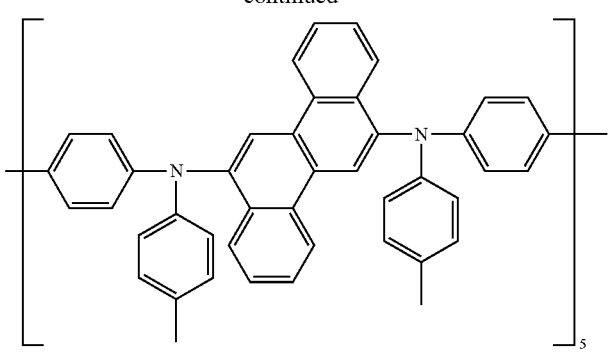
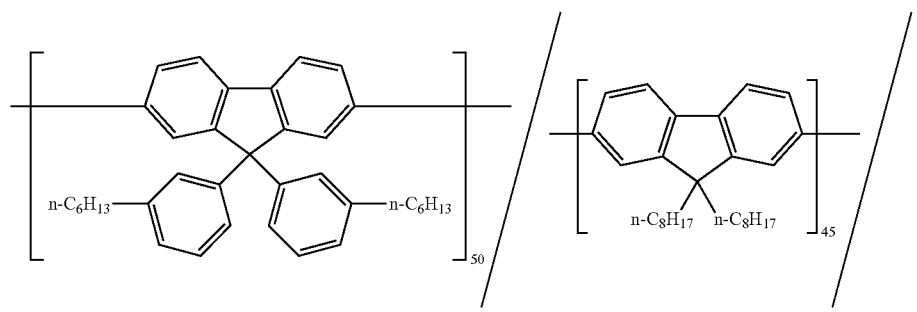
Polymer compound (PA-9)
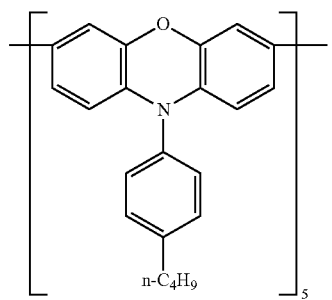
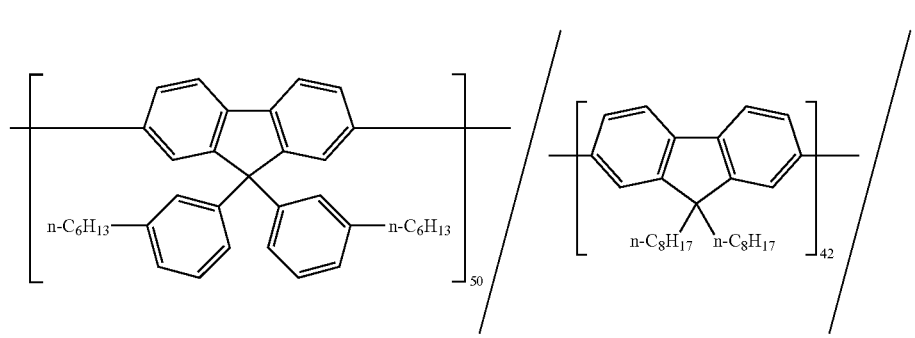
Polymer compound (PA-10)
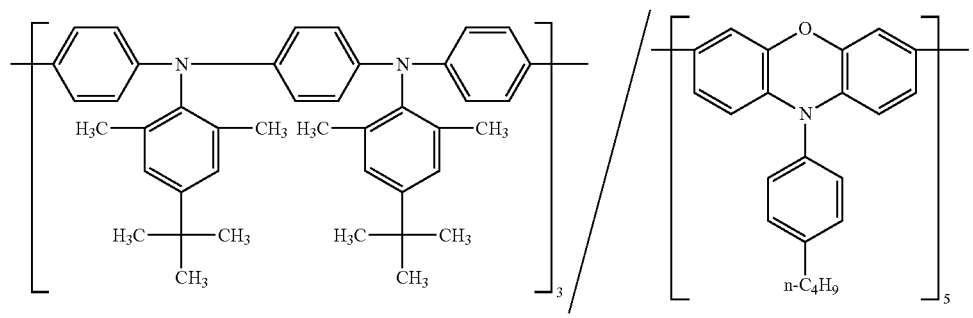

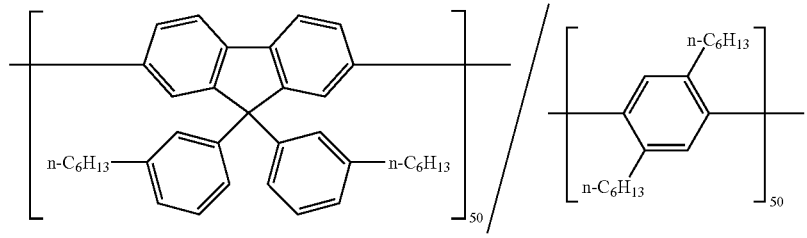
Polymer compound (PA-11)
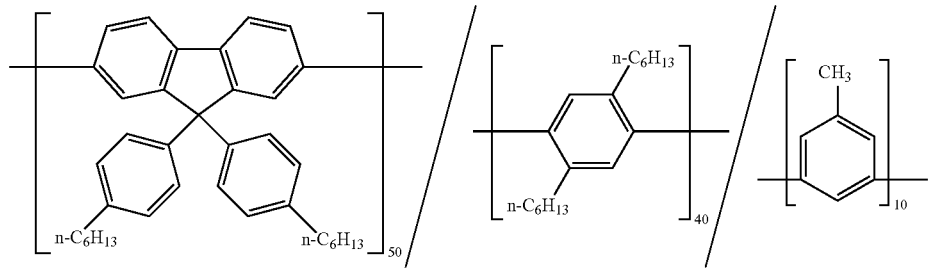
Polymer compound (PA-12)
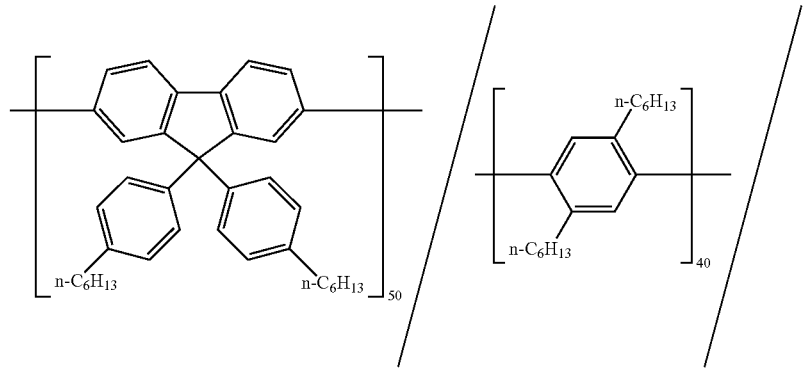
Polymer compound (PA-13)
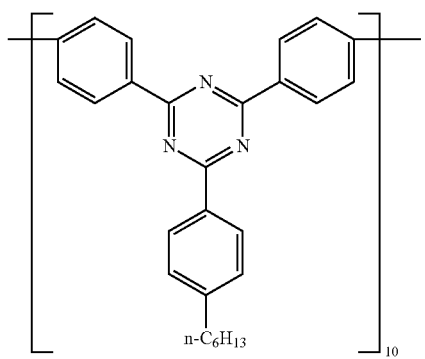

<Method for Producing Polymer Compound>

A preferred method for producing the polymer compound of the invention will now be described.

The polymer compound of the invention may be produced, for example, by condensation polymerization of a compound represented by formula (a).

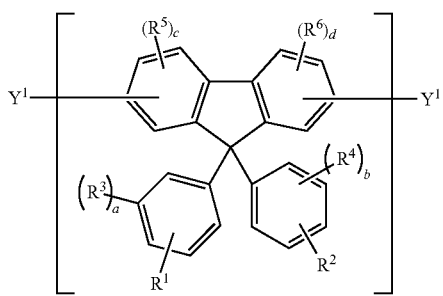

(a)

(In the formula, $R^1$, $R^2$, $R^3$, $R^4$, $R^5$, $R^6$, a and b have the same meaning as above. $Y^1$ is a halogen atom, methoxy group, boric acid ester residue, boric acid residue (that is, —B(OH)$_2$), a group represented by formula (a-1), a group represented by formula (a-2), a group represented by formula (a-3) or a group represented by formula (a-4). Two $Y^1$ groups when present may be the same or different.)

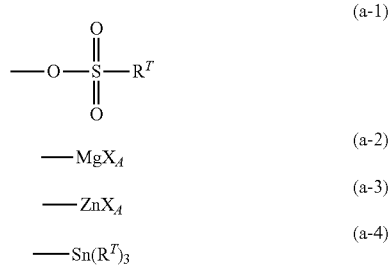

(In the formula (a-1)-(a-4), $R^T$ represents an unsubstituted or substituted alkyl or unsubstituted or substituted aryl group, and $X_A$ represents a halogen atom.)

When the polymer compound of the invention comprises a constitutional unit represented by formula (6) and a constitutional unit represented by formula (7), the polymer compound can be produced, for example, by condensation polymerization of a compound represented by formula (a), and at least one compound selected from the group consisting of compounds represented by formula (b-1) and compounds represented by formula (b-2).

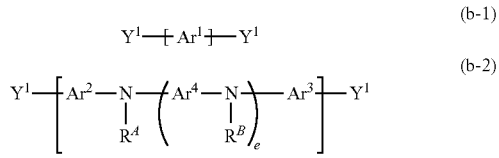

(In the formula (b-1) and (b-2), $Ar^1$, $Ar^2$, $Ar^3$, $Ar^4$, $R^A$, $R^B$, $Y^1$ and e have the same meaning as above.)

In formulas (a), (b-1), (b-2), (a-2) and (a-3), the halogen atoms represented by $Y^1$ and $X_A$ may be chlorine, bromine or iodine.

In formulas (a), (b-1) and (b-2), the boric acid ester residue represented by $Y^1$ may be a group represented by the following formula.

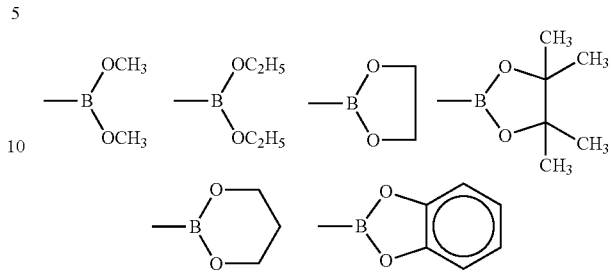

The definitions and examples of unsubstituted alkyl groups represented by $R^T$ in formula (a-1) are the same as the definitions and examples of unsubstituted alkyl groups represented by $R^1$ and $R^2$. The definitions and examples of substituted alkyl groups in formula (a-1) are the same as the definitions and examples of substituted alkyl groups represented by $R^5$ and $R^6$.

The definitions and examples of unsubstituted or substituted aryl groups in formula (a-1) are the same definitions and examples for the unsubstituted or substituted aryl groups represented by $R^3$ and $R^4$.

Examples of sulfonate groups represented by formula (a-1) include methane sulfonate, trifluoromethane sulfonate, phenyl sulfonate and 4-methylphenyl sulfonate groups.

The definitions and examples of unsubstituted or substituted alkyl and unsubstituted or substituted aryl groups represented by $R^T$ in formula (a-4) are the same definitions and examples mentioned for unsubstituted or substituted alkyl and unsubstituted or substituted aryl groups represented by $R^T$ in formula (a-1).

Groups represented by formula (a-4) include trimethylstannanyl, triethylstannanyl and tributylstannanyl groups.

The compounds represented by formulas (a), (b-1) and (b-2) may be synthesized and isolated beforehand, or they may be prepared in the reaction system and used directly.

In formulas (a), (b-1) and (b-2), $Y^1$ is preferably a halogen atom, boric acid ester residue or boric acid residue, since the convenience of synthesis and ease of handling of the compound represented by formula (a), (b-1) or (b-2) will be improved.

The method of condensation polymerization may be a method of reaction of a compound represented by formula (a), (b-1) or (b-2), using an appropriate catalyst and an appropriate base.

Such catalysts include transition metal complexes which may be palladium complexes such as palladium [tetrakis(triphenylphosphine)], [tris(dibenzylideneacetone)]dipalladium and palladium acetate or nickel complexes such as nickel [tetrakis(triphenylphosphine)], [1,3-bis(diphenylphosphino)propane]dichloronickel and [bis(1,4-cyclooctadiene)]nickel, or catalysts further comprising ligands such as triphenylphosphine, tri(tert-butylphosphine), tricyclohexylphosphine, diphenylphosphinopropane or pipyridyl as necessary. The catalyst may be synthesized beforehand or prepared in the reaction system and used directly. These catalysts may be used alone or in combinations of two or more.

When a catalyst is used, the amount of use is preferably 0.00001-3 mol equivalents, more preferably 0.00005-0.5 mol equivalents and even more preferably 0.0001-0.2 mol equivalents, as the amount of transition metal with respect to the total number of moles of the compound represented by formula (a), (b-1) or (b-2).

Examples of the aforementioned bases include inorganic bases such as sodium carbonate, potassium carbonate, cesium carbonate, potassium fluoride, cesium fluoride and tripotassium phosphate, and organic bases such as tetrabutylammonium fluoride, tetrabutylammonium chloride, tetrabutylammonium bromide and tetrabutylammonium hydroxide. These bases may be used alone or in combinations of two or more.

When a base is used, the amount of use is preferably 0.5-20 mol equivalents and more preferably 1-10 mol equivalents with respect to the total number of moles of the compound represented by formula (a), (b-1) or (b-2).

The condensation polymerization may be conducted in the presence of a solvent such as an organic solvent.

The preferable organic solvent will differ depending on the type of compound represented by formula (a), (b-1) or (b-2) and the reaction, and examples include toluene, xylene, mesitylene, tetrahydrofuran, 1,4-dioxane, dimethoxyethane, N,N-dimethylacetamide and N,N-dimethylformamide. In order to inhibit secondary reactions, such solvents are preferably subjected to deoxidizing treatment. These organic solvents may be used alone or in combinations of two or more.

The amount of organic solvent used is such that the total concentration of the compound represented by formula (a), (b-1) or (b-2) is usually 0.1-90 wt %, preferably 1-50 wt % and more preferably 2-30 wt %.

The reaction temperature for the condensation polymerization is preferably −100-200° C., more preferably −80-150° C. and even more preferably 0-120° C. The reaction time will depend on the conditions such as the reaction temperature, but it will usually be at least 1 hour, and is preferably 2-500 hours.

The condensation polymerization is preferably conducted under anhydrous conditions when $Y^1$ in formula (a), (b-1) or (b-2) is a group represented by formula (a-2), for example.

The method of condensation polymerization may be a method of polymerization by Suzuki reaction (Chem. Rev. Vol. 95, p. 2457 (1995)), a method of polymerization by Grignard reaction (Kobunshi Kinou Zairyo Series Vol. 2, "Polymer Syntheses and Reactions (2), p. 432-433, Kyoritsu Publishing), or a method of polymerization by Yamamoto polymerization (Prog. Polym. Sci., Vol. 17, p. 1153-1205, 1992).

Post-treatment after condensation polymerization may be carried out by a known method, such as adding the reaction mixture obtained by condensation polymerization to a lower alcohol such as methanol and filtering and drying the deposited precipitate.

Such post-treatment can yield a polymer compound of the invention, but if the purity of the polymer compound is low it may be purified by common methods such as recrystallization, continuous extraction with a Soxhlet extractor, or column chromatography.

<Composition>

The first composition of the preferable embodiment comprises at least one material selected from the group consisting of hole transport materials, electron transport materials and luminescent materials, and a polymer compound according to the invention. Such a composition can be used as a charge transport material or luminescent material, for example.

Hole transport materials, electron transport materials and luminescent materials include hole transport materials, electron transport materials and luminescent materials which may be present in the organic layers of light emitting devices, as described hereunder.

The content ratio of the polymer compound of the invention and at least one material selected from the group consisting of hole transport materials, electron transport materials and luminescent materials will depend on the purpose of use, but for example, for a luminescent material the polymer compound of the invention is usually used at 20-99 parts by weight and preferably 40-95 parts by weight with respect to 100 parts by weight of the entire composition.

The polystyrene equivalent number-average molecular weight of the first composition of the invention will usually be $1\times10^3$-$1\times10^8$ and is preferably $1\times10^4$-$1\times10^6$. The polystyrene equivalent weight-average molecular weight of this composition of the invention will usually be $1\times10^3$-$1\times10^8$, and from the viewpoint of obtaining favorable film formability and the luminous efficiency of the obtained device, it is preferably $1\times10^4$-$5\times10^6$. The average molecular weight of the composition of the invention is the value obtained by GPC analysis of the composition.

The second composition of the invention is a composition comprising a polymer compound of the invention and a solvent. Such a composition is often referred to as "solution", "ink" or "ink composition", and will hereunder be referred to as "solution of the invention".

The solution of the invention is useful for fabrication of devices by coating, such as in ink jet printing or press printing. In addition to the polymer compound and solvents, the solvent of the invention may also contain hole transport materials, electron transport materials, luminescent materials, stabilizers, thickeners (high molecular weight compounds or poor solvents for increased viscosity), low-molecular-weight compounds to lower the viscosity, surfactants (to lower the surface tension), antioxidants and the like.

The proportion of the polymer compound of the invention in the solution of the invention will usually be 0.1-99.9 parts by weight, and is preferably 0.1-10 parts by weight, more preferably 0.2-7 parts by weight and even more preferably 0.5-2 parts by weight, with respect to 100 parts by weight of the solution.

The viscosity of the solution of the invention may be adjusted depending on the type of printing method, but when the solution is to be passed through a discharge apparatus as in ink jet printing, the viscosity is preferably in the range of 1-20 mPa·s at 25° C. to prevent clogging or curving trajectory of the ink during discharge.

The high molecular weight compound used as the thickener may be any one that is soluble in the same solvent as the polymer compound of the invention and does not inhibit luminescence or charge transport, and for example, a high molecular weight polystyrene or high molecular weight polymethyl methacrylate may be used. These high molecular weight compounds preferably have polystyrene equivalent weight-average molecular weights of 500,000 or greater and more preferably 1,000,000 or greater.

A poor solvent may be used as the thickener. The viscosity can be increased by adding a small amount of a poor solvent for the solid portion in the solution. When a poor solvent is added for this purpose, the type and amount of solvent may be selected in a range so that the solid portion in the solution is not deposited. In consideration of stability during storage, the amount of poor solvent is preferably no greater than 50 parts by weight and even more preferably no greater than 30 parts by weight with respect to 100 parts by weight of the total solution.

The antioxidant is used to improve the storage stability of the solution of the invention. The antioxidant may be, for example, a phenol-based antioxidant, phosphorus-based antioxidant or the like, so long as it is soluble in the same solvent as the polymer compound of the invention and does not inhibit luminescence or charge transport.

The solvent in the solution of the invention is preferably one that can dissolve or evenly disperse the solid components in the solution. The solvent may be a chlorine-based solvent such as chloroform, methylene chloride, 1,2-dichloroethane, 1,1,2-trichloroethane, chlorobenzene or o-dichlorobenzene, an ether-based solvent such as tetrahydrofuran, dioxane, anisole, or 4-methylanisole, an aromatic hydrocarbon-based solvent such as toluene, xylene, mesitylene, ethylbenzene, n-hexylbenzene, or cyclohexylbenzene, an aliphatic hydrocarbon-based solvent such as cyclohexane, methylcyclohexane, n-pentane, n-hexane, n-heptane, n-octane, n-nonane or n-decane, a ketone-based solvent such as acetone, methyl ethyl ketone, cyclohexanone, benzophenone or acetophenone, an ester-based solvent such as ethyl acetate, butyl acetate, ethylcellosolve acetate, methyl benzoate or phenyl acetate, a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol, or a derivative thereof, an alcohol-based solvent such as methanol, ethanol, propanol, isopropanol or cyclohexanol, a sulfoxide-based solvent such as dimethyl sulfoxide, or an amide-based solvent such as N-methyl-2-pyrrolidone or N,N-dimethylformamide. These solvents may be used alone or in combinations of two or more.

Preferred among these, from the viewpoint of obtaining favorable solubility of the polymer compound of the invention, and the uniformity and viscosity characteristics for film formation, include aromatic hydrocarbon-based solvents, ether-based solvents, aliphatic hydrocarbon-based solvents, ester-based solvents and ketone-based solvents, among which there are more preferred toluene, xylene, ethylbenzene, diethylbenzene, trimethylbenzene, n-propylbenzene, isopropylbenzene, n-butylbenzene, isobutylbenzene, sec-butylbenzene, n-hexylbenzene, cyclohexylbenzene, 1-methylnaphthalene, tetralin, anisole, 4-methylanisole, ethoxybenzene, cyclohexane, bicyclohexyl, cyclohexenylcyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone and benzophenone.

From the viewpoint of obtaining satisfactory film formability and device characteristics, it is preferred to use a combination of two or more solvents, it is more preferred to use 2-3 different solvents, and it is especially preferred to use 2 different solvents.

When two different solvents are included in the solution of the invention, one of them may be in solid state at 25° C. From the viewpoint of obtaining favorable film formability, one of the solvents preferably has a boiling point of 180° C. or higher and more preferably 200° C. or higher. From the viewpoint of obtaining favorable viscosity, the polymer compound preferably dissolves in both solvents to a concentration of 1 wt % or greater at 60° C., and the polymer compound preferably dissolves in one of the two solvents to a concentration of 1 wt % or greater at 25° C.

When two or more different solvents are present in the solution of the invention, from the viewpoint of obtaining favorable viscosity and film formability, the solvent with the highest boiling point is preferably present at 40-90 wt %, more preferably at 50-90 wt % and even more preferably at 65-85 wt % of the total weight of solvents in the solution.

One or more different polymer compounds of the invention may be in the solution of the invention, and a high molecular weight compound other than the polymer compounds of the present invention may be included in ranges that do not impair the device characteristics.

The solution of the invention may also comprise water or a metal or its salt, in a range of 1-1000 ppm by weight. Metals include lithium, sodium, calcium, potassium, iron, copper, nickel, aluminum, zinc, chromium, manganese, cobalt, platinum and iridium. The solution of the invention may also contain silicon, phosphorus, fluorine, chlorine, bromine or the like in ranges of 1-1000 ppm by weight.

<Thin-Film>

The thin-film of the preferable embodiment comprises a polymer compound of the invention, and it may be, for example, a luminescent thin-film, conductive thin-film or organic semiconductor thin-film.

The thin-film of the present embodiment may be formed, for example, by spin coating, casting, microgravure coating, gravure coating, bar coating, roll coating, wire bar coating, dip coating, spray coating, screen printing, flexographic printing, offset printing, ink jet printing, capillary coating or nozzle coating, but it is preferably formed by screen printing, flexographic printing, offset printing or ink jet printing, and more preferably by an ink-jet method.

When a solution of the invention above is used to form the thin-film, heating may be performed at a temperature of 100° C. or higher because of the high glass transition temperature of the polymer compound of the invention in the solution, and it is possible to minimize reduction in the device characteristics even with heating at a temperature of 130° C. Heating may even be suitable at a temperature of 160° C. or higher, depending on the type of polymer compound.

A luminescent thin-film has a luminescent quantum yield of preferably 30% or greater, more preferably 50% or greater, even more preferably 60% or greater and most preferably 70% or greater, from the viewpoint of obtaining satisfactory device luminance and luminescence voltage.

For a conductive thin-film, the surface resistance is preferably no greater than 1K Ω/sq., more preferably no greater than 100 Ω/sq. and even more preferably no greater than 10 Ω/sq. The conductive thin-film may be doped with a Lewis acid, ionic compound or the like, thereby further increasing the electric conductivity.

The greater of the electron mobility or hole mobility of the organic semiconductor thin-film is preferably $1\times10^{-5}$ cm$^2$/V·s or greater, more preferably $1\times10^{-3}$ cm$^2$/V·s or greater and even more preferably $1\times10^{-5}$ cm$^2$/V·s or greater. An organic transistor can be fabricated by forming the organic semiconductor thin-film on a Si board comprising a gate electrode and an insulating film made of $SiO_2$ or the like, and then forming a source electrode and drain electrode of Au or the like.

<Light Emitting Device>

A light emitting device of the invention will now be described.

A light emitting device of the invention has electrodes consisting of an anode and a cathode, and a layer comprising the aforementioned polymer compound of the present invention formed between the electrodes.

The layer comprising the polymer compound of the present invention preferably consists of one or more luminescent layers, hole transport layers, hole injection layers, electron transport layers, electron injection layers or interlayers, more preferably one or more electron transport layers, electron injection layers or a luminescent layer, and even more preferably the layer is a luminescent layer.

A luminescent layer is a layer having a luminescent function. A hole transport layer is a layer having a hole transporting function. An electron transport layer is a layer having an electron transporting function. An interlayer is a layer situated between the luminescent layer and anode and adjacent to the luminescent layer, performing the role of separating the luminescent layer and anode, or the luminescent layer and the hole injection layer or hole transport layer. Electron transport layers and hole transport layers are collectively referred to as "charge transport layers", and electron injection layers and hole injection layers are collectively referred to as "charge injection layers". The luminescent layer, hole transport layer, hole injection layer, electron transport layer, electron injection layer and interlayer may each consist of a single layer or two or more layers.

When the layer comprising the polymer compound is a luminescent layer, the luminescent layer may further comprise a hole transport material, electron transport material, luminescent material, and additives that extend the luminance lifetime of the light emitting device. The term "luminescent material" as used herein refers to a material exhibiting fluorescence and/or phosphorescence (excluding polymer compounds of the invention).

When the layer comprising the polymer compound comprises both the polymer compound of the invention and a hole transport material, the proportion of the hole transport material with respect to 100 parts by weight as the total of the polymer compound of the invention and the hole transport material will normally be 1-80 parts by weight, and is preferably 5-60 parts by weight.

When the layer comprising the polymer compound comprises both the polymer compound of the invention and an electron transport material, the proportion of the electron transport material with respect to 100 parts by weight as the total of the polymer compound of the invention and the electron transport material will normally be 1-80 parts by weight, and is preferably 5-60 parts by weight.

When the layer comprising the polymer compound comprises both the polymer compound of the invention and a luminescent material, the proportion of the luminescent material with respect to 100 parts by weight as the total of the polymer compound of the invention and the luminescent material will normally be 1-80 parts by weight, and is preferably 5-60 parts by weight.

When the layer comprising the polymer compound comprises both the polymer compound of the invention and two or more materials selected from the group consisting of hole transport materials, electron transport materials and luminescent materials, the proportion of the luminescent material with respect to 100 parts by weight as the total will normally be 1-50 parts by weight and preferably 5-40 parts by weight, and the total proportion of the hole transport material and electron transport material with respect to 100 parts by weight as the total will normally be 1-50 parts by weight and preferably 5-40 parts by weight.

The hole transport material, electron transport material and luminescent material may also employ publicly known low-molecular-weight compounds, triplet light emitting complexes and high molecular weight compounds.

The aforementioned high molecular weight compounds include polymers and copolymers (polymer and copolymer will be hereinafter collectively referred to as "(co)polymers") having fluorenediyl groups as constitutional units, (co)polymers having arylene groups as constitutional units, (co)polymers having arylenevinylene groups as constitutional units and (co)polymers having divalent aromatic amine groups as constitutional units, which are described in WO99/13692, WO99/48160, GB2340304A, WO00/53656, WO01/19834, WO00/55927, GB2348316, WO00/46321, WO00/06665, WO99/54943, WO99/54385, U.S. Pat. No. 5,777,070, WO98/06773, WO97/05184, WO00/35987, WO00/53655, WO01/34722, WO99/24526, WO00/22027, WO00/22026, WO98/27136, U.S. Pat. No. 573,636, WO98/21262, U.S. Pat. No. 5,741,921, WO97/09394, WO96/29356, WO96/10617, EP0707020, WO95/07955, Japanese Unexamined Patent Application Publication No. 2001-181618, Japanese Unexamined Patent Application Publication No. 2001-123156, Japanese Unexamined Patent Application Publication No. 2001-3045, Japanese Unexamined Patent Application Publication No. 2000-351967, Japanese Unexamined Patent Application Publication No. 2000-303066, Japanese Unexamined Patent Application Publication No. 2000-299189, Japanese Unexamined Patent Application Publication No. 2000-252065, Japanese Unexamined Patent Application Publication No. 2000-136379, Japanese Unexamined Patent Application Publication No. 2000-104057, Japanese Unexamined Patent Application Publication No. 2000-80167, Japanese Unexamined Patent Application Publication HEI No. 10-324870, Japanese Unexamined Patent Application Publication HEI No. 10-114891, Japanese Unexamined Patent Application Publication HEI No. 9-111233 and Japanese Unexamined Patent Application Publication HEI No. 9-45478.

The low-molecular-weight compounds include naphthalene derivatives, anthracene and its derivatives, perylene and its derivatives, polymethine-based, xanthene-based, coumarin-based and cyanine-based pigments, metal complexes of 8-hydroxyquinoline and its derivatives, aromatic amines, tetraphenylcyclopentadiene and its derivatives and tetraphenylbutadiene and its derivatives, and specifically they include the compounds described in Japanese Unexamined Patent Application Publication SHO No. 57-51781 and Japanese Unexamined Patent Application Publication SHO No. 59-194393.

Triplet light emitting complexes include $Ir(ppy)_3$, $Btp_2Ir$ (acac), FIrpic, COM-1, COM-2, COM-3, and ADS066GE, marketed by American Dye Source, Inc., which have iridium as the central metal, PtOEP which has platinum as the central metal, and $Eu(TTA)_3$-phen which has europium as the central metal. These triplet light emitting complexes are indicated in the following chemical formula, including those specifically described in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852 and Jpn. J. Appl. Phys., 34, 1883 (1995).

-continued
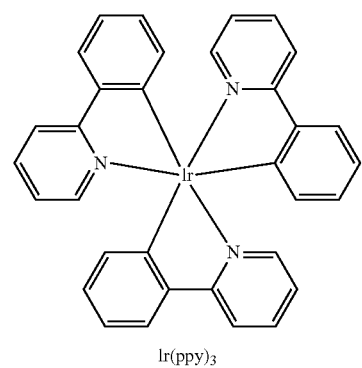
Ir(ppy)₃
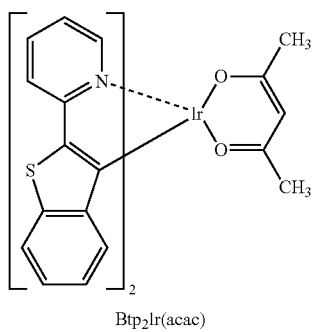
Btp₂Ir(acac)
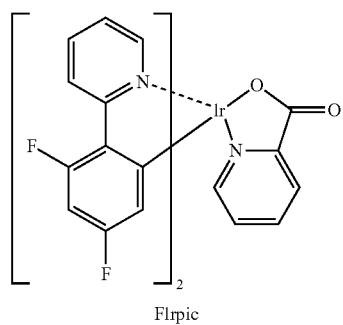
FIrpic
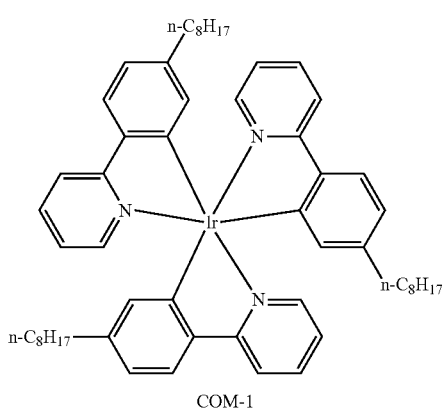
COM-1
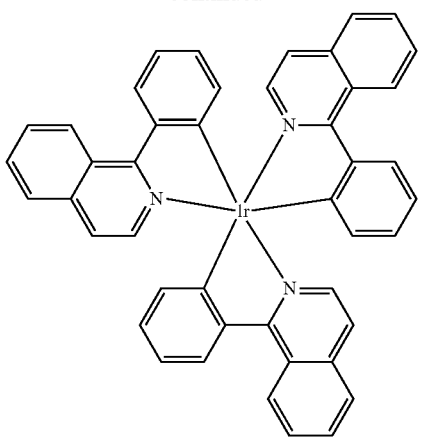
COM-2
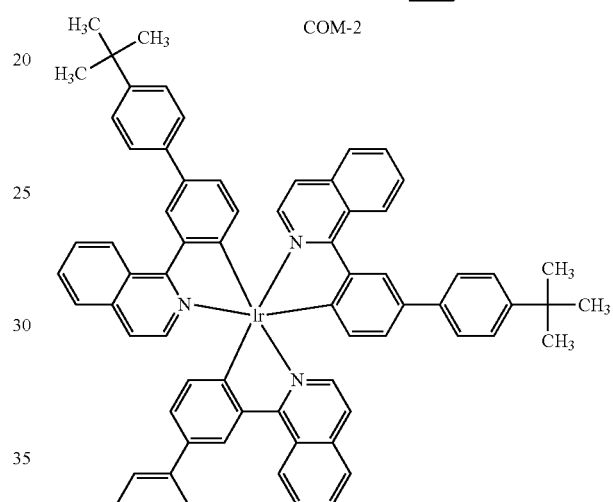
COM-3
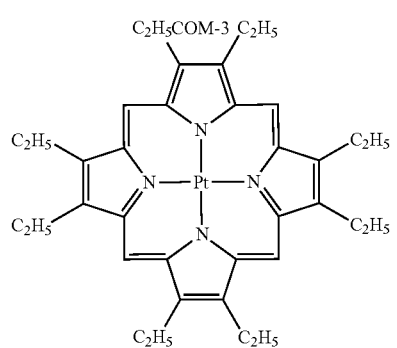
PtOEP
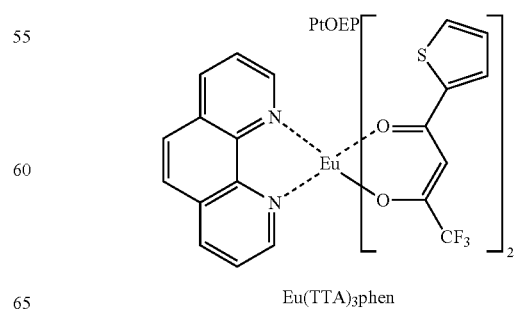
Eu(TTA)₃phen In addition, triplet light emitting complexes may be used by conjugating them to main chain, side chain, end group of the polymer compound of the present invention. Specific examples of such a polymer compound include the polymer compound (PB-1) and (PB-2) below.
Polymer compound (PB-1)
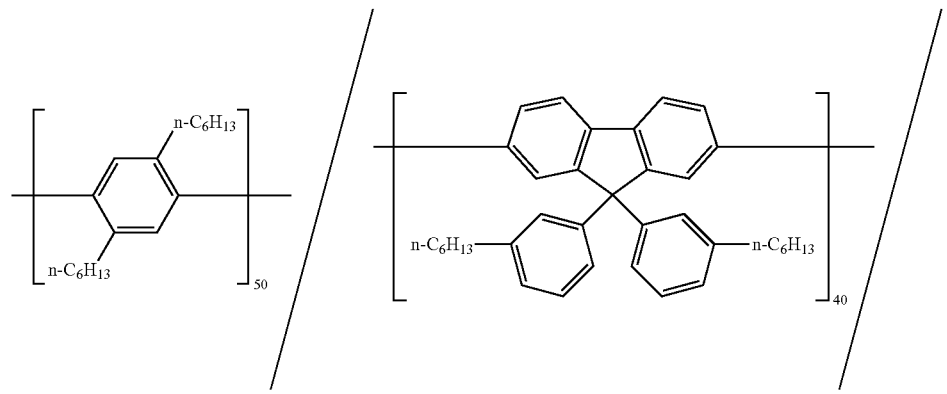
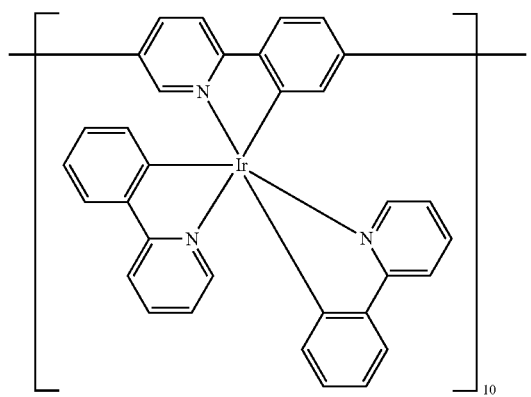
Polymer compound (PB-2)
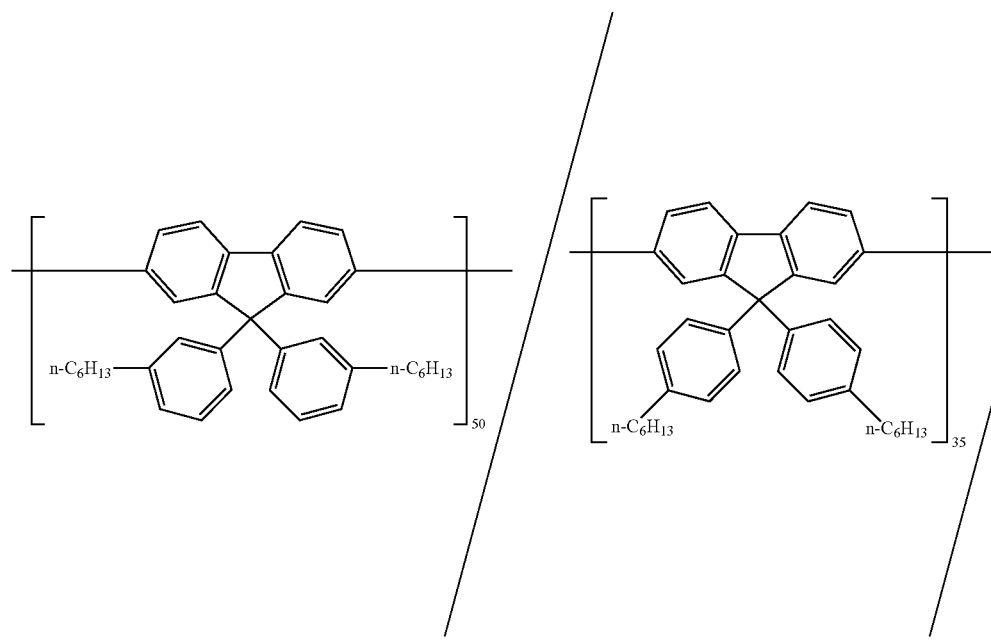

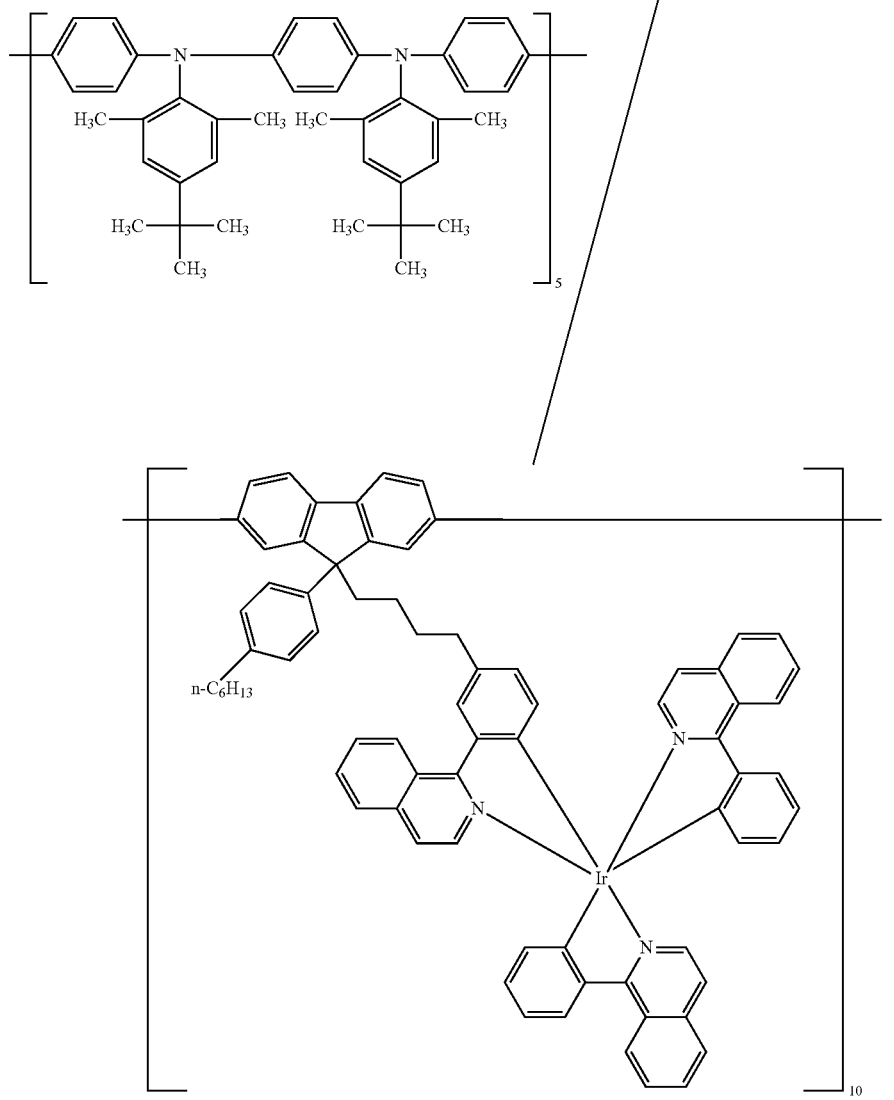

The aforementioned additives include bipyridyls such as 2,2'-bipyridyl, 3,3'-bipyridyl and 4,4'-bipyridyl, and bipyridyl derivatives such as 4-methyl-2,2'-bipyridyl, 5-methyl-2,2'-bipyridyl and 5,5'-dimethyl-2,2'-bipyridyl.

The optimum value for the thickness of the luminescent layer will differ depending on the material used, and it may be selected as the optimum value for driving voltage and luminous efficiency, but for most cases it will be 1 nm-1 µm, preferably 2 nm-500 nm, more preferably 5 nm-200 nm and even more preferably 50 nm-150 nm.

The method of forming the luminescent layer may involve formation of a film from a solution. Coating methods for forming films from solutions include spin coating, casting, microgravure coating, gravure coating, bar coating, roll coating, wire bar coating, dip coating, spray coating, screen printing, flexographic printing, offset printing, ink jet printing, capillary coating and nozzle coating, but from the viewpoint of ease of pattern formation and multicolor coating, printing methods such as screen printing, flexographic printing, offset printing and ink jet printing are preferred.

The solvent in the solution of the invention is preferably one that can dissolve or evenly disperse the solid components in the solution. The solvent may be a chlorine-based solvent such as chloroform, methylene chloride, 1,2-dichloroethane, 1,1,2-trichloroethane, chlorobenzene or o-dichlorobenzene, an ether-based solvent such as tetrahydrofuran, dioxane, an aromatic hydrocarbon-based solvent such as toluene, xylene, mesitylene, ethylbenzene, n-hexylbenzene, cyclohexylbenzene, anisole, or 4-methylanisole, an aliphatic hydrocarbon-based solvent such as cyclohexane, methylcyclohexane, n-pentane, n-hexane, n-heptane, n-octane, n-nonane or n-decane, a ketone-based solvent such as acetone, methyl ethyl ketone, or cyclohexanone, an ester-based solvent such as ethyl acetate, butyl acetate, or ethylcellosolve acetate, a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol, or a derivative thereof, an alcohol-based solvent such as methanol, ethanol, propanol, isopropanol or cyclohexanol, a sulfoxide-based solvent such as dimethyl sulfoxide, or an amide-based solvent such as N-methyl-2-pyrrolidone or N,N-dimethylformamide. These solvents may be used alone or in combinations of two or more.

The light emitting device of the invention may be a light emitting device having an electron transport layer formed between a cathode and a luminescent layer, a light emitting device having a hole transport layer formed between an anode and a luminescent layer, or a light emitting device having an electron transport layer formed between a cathode and a luminescent layer and having a hole transport layer formed between an anode and a luminescent layer.

Examples of such light emitting device structures include the following structures a) to d).
a) Anode/luminescent layer/cathode
b) Anode/hole transport layer/luminescent layer/cathode
c) Anode/luminescent layer/electron transport layer/cathode
d) Anode/hole transport layer/luminescent layer/electron transport layer/cathode
(Here, the "/" indicates that the layers are laminated adjacent to each other; same hereunder.)

In each of these structures, an interlayer may be provided between the luminescent layer and anode, adjacent to the luminescent layer. Examples of such light emitting device structures include the following structures a') to d').
a') Anode/interlayer/luminescent layer/cathode
b') Anode/hole transport layer/interlayer/luminescent layer/cathode
c') Anode/interlayer/luminescent layer/electron transport layer/cathode
d') Anode/hole transport layer/interlayer/luminescent layer/electron transport layer/cathode When the light emitting device of the invention has a hole transport layer, the hole transport layer will usually contain the hole transport material (high molecular weight compound or low-molecular-weight compound). Examples of hole transport materials include polyvinylcarbazole and its derivatives, polysilane and its derivatives, polysiloxane derivatives having aromatic amines on side chains or the main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives and poly(2,5-thienylenevinylene) and its derivatives, as well as those described in Japanese Unexamined Patent Application Publication SHO No. 63-70257 and 63-175860 and Japanese Unexamined Patent Application Publication HEI No. 2-135359, 2-135361, 2-209988, 3-37992 and 3-152184.

Preferred among these as high molecular weight compounds are polyvinylcarbazole and its derivatives, polysilane and its derivatives, polysiloxane derivatives having aromatic amine compounds on side chains or the main chain, polyaniline and its derivatives, polythiophene and its derivatives, poly(p-phenylenevinylene) and its derivatives and poly(2,5-thienylenevinylene) and its derivatives, and polyvinylcarbazole and its derivatives, polysilane and its derivatives and polysiloxane derivatives having aromatic amines on side chains or the main chain are more preferred.

Pyrazoline derivatives, arylamine derivatives, stilbene derivatives and triphenyldiamine derivatives are preferred among these as low-molecular-weight compounds. These low-molecular-weight compounds are preferably used after dispersion in a high molecular binder.

The high molecular binder is preferably a compound that does not excessively hinder charge transport and has low absorption of visible light, and examples thereof include poly(N-vinylcarbazole), polyaniline and its derivatives, polythiophene and its derivatives, poly(p-phenylenevinylene) and its derivatives, poly(2,5-thienylenevinylene) and its derivatives, polycarbonates, polyacrylates, polymethyl acrylates, polymethyl methacrylates, polystyrenes, polyvinyl chlorides and polysiloxanes.

Polyvinylcarbazole and its derivatives may be obtained, for example, by cationic polymerization or radical polymerization from vinyl monomers.

Examples of polysilane and its derivatives include the compounds mentioned in Chem. Rev. Vol. 89, p. 1359 (1989) and GB2300196. The synthesis methods described in this literature may be used, although the Kipping method is preferred.

Because the skeletal structure of siloxane has essentially no hole transport property, polysiloxane and its derivatives are preferably compounds having a structure with the aforementioned low-molecular-weight hole transport material on a side chain or the main chain, and more preferably compounds having a hole transporting aromatic amine on a side chain or the main chain.

The method of forming the hole transport layer may be film formation from a mixture with a high molecular binder, if a low-molecular-weight compound is used, or film formation from a solution, if a high molecular weight compound is used.

The solvent used for film formation from a solution is preferably one that can dissolve or evenly disperse the hole transport material. The solvent may be a chlorine-based solvent such as chloroform, methylene chloride, 1,2-dichloroethane, 1,1,2-trichloroethane, chlorobenzene or o-dichlorobenzene, an ether-based solvent such as tetrahydrofuran or dioxane, an aromatic hydrocarbon-based solvent such as toluene, xylene, mesitylene, ethylbenzene, hexylbenzen, n-hexylbenzene, cyclohexylbenzene, anisole, or 4-methylanisole, an aliphatic hydrocarbon-based solvent such as cyclohexane, methylcyclohexane, n-pentane, n-hexane, n-heptane, n-octane, n-nonane or n-decane, a ketone-based solvent such as acetone, methyl ethyl ketone or cyclohexanone, an ester-based solvent such as ethyl acetate, butyl acetate or ethylcellosolve acetate, a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol, or a derivative thereof, an alcohol-based solvent such as methanol, ethanol, propanol, isopropanol or cyclohexanol, a sulfoxide-based solvent such as dimethyl sulfoxide, or an amide-based solvent such as N-methyl-2-pyrrolidone or N,N-dimethylformamide. These solvents may be used alone or in combinations of two or more.

The film formation from a solution may be accomplished by a coating method such as spin coating, casting, microgravure coating, gravure coating, bar coating, roll coating, wire bar coating, dip coating, spray coating, screen printing, flexographic printing, offset printing, ink jet printing, capillary coating or nozzle coating.

The optimum value for the film thickness of the hole transport layer will differ depending on the material used, and it may be selected so that the driving voltage and luminous efficiency are suitable values, but the thickness must be sufficient to avoid generation of pinholes, while an excessive thickness is not preferred as it may increase the driving voltage of the device. The film thickness of the hole transport layer is therefore usually 1 nm-1 μm, preferably 2-500 nm and more preferably 5-200 nm.

When the light emitting device of the invention has an electron transport layer, the electron transport layer will usually contain the electron transport material (high molecular weight compound or low-molecular-weight compound). Known electron transport materials may be used, examples of which include oxadiazole derivatives, anthraquinodimethane and its derivatives, benzoquinone and its derivatives, naphthoquinone and its derivatives, anthraquinone and its derivatives, tetracyanoquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives and polyfluorene and its derivatives, as well as the compounds described in Japanese Unexamined Patent Application Publication SHO No. 63-70257, Japanese Unexamined Patent Application Publication SHO No. 63-175860, Japanese Unexamined Patent Application Publication HEI No. 2-135359, Japanese Unexamined Patent Application Publication HEI No. 2-135361, Japanese Unexamined Patent Application Publication HEI No. 2-209988, Japanese Unexamined Patent Application Publication HEI No. 3-37992 and Japanese Unexamined Patent Application Publication HEI No. 3-152184, among which oxadiazole derivatives, benzoquinone and its derivatives, anthraquinone and its derivatives, metal complexes of 8-hydroxyquinoline and its derivatives, polyquinoline and its derivatives, polyquinoxaline and its derivatives and polyfluorene and its derivatives are preferred, and 2-(4-biphenyl)-5-(4-tert-butylphenyl)-1,3,4-oxadiazole, benzoquinone, anthraquinone, tris(8-quinolinol)aluminum and polyquinoline are even more preferred.

The method of forming the electron transport layer may be vacuum vapor deposition from a powder or film formation from a solution or molten state, if a low-molecular-weight compound is used, or film formation from a solution or molten state, if a high molecular weight compound is used. The aforementioned high molecular binder may also be used for film formation from a solution or molten state.

The solvent used for film formation from a solution is preferably a solvent that can dissolve or evenly disperse the electron transport material and/or high molecular binder. The solvent may be a chlorine-based solvent such as chloroform, methylene chloride, 1,2-dichloroethane, 1,1,2-trichloroethane, chlorobenzene or o-dichlorobenzene, an ether-based solvent such as tetrahydrofuran or dioxane, an aromatic hydrocarbon-based solvent such as toluene, xylene, mesitylene, ethylbenzene, hexylbenzen, n-hexylbenzene, cyclohexylbenzene, anisole, or 4-methylanisole, an aliphatic hydrocarbon-based solvent such as cyclohexane, methylcyclohexane, n-pentane, n-hexane, n-heptane, n-octane, n-nonane or n-decane, a ketone-based solvent such as acetone, methyl ethyl ketone or cyclohexanone, an ester-based solvent such as ethyl acetate, butyl acetate or ethylcellosolve acetate, a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol, or a derivative thereof, an alcohol-based solvent such as methanol, ethanol, propanol, isopropanol or cyclohexanol, a sulfoxide-based solvent such as dimethyl sulfoxide, or an amide-based solvent such as N-methyl-2-pyrrolidone or N,N-dimethylformamide. These solvents may be used alone or in combinations of two or more.

The film formation from a solution or molten state may be accomplished by a coating method such as spin coating, casting, microgravure coating, gravure coating, bar coating, roll coating, wire bar coating, dip coating, spray coating, screen printing, flexographic printing, offset printing, ink jet printing, capillary coating or nozzle coating.

The optimum value for the film thickness of the electron transport layer will differ depending on the material used, and it may be selected so that the driving voltage and luminous efficiency are suitable values, but the thickness must be sufficient to avoid generation of pinholes, while an excessive thickness is not preferred as it may increase the driving voltage of the device. The film thickness of the electron transport layer is therefore usually 1 nm-1 μm, preferably 2-500 nm and more preferably 5-200 nm.

The hole injection layer and electron injection layer, of the charge transport layers formed adjacent to the electrodes, have the function of improving the charge injection efficiency from the electrodes, and have an effect of lowering the driving voltage of the light emitting device.

In order to increase adhesiveness with and improve charge injection from the electrodes, there may be provided adjacent to the electrodes a charge injection layer or insulating layer (normally with a mean film thickness of 0.5-4.0 nm, same hereunder), while a thin buffer layer may be inserted at the interface with the charge transport layer or luminescent layer to improve the interfacial adhesiveness and prevent intermixture.

The order and number of the laminated layers and the thickness of each layer may be modified in consideration of the desired luminous efficiency and device life.

According to the invention, light emitting devices provided with charge injection layers include light emitting devices provided with a charge injection layer adjacent to the cathode and light emitting devices provided with a charge injection layer adjacent to the anode. Examples of such light emitting device structures include the following structures e) to p).

e) Anode/charge injection layer/luminescent layer/cathode
f) Anode/luminescent layer/charge injection layer/cathode
g) Anode/charge injection layer/luminescent layer/charge injection layer/cathode
h) Anode/charge injection layer/hole transport layer/luminescent layer/cathode
i) Anode/hole transport layer/luminescent layer/charge injection layer/cathode
j) Anode/charge injection layer/hole transport layer/luminescent layer/charge injection layer/cathode
k) Anode/charge injection layer/luminescent layer/electron transport layer/cathode
l) Anode/luminescent layer/electron transport layer/charge injection layer/cathode
m) Anode/charge injection layer/luminescent layer/electron transport layer/charge injection layer/cathode
n) Anode/charge injection layer/hole transport layer/luminescent layer/electron transport layer/cathode
o) Anode/hole transport layer/luminescent layer/electron transport layer/charge injection layer/cathode
p) Anode/charge injection layer/hole transport layer/luminescent layer/electron transport layer/charge injection layer/cathode In each of these structures, an interlayer may be provided between the luminescent layer and anode, adjacent to the luminescent layer. In this case, the interlayer may even serve as the hole injection layer and/or the hole transport layer.

The charge injection layer may be a layer comprising a conductive polymer, a layer provided between the anode and hole transport layer which comprises a material having an ionization potential between that of the anode material and the hole transport material in the hole transport layer, or a layer provided between the cathode and electron transport layer which comprises a material having an electron affinity between that of the cathode material and the electron transport material in the electron transport layer.

When the charge injection layer is a layer comprising a conductive polymer, the electric conductivity of the conductive polymer is preferably $1\times10^{-5}$-$1\times10^{3}$ S/cm, and in order to reduce the leak current between luminescent picture devices, it is more preferably $1\times10^{-5}$-$1\times10^{2}$ S/cm and even more preferably $1\times10^{-5}$-$1\times10^{1}$ S/cm. In order for the electric conductivity of the conductive polymer to be within this range, the conductive polymer will usually be moderately doped with an ion.

The type of ion used for doping may be an anion for the hole injection layer or a cation for the electron injection layer. Examples of anions include polystyrenesulfonate ion, alkylbenzenesulfonate ion and camphorsulfonate ion, and examples of cations include lithium ion, sodium ion, potassium ion and tetrabutylammonium ion.

The material used for the charge injection layer may be selected in consideration of the relationship between the electrode and the material in the adjacent layer, and examples include conductive polymers, such as polyaniline and its derivatives, polythiophene and its derivatives, polypyrrole and its derivatives, polyphenylenevinylene and its derivatives, polythienylenevinylene and its derivatives, polyquinoline and its derivatives and polyquinoxaline and its derivatives, polymers comprising an aromatic amine structure on the main chain or a side chain, or metal phthalocyanines (copper phthalocyanine or the like), and carbon.

The material of the insulating layer may be a metal fluoride, metal oxide, organic insulating material, or the like. The light emitting device provided with the insulating layer may be a light emitting device with the insulating layer adjacent to the cathode or a light emitting device with the insulating layer adjacent to the anode.

Examples of such light emitting device structures include the following structures q) to ab).
q) Anode/insulating layer/luminescent layer/cathode
r) Anode/luminescent layer/insulating layer/cathode
s) Anode/insulating layer/luminescent layer/insulating layer/cathode
t) Anode/insulating layer/hole transport layer/luminescent layer/cathode
u) Anode/hole transport layer/luminescent layer/insulating layer/cathode
v) Anode/insulating layer/hole transport layer/luminescent layer/insulating layer/cathode
w) Anode/insulating layer/luminescent layer/electron transport layer/cathode
x) Anode/luminescent layer/electron transport layer/insulating layer/cathode
y) Anode/insulating layer/luminescent layer/electron transport layer/insulating layer/cathode
z) Anode/insulating layer/hole transport layer/luminescent layer/electron transport layer/cathode
aa) Anode/hole transport layer/luminescent layer/electron transport layer/insulating layer/cathode
ab) Anode/insulating layer/hole transport layer/luminescent layer/electron transport layer/insulating layer/cathode In each of these structures, an interlayer may be provided between the luminescent layer and anode, adjacent to the luminescent layer. In this case, the interlayer may even serve as the hole injection layer and/or the hole transport layer.

Structures employing interlayers in structures a) to ab) preferably have, as an interlayer provided between the anode and luminescent layer, a material with ionization potential, between the anode or the hole injection layer or hole transport layer, and the polymer compound composing the luminescent layer.

The material used in the interlayer may be a polyvinylcarbazole or a derivative thereof, a polyarylene derivative having an aromatic amine on a side chain or the main chain, or a polymer comprising an aromatic amine such as an arylamine derivative or triphenyldiamine derivative.

When a high molecular weight material is used, the film-forming method for the interlayer may be a method of formation from a solution.

The solvent used for film formation from a solution is preferably one that can dissolve or evenly disperse the material to be used in the interlayer. The solvent may be a chlorine-based solvent such as chloroform, methylene chloride, 1,2-dichloroethane, 1,1,2-trichloroethane, chlorobenzene or o-dichlorobenzene, an ether-based solvent such as tetrahydrofuran or dioxane, an aromatic hydrocarbon-based solvent such as toluene, xylene, mesitylene, ethylbenzene, hexylbenzene, n-hexylbenzene, cyclohexylbenzene, anisole or 4-methylanisole, an aliphatic hydrocarbon-based solvent such as cyclohexane, methylcyclohexane, n-pentane, n-hexane, n-heptane, n-octane, n-nonane or n-decane, a ketone-based solvent such as acetone, methyl ethyl ketone or cyclohexanone, an ester-based solvent such as ethyl acetate, butyl acetate or ethylcellosolve acetate, a polyhydric alcohol such as ethylene glycol, ethyleneglycol monobutyl ether, ethyleneglycol monoethyl ether, ethyleneglycol monomethyl ether, dimethoxyethane, propylene glycol, diethoxymethane, triethyleneglycol monoethyl ether, glycerin or 1,2-hexanediol, or a derivative thereof, an alcohol-based solvent such as methanol, ethanol, propanol, isopropanol or cyclohexanol, a sulfoxide-based solvent such as dimethyl sulfoxide, or an amide-based solvent such as N-methyl-2-pyrrolidone or N,N-dimethylformamide. These solvents may be used alone or in combinations of two or more.

The film formation from a solution may be accomplished by a coating method such as spin coating, casting, microgravure coating, gravure coating, bar coating, roll coating, wire bar coating, dip coating, spray coating, screen printing, flexographic printing, offset printing, ink jet printing, capillary coating or nozzle coating.

The optimum value for the film thickness of the interlayer will differ depending on the material used, and it may be selected as the optimum value for driving voltage and luminous efficiency, but for most cases it will be 1 nm-1 μm, preferably 2-500 nm and more preferably 5-200 nm.

When an interlayer is provided adjacent to the luminescent layer, and especially when both layers are formed by a coating method, the materials of the two layers sometimes become mixed, having undesirable effects on the device characteristics. When the luminescent layer is formed by a coating method after the interlayer has been formed by coating, mixing between the materials of the two layers can be reduced by a method of forming the interlayer by coating and heating the interlayer to insolubilize it to the organic solvent used to form the luminescent layer, and then subsequently forming the luminescent layer. The heating temperature will normally be 150-300° C. The heating time will usually be 1 minute-1 hour. In this case, the heating may be followed by rinsing the interlayer with the solvent used to form the luminescent layer, before forming the luminescent layer, in order to remove the components that have not been insolubilized to the solvent by heating. Such rinsing may be omitted if the insolubilization by heating has been sufficient. In order to achieve sufficient insolubilization by heating, it is preferred to use a compound having a polymerizable group in the molecule, as the high molecular weight compound to be used in the interlayer. The number of polymerizable groups is preferably at least 5% of the number of constitutional units in the molecule.

The substrate for a light emitting device of the invention need only be one that does not undergo alteration during formation of the electrodes and formation of the organic material layers, and it may be composed of a material such as glass, plastic, a polymer film or silicon. In the case of an opaque substrate, the opposite electrode is preferably transparent or semi-transparent.

Either or both the anode and cathode in a light emitting device of the invention will usually be transparent or semi-transparent, but preferably the anode is transparent or semi-transparent.

The material for the anode may be a conductive metal oxide film, semi-transparent metal thin-film or the like, and specifically a film formed using a conductive compound such as indium oxide, zinc oxide, tin oxide or their complexes such as indium tin oxide (ITO) and indium zinc oxide, or alternatively NESA and the like, or gold, platinum, silver or copper, among which ITO, indium zinc oxide and tin oxide are preferred. The forming method may be vacuum vapor deposition, sputtering, ion plating, plating or the like. The anode used may be an organic transparent conductive film made of polyaniline or its derivative or polythiophene or its derivative. The anode may even consist of two or more built-up structures.

The film thickness of the anode may be selected in consideration of light permeability and electric conductivity, and for example, it may be 10 nm-10 µm, preferably 20 nm-1 µm and more preferably 50-500 nm.

In order to facilitate charge injection, there may be provided on the anode a layer composed of a phthalocyanine derivative, conductive polymer, carbon or the like, or an insulating layer composed of a metal oxide, metal fluoride, organic insulating material or the like.

The material for the cathode is preferably one with a low work function, e.g. a metal such as lithium, sodium, potassium, rubidium, cesium, beryllium, magnesium, calcium, strontium, barium, aluminum, scandium, vanadium, zinc, yttrium, indium, cerium, samarium, europium, terbium or ytterbium, or an alloy of two or more of these metals, or an alloy of one or more of these metals with one or more of gold, silver, platinum, copper, manganese, titanium, cobalt, nickel, tungsten or tin, or graphite or a graphite interlaminar compound. Examples of alloys include magnesium-silver alloys, magnesium-indium alloys, magnesium-aluminum alloys, indium-silver alloys, lithium-aluminum alloys, lithium-magnesium alloys, lithium-indium alloys and calcium-aluminum alloys. The cathode may also consist of two or more built-up structures.

The film thickness of the cathode may be modified in consideration of electric conductivity and durability, and it will usually be 10 nm-10 µm, preferably 20 nm-1 µm and more preferably 50-500 nm.

The method used to form the cathode may be vacuum vapor deposition, sputtering, or a laminating method involving thermocompression bonding of a metal thin-film. Also, between the cathode and organic layer (that is, any layer comprising a polymer compound of the invention) there may be provided a layer composed of a conductive polymer, or a layer with a mean film thickness of no greater than 2 nm composed of a metal oxide, metal fluoride or organic insulating material, and a protective layer for protection of the light emitting device may also be placed after formation of the cathode. For prolonged stable use of the light emitting device, a protective layer and/or protective cover is preferably situated to protect the device from the external environment.

Such a protective layer may be a high molecular weight compound, metal oxide, metal fluoride or metal boride. The protective cover may be a metal sheet, glass plate, or a plastic sheet that has been subjected to low-permeability treatment on the surface, and the protective cover may be hermetically attached to the device board with a thermosetting resin or photocuring resin. A spacer may be used to maintain spacing, thus helping to prevent damage to the device. By filling an inert gas such as nitrogen or argon into the spacing, it is possible to prevent oxidation of the cathode, and setting a desiccant such as barium oxide in the space will help to prevent damage to the device by moisture adsorbed in the production steps or trace moisture infiltrating through the cured resin. It is preferred to employ one or more of these strategies.

FIG. 1 is a schematic cross-sectional view of an embodiment of the light emitting device of the invention (the light emitting device having the structure p)). The light emitting device 100 shown in FIG. 1 comprises a substrate 10, and comprises an anode 11, a charge injection layer 12, a hole transport layer 13, a luminescent layer 14, an electron transport layer 15, a charge injection layer 16 and a cathode 17 formed on the substrate 10. The anode 11 is provided in contact with the substrate 10. The charge injection layer 12, the hole transport layer 13, the luminescent layer 14, the electron transport layer 15, the charge injection layer 16 and the cathode 17 are laminated onto the side of the anode 11 opposite the substrate 10, in that order.

Figure 2:
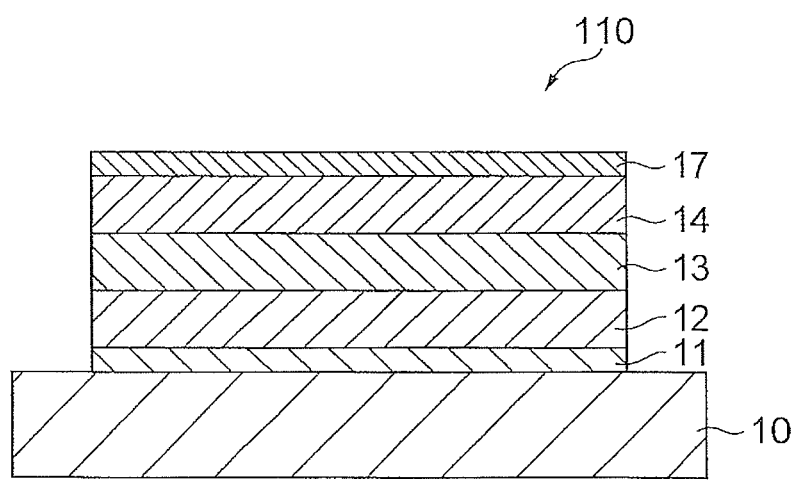
FIG. 2 is a schematic cross-sectional view of other embodiment of the light emitting device of the invention.

FIG. 2 is a schematic cross-sectional view of other embodiment of the light emitting device of the invention (the light emitting device having the structure h)). The light emitting device 110 shown in FIG. 2 comprises a substrate 10, and comprises an anode 11, a charge injection layer 12, a hole transport layer 13, a luminescent layer 14 and a cathode 17 formed on the substrate 10. The anode 11 is provided in contact with the substrate 10. The charge injection layer 12, the hole transport layer 13, the luminescent layer 14 and the cathode 17 are laminated onto the side of the anode 11 opposite the substrate 10, in that order.

The light emitting device of the invention is useful as a planar light source, segment display device, dot matrix display device or liquid crystal display apparatus backlight.

A planar anode and cathode may be stacked together in order to obtain planar luminescence using the light emitting device of the invention. Luminescence in a pattern can be obtained by a method in which a mask with a patterned window is set on the front side of the planar light emitting device, a method in which layers for non-luminous sections are formed extremely thin to render them essentially non-luminous, and a method in which an anode or cathode, or both electrodes, are formed in a pattern shape. By forming a pattern by any of these methods, and configuring some electrodes to be independently ON/OFF switchable, it is possible to obtain a segment type display device allowing display of numerals, letters or simple symbols. For a dot matrix display device, the anode and cathode may both be formed as stripes and configured in a crossing manner. A partial color display or multicolor display can also be formed by a method in which different types of polymer fluorescent materials with different luminescent colors are coated or a method using a color filter or fluorescence conversion filter. The dot matrix display device may be passively driven or actively driven in combination with a TFT or the like. These display devices may be used as display devices for computers, televisions, portable terminals, cellular phones, car navigation systems, video camera viewfinders, and the like.

The planar light emitting device is a selfluminous thin type, and can therefore also be suitably used as a backlight planar light source for a liquid crystal display apparatus, or a planar illumination light source. Moreover, using a flexible substrate will allow its use as a curved light source or display device.

Figure 3:
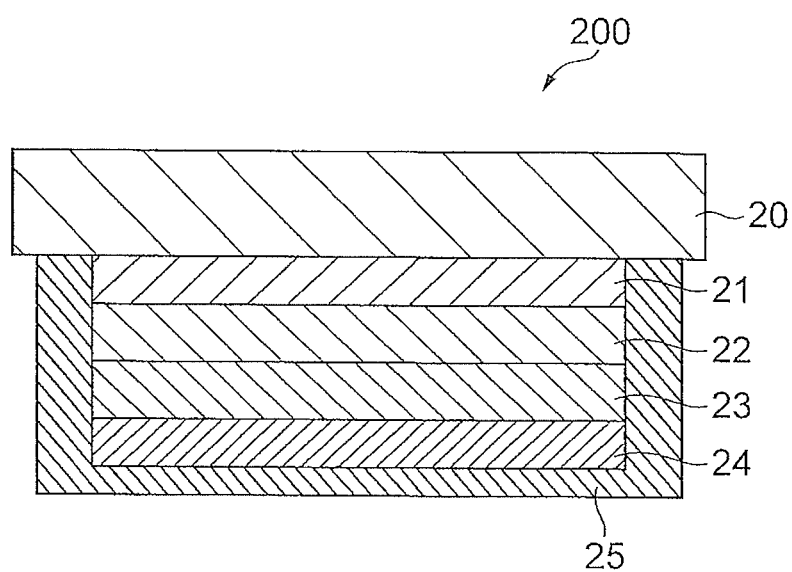
FIG. 3 is a schematic cross-sectional view of an embodiment of the planar light source of the invention.

FIG. 3 is a schematic cross-sectional view of an embodiment of the planar light source of the invention. The planar light source 200 shown in FIG. 3 comprises a substrate 20, an anode 21, a charge injection layer 22, a luminescent layer 23, a cathode 24 and a protective layer 25. The anode 21 is provided in contact with the substrate 20. The charge injection layer 22, the luminescent layer 23 and the cathode 24 are laminated onto the side of the anode 21 opposite the substrate 20, in that order. In addition, the protective layer 25 is formed so as to cover the anode 21, the charge injection layer 22, the luminescent layer 23 and the cathode 24 that are formed on the substrate 20, and to contact with substrate 20 at the end part. Luminescent layer 23 comprises the above polymer compound.

In addition, the planer light source 200 shown in FIG. 3 further comprises luminescent layers other than the luminescent layer 23 and is capable of becoming a color display device by using red luminescence material, blue luminescence material, and green luminescence material in each luminescent layer and controlling the drive of each luminescent layer.

EXAMPLES

The present invention will now be explained in greater detail by examples.

(Method for Determining the Number-Average Molecular Weights and Weight-Average Molecular Weights)

Throughout the examples, the polystyrene equivalent number-average molecular weights and polystyrene equivalent weight-average molecular weights were determined by gel permeation chromatography (GPC, trade name: LC-10Avp by Shimadzu Corp.). The polymer compound to be measured was dissolved in tetrahydrofuran to a concentration of about 0.5 wt % and 30 µL thereof was injected into the GPC. The GPC mobile phase was tetrahydrofuran, and the flow rate was 0.6 mL/min. The columns used were two TSKgel SuperHM-H (Tosoh Corp.) columns and one TSKgel SuperH2000 (Tosoh Corp.) column, connected in series. The detector used was a differential refractometer (trade name: RID-10A, product of Shimadzu Corp.).

Synthesis Example 1

Synthesis of Compound 1

After nitrogen-exchange of a 5 L three-necked flask, 1-bromo-3-n-hexylbenzene (226 g) was measured out and dissolved in 2.5 L of dehydrated tetrahydrofuran. The obtained solution was cooled to below −75° C., a 2.5 M n-butyllithium/n-hexane solution (358 ml) was added dropwise and the mixture was stirred for 5 hours while keeping the temperature below −75° C. A solution of 150 g of 2-methoxycarbonyl-4,4'-dibromobiphenyl dissolved in 400 ml of dehydrated tetrahydrofuran was added dropwise to the obtained solution while keeping the temperature below −70° C. The compound 2-methoxycarbonyl-4,4'-dibromobiphenyl was synthesized by the method described in Journal of the American Chemical Society (1956), 78, 3196-3198.

The temperature of the obtained solution was slowly raised to room temperature, and it was stirred overnight. The reaction mixture was then stirred at 0° C. while adding 150 ml of water dropwise. After distilling off the solvent, 200 ml of water was added to the residue and extraction was performed once with 1 L of hexane and twice with 100 ml of hexane. The organic layers were combined and rinsed with 200 ml of brine, the aqueous layer was extracted again with 100 ml of hexane, and the obtained organic layer was dried over magnesium sulfate. The solvent was distilled off to obtain 264 g of a crude product of compound 1 represented by the following formula. This was used in the following step without purification.

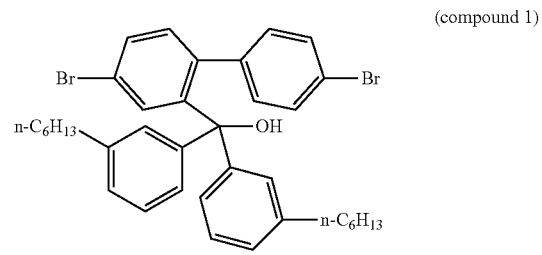

(compound 1)

Synthesis Example 2

Synthesis of Compound 2

After measuring out 264 g of compound 1 synthesized in Synthesis Example 1 into a three-necked flask, it was dissolved in 900 ml of dichloromethane and exchanged with nitrogen. The obtained solution was cooled to below 0° C., and 245 ml of a boron trifluoride/diethyl ether complex was added dropwise while keeping the temperature below 5° C. The temperature was slowly raised to room temperature, and the solution was stirred overnight. The reaction mixture was poured into 2 L of ice water while stirring, and stirring was continued for 30 minutes. The obtained solution was separated and the aqueous layer was extracted with 100 ml of dichloromethane. The organic layers were combined, and 1 L of a 10 wt % potassium phosphate aqueous solution was added for separation, after which the organic layer was washed twice with 1 L of water. After drying the organic layer over magnesium sulfate, the solvent was distilled off and the obtained oil was dissolved in 200 ml of toluene, and then passed through a silica gel-covered glass filter for filtering. The solvent was distilled off, and then 500 ml of methanol was added and the mixture was vigorously stirred. The obtained crystals were filtered and washed with methanol. Recrystallization was performed with a hexane/butyl acetate mixed solvent to obtain 121 g of compound 2 represented by the following formula.

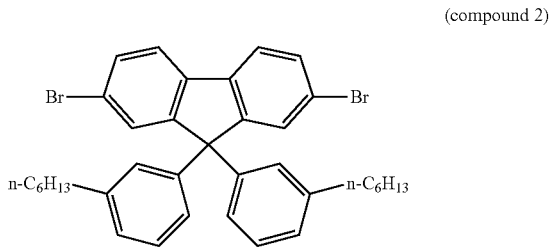

(compound 2)

$^1$H-NMR (300 MH$_z$, CDCl$_3$); δ0.86 (6H, t), 1.26 (12H, m), 1.52 (4H, m), 2.51 (4H, t), 6.87 (2H, d), 7.00 (2H, s), 7.04 (2H, d), 7.12 (2H, t), 7.46 (2H, dd), 7.48 (2H, d), 7.55 (2H, d) ppm.

Synthesis Example 3

Synthesis of Compound 3

After measuring out 50 g of compound 2 into a three-necked flask, it was exchanged with nitrogen. Next, 500 ml of dehydrated tetrahydrofuran was added and the mixture was cooled to below −70° C. The obtained solution was cooled to below −70° C. while adding dropwise 68 ml of a 2.5 M n-butyl-lithium/n-hexane solution. After the dropwise addition, the mixture was stirred for 4 hours while maintaining that temperature. After then adding 44 ml of 2-isopropyloxy-4,4,5,5-tetramethyl-1,3,2-dioxaborolane, the mixture was slowly raised to room temperature and stirred overnight. The reaction mixture was cooled to −30° C., and then 78 ml of a 2 M hydrochloric acid/diethyl ether solution was added dropwise prior to raising to room temperature. After distilling off the solvent, 400 ml of toluene was added for dissolution, the mixture was passed through a silica gel-covered glass filter for filtration, and the solvent of the obtained solution was distilled off to obtain 50 g of a crude product. Recrystallization was performed from a toluene/acetonitrile solvent under a nitrogen atmosphere, to obtain 34 g of compound 3 represented by the following formula.

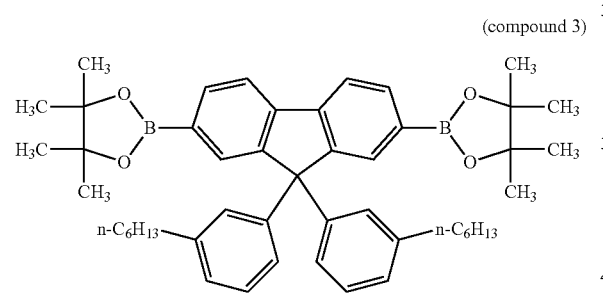

(compound 3)

$^1$H-NMR (300 MH$_z$, CDCl$_3$); δ0.86 (6H, t), 1.26-1.29 (12H, m), 1.31 (24H, s), 1.52-1.53 (4H, m), 2.50 (4H, t), 6.92 (2H, d), 7.00 (2H, d), 7.08 (2H, t), 7.13 (2H, s), 7.77 (2H, d), 7.81-7.82 (4H, m) ppm.

Comparative Example 1

Synthesis of Polymer Compound 1

After combining compound 4 (3.1502 g, 5.94 mmol) represented by the following formula:

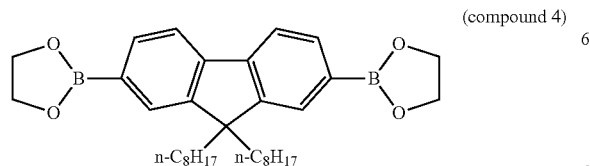

(compound 4)

compound 5 (2.9615 g, 5.40 mmol) represented by the following formula:

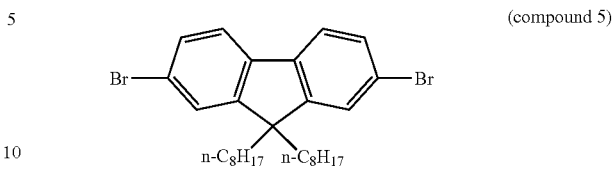

(compound 5)

compound 6 (0.4431 g, 0.60 mmol) represented by the following formula:

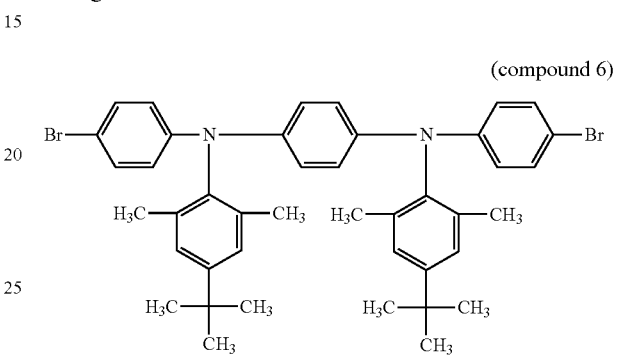

(compound 6)

dichlorobis(triphenylphosphine)palladium (4.3 mg), trioctyl-methylammonium chloride (trade name: Aliquat 336 (product of Aldrich Co.), 0.79 g) and toluene (60 ml) under an inert atmosphere, the mixture was heated to 105° C.

To the reaction mixture there was added dropwise a 2 M Na$_2$CO$_3$ aqueous solution (16.3 ml), and it was circulated for 3 hours and 10 minutes. After the reaction, phenylboric acid (73 mg), dichlorobis(triphenylphosphine)palladium (4.1 mg) and toluene (60 mL) were added and circulation was continued for 15.5 hours. Next, a sodium N,N-diethyldithiocarbamate aqueous solution was added and the mixture was stirred at 80° C. for 2 hours. After cooling, the organic layer was washed twice with water (78 ml), twice with a 3 wt % acetic acid aqueous solution (78 ml) and twice with water (78 ml), and the obtained solution was added dropwise to methanol (1500 mL) and filtered to obtain a precipitate.

The precipitate was dissolved in toluene (190 mL) and passed through an alumina column and a silica gel column in that order for purification. The obtained solution was added dropwise to methanol (930 ml) and stirred, and then the resulting precipitate was filtered and dried to obtain 3.61 g of polymer compound 1. The polystyrene equivalent number-average molecular weight of polymer compound 1 was 1.0×10$^5$, and the polystyrene equivalent weight-average molecular weight was 2.3×10$^5$.

Polymer compound 1 is a random copolymer comprising a constitutional unit represented by the following formula (1a):

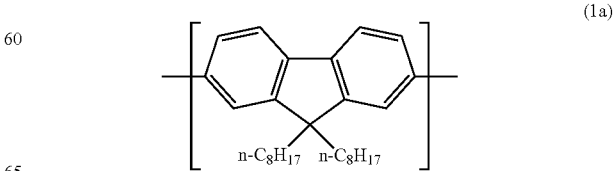

(1a)

and a constitutional unit represented by the following formula (1b):

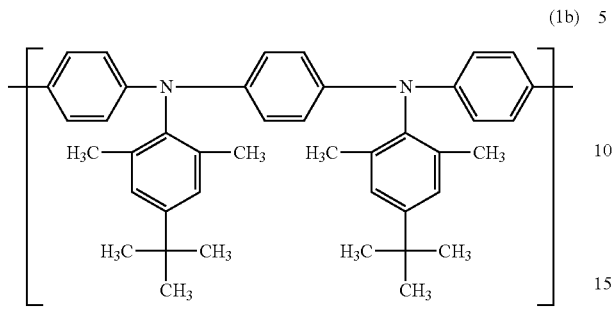

(1b)

in a molar ratio of 95:5, as the theoretical value calculated from the charged starting materials.

Example 1

Synthesis of Polymer Compound 2

After combining compound 3 (1.4507 g, 1.96 mmol), compound 5 (0.9871 g, 1.80 mmol), compound 6 (0.1478 g, 0.20 mmol), dichlorobis(triphenylphosphine)palladium (1.40 mg) and toluene (50 ml) under an inert atmosphere, the mixture was heated to 105° C.

A 20 wt % tetraethylammonium hydroxide aqueous solution (7 ml) was added dropwise to the reaction mixture, which was then circulated for 2 hours and 20 minutes. After the reaction, phenylboric acid (26 mg) and dichlorobis(triphenylphosphine)palladium (1.20 mg) were added and circulation was continued for 17 hours. Next, a sodium diethyldithocarbaminate aqueous solution was added and the mixture was stirred at 80° C. for 2 hours. After cooling, washing was performed twice with water (26 ml), twice with a 3 wt % acetic acid aqueous solution (26 ml) and twice with water (26 ml), and the obtained solution was added dropwise to methanol (311 mL) and filtered to obtain a precipitate.

The precipitate was dissolved in toluene (63 mL) and passed through an alumina column and a silica gel column in that order for purification. The obtained solution was added dropwise to methanol (311 ml) and stirred, and then the resulting precipitate was filtered and dried to obtain 1.49 g of polymer compound 2. The polystyrene equivalent number-average molecular weight of polymer compound 2 was $1.1 \times 10^5$, and the polystyrene equivalent weight-average molecular weight was $2.9 \times 10^5$.

Polymer compound 2 is a random copolymer comprising a constitutional unit represented by the following formula (2a):

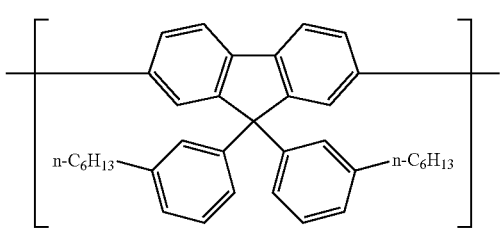

(2a)

a constitutional unit represented by the following formula (2b):

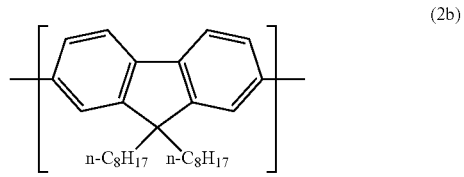

(2b)

and a constitutional unit represented by the following formula (2c):

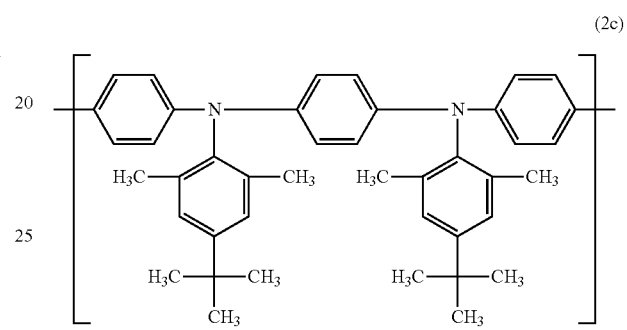

(2c)

in a molar ratio of 50:45:5, as the theoretical value calculated from the charged starting materials.

Synthesis Example 4

Synthesis of Polymer Compound 3

After combining compound 7 (1.983 g, 3.98 mmol) represented by the following formula:

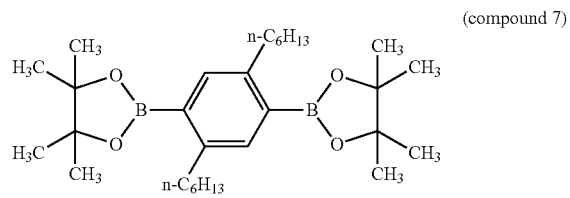

(compound 7)

compound 8 (1.561 g, 3.40 mmol) represented by the following formula:

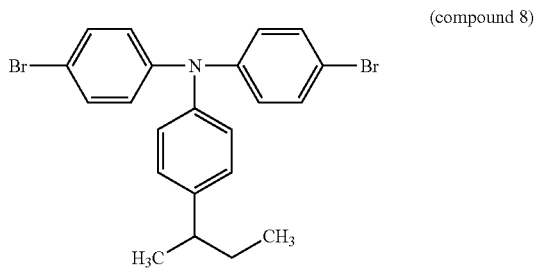 [SMILES: CCC(C)c1ccc(N(c2ccc(Br)cc2)c2ccc(Br)cc2)cc1]

(compound 8)

compound 9 (0.258 g, 0.60 mmol) represented by the following formula:

(compound 9)

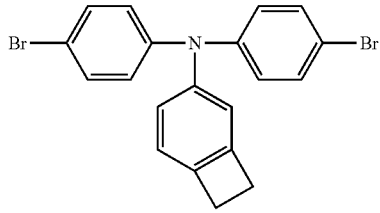

dichlorobis(triphenylphosphine)palladium (2.8 mg) and toluene (44 ml) under an inert atmosphere, the mixture was heated to 105° C. A 20 wt % tetraethylammonium hydroxide aqueous solution (13.3 ml) was added dropwise to the reaction mixture, which was then circulated for 12 hours.

After the reaction, phenylboric acid (49 mg), dichlorobis(triphenylphosphine)palladium (2.8 mg) and toluene (44 mL) were added and circulation was continued for 17 hours. Next, a sodium diethyldithiocarbaminate aqueous solution was added and the mixture was stirred at 80° C. for 2 hours. After cooling, washing was performed twice with water (52 ml), twice with a 3 wt % acetic acid aqueous solution (52 ml) and twice with water (52 ml), and the obtained solution was added dropwise to methanol (620 mL) and filtered to obtain a precipitate.

The precipitate was dissolved in toluene (124 mL) and passed through an alumina column and a silica gel column in that order for purification. The obtained solution was added dropwise to methanol (620 ml) and stirred, and then the resulting precipitate was filtered and dried to obtain 1.94 g of polymer compound 3. The polystyrene equivalent number-average molecular weight of polymer compound 3 was $4.4 \times 10^4$, and the polystyrene equivalent weight-average molecular weight was $1.1 \times 10^5$.

Polymer compound 3 is a random copolymer comprising a constitutional unit represented by the following formula (3a):

(3a)

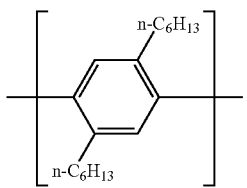

a constitutional unit represented by the following formula (3b):

(3b)

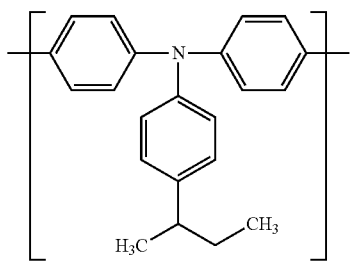

and a constitutional unit represented by the following formula (3c):

(3c)

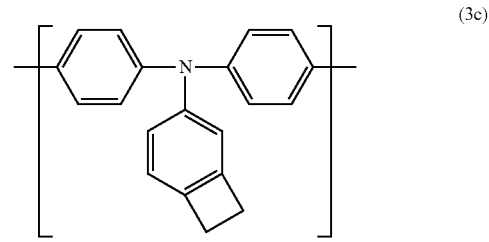

in a molar ratio of 49.9:42.6:7.5, as the theoretical value calculated from the charged starting materials.

Comparative Example 2

Fabrication and Evaluation of Light Emitting Device 1

Formation of Hole Injection Layer

A composition for formation of a hole injection layer was coated onto a glass panel on which an ITO anode had been formed, obtaining a coating film with a film thickness of 60 nm by spin coating. The coating film-formed substrate was heated at 200° C. for 10 minutes, and after insolubilizing the coating film, it was allowed to naturally cool to room temperature to obtain a hole injection layer.

The composition used for formation of the hole injection layer was a PEDOT:PSS aqueous solution (poly(3,4-ethylenedioxythiophene):polystyrenesulfonic acid, product name: Baytron), available from Starck-V Tech.

Formation of Hole Transport Layer

Polymer compound 3 and xylene were combined to a polymer compound 3 concentration of 0.7 wt %, to obtain a composition for formation of a hole transport layer. The hole injection layer was coated with the composition for formation of a hole transport layer by spin coating, to obtain a coating film with a film thickness of 20 nm. The coating film-formed substrate was heated at 180° C. for 60 minutes, and after insolubilizing the coating film, it was allowed to naturally cool to room temperature to obtain a hole transport layer.

Formation of Luminescent Layer

Polymer compound 1 and xylene were combined to a polymer compound 1 concentration of 1.3 wt %, to obtain a composition for formation of a luminescent layer. The hole transport layer of the obtained substrate, which comprised an anode, hole injection layer and hole transport layer, was coated with the composition for formation of a luminescent layer by spin coating to obtain a coating film with a film thickness of 60 nm. The coating film-formed substrate was heated at 130° C. for 20 minutes, and after evaporating off the solvent, it was allowed to naturally cool to room temperature to obtain a luminescent layer.

Formation of Cathode

The luminescent layer of the obtained substrate, which comprised an anode, hole injection layer, hole transport layer and luminescent layer, was subjected to vacuum vapor deposition to continuously form a barium layer with a film thickness of 5 nm and then an aluminum layer with a film thickness of 80 nm, thereby forming a cathode.

Sealing

The substrate having these laminated layers was removed from the vacuum vapor deposition apparatus and was sealed with sealing glass and a two-pack mixture epoxy resin under a nitrogen atmosphere, to obtain light emitting device 1.

Evaluation

Blue electroluminescence (EL) was observed when a voltage was applied to the light emitting device 1. The maximum current efficiency of the light emitting device 1 was 7.3 cd/A, and the maximum external quantum yield was 6.8%. Also, the luminance lifetime, which is the time from initial luminance of 3400 cd/m$^2$ to luminance half-life was 1.7 hours.

Example 2

Fabrication and Evaluation of Light Emitting Device 2

Fabrication of Light Emitting Device 2

Light emitting device 2 was fabricated in the same manner as Comparative Example 2, except that polymer compound 2 was used instead of polymer compound 1 in Comparative Example 2.

Evaluation

Blue electroluminescence (EL) was observed when a voltage was applied to the light emitting device 2. The maximum current efficiency of the light emitting device 2 was 9.1 cd/A, and the maximum external quantum yield was 7.8%. A voltage was applied for the same number of emitted photons as Comparative Example 2, and the luminance lifetime, as the time from initial luminance of 5800 cd/m$^2$ to luminance half-life was 2.6 hours.

Synthesis Example 5

Synthesis of Polymer Compound 4

After combining compound 4 (3.863 g, 7.283 mmol), compound 8 (3.177 g, 6.919 mmol), compound 9 (0.1563 g, 0.364 mmol), trioctylmethylammonium chloride (trade name: Aliquat 336 (product of Aldrich Co.), 3.1 ml), dichlorobis(triphenylphosphine)palladium (4.9 mg) and toluene (50 ml) under an inert atmosphere, the mixture was heated to 105° C.

A 2.0 M Na$_2$CO$_3$ aqueous solution (14 ml) was added dropwise to the reaction mixture, which was then circulated for 16.5 hours. After the reaction, phenylboric acid (0.5 g) was added and circulation was continued for 7 hours. The organic layer obtained by removing the aqueous layer was added with 50 ml of water, stirred, allowed to stand still, and the aqueous layer that became separated was removed. The obtained organic layer was added with a sodium N,N-diethyldithiocarbamate aqueous solution (0.75 g) and water (50 ml), and stirred at 85° C. for 16 hours. The obtained reaction mixture was allowed to stand still, the aqueous layer that became separated was removed, the remaining organic layer was washed three times with 100 ml of water, and the obtained solvent was allowed to pass through a silica gel column and a basic alumina column. The obtained solution was added dropwise to methanol and stirred, and then the resulting precipitate was filtered and dried to obtain 4.2 g of polymer compound 4. The polystyrene equivalent number-average molecular weight of polymer compound 4 was 4.4×10$^4$, and the polystyrene equivalent weight-average molecular weight was 1.2×10$^5$.

Polymer compound 4 is a random copolymer comprising a constitutional unit represented by the following formula (4a):

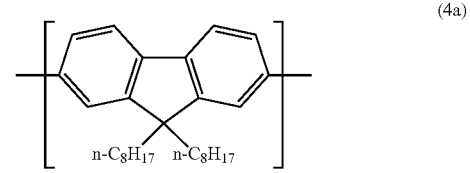

a constitutional unit represented by the following formula (4b):

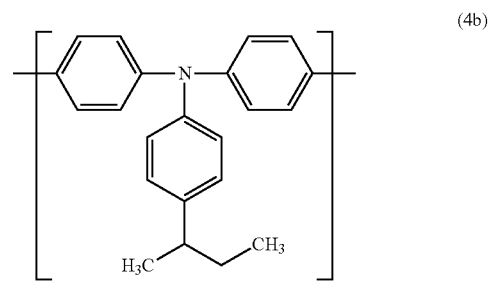

and a constitutional unit represented by the following formula (4c):

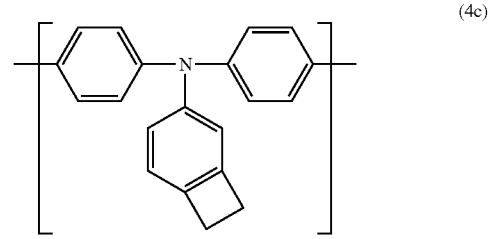

in a molar ratio of 50.0:42.5:7.5, as the theoretical value calculated from the charged starting materials.

Comparative Example 3

Fabrication and Evaluation of Light Emitting Device 3

Fabrication of Light Emitting Device 3

Light emitting device 3 was fabricated in the same manner as Comparative Example 2, except that polymer compound 4 was used instead of polymer compound 3 in Comparative Example 2.

Evaluation

Blue electroluminescence (EL) was observed when a voltage was applied to the light emitting device 3. The maximum current efficiency of the light emitting device 3 was 7.4 cd/A, and the maximum external quantum yield was 5.2%. Also, the luminance lifetime, which is the time from initial luminance of 4500 cd/m$^2$ to luminance half-life was measured to be 6.6 hours.

Example 3

Fabrication and Evaluation of Light Emitting Device 4

Fabrication of Light Emitting Device 4
Light emitting device 4 was fabricated in the same manner as Comparative Example 2, except that polymer compound 2 was used instead of polymer compound 1 and polymer compound 4 was used instead of polymer compound 3 in Comparative Example 2.
Evaluation
Blue electroluminescence (EL) was observed when a voltage was applied to the light emitting device 4. The maximum current efficiency of the light emitting device 4 was 8.5 cd/A, and the maximum external quantum yield was 5.8%. A voltage was applied for the same number of emitted photons as Comparative Example 3, and the luminance lifetime, as the time from initial luminance of 4600 cd/m$^2$ to luminance half-life was 26.8 hours.

Example 4

Synthesis of Polymer Compound 5

After combining compound 3 (2.1805 g, 2.95 mmol), compound 5 (1.4808 g, 2.70 mmol), compound 10 (0.1420 g, 0.30 mmol) represented by the following formula:

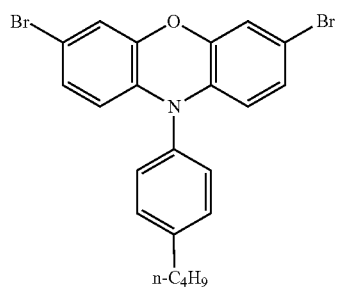

(compound 10)

dichlorobis(triphenylphosphine)palladium (2.1 mg) and toluene (70 ml) under an inert atmosphere, the mixture was heated to 105° C.
A 20 wt % tetraethylammonium hydroxide aqueous solution (10 ml) was added dropwise to the reaction mixture, which was then circulated for 2 hours. After the reaction, phenylboric acid (37 mg) and dichlorobis(triphenylphosphine)palladium (2.1 mg) were added and circulation was continued for 17 hours. Next, a sodium N,N-diethyldithiocarbamate aqueous solution was added and the mixture was stirred at 80° C. for 2 hours. After cooling, washing was performed twice with water (39 ml), twice with a 3 wt % acetic acid aqueous solution (39 ml) and twice with water (39 ml), and the obtained solution was added dropwise to methanol (500 mL) and filtered to obtain a precipitate. The precipitate was dissolved in toluene (94 mL) and passed through an alumina column and a silica gel column in that order for purification. The obtained solution was added dropwise to methanol (325 ml) and stirred, and then the resulting precipitate was filtered and dried to obtain 1.77 g of polymer compound 5. The polystyrene equivalent number-average molecular weight of polymer compound 5 was 1.3×10$^5$, and the polystyrene equivalent weight-average molecular weight was 3.4×10$^5$.

Polymer compound 5 is a random copolymer comprising a constitutional unit represented by the following formula (5a):

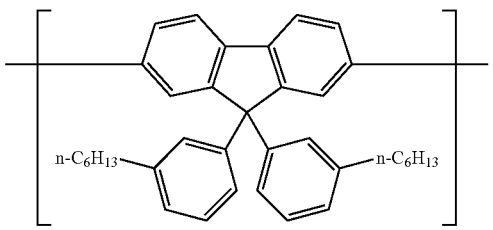

(5a)

a constitutional unit represented by the following formula (5b):

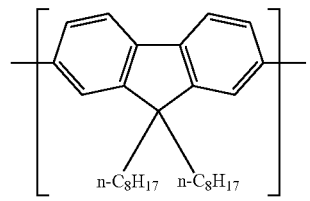

(5b)

and a constitutional unit represented by the following formula (5c):

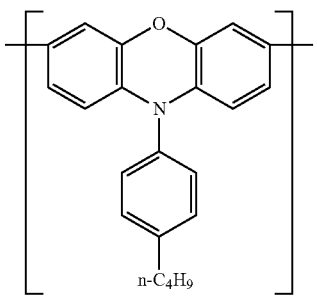

(5c)

in a molar ratio of 50:45:5, as the theoretical value calculated from the charged starting materials.

Example 5

Fabrication and Evaluation of Light Emitting Device 5

Fabrication of Light Emitting Device 5
Light emitting device 5 was fabricated in the same manner as Comparative Example 2, except that polymer compound 5 was used instead of polymer compound 1 and polymer compound 4 was used instead of polymer compound 3 in Comparative Example 2.
Evaluation
Blue electroluminescence (EL) was observed when a voltage was applied to the light emitting device 5. The maximum current efficiency of the light emitting device 5 was 10.8 cd/A, and the maximum external quantum yield was 6.7%.

Also, the luminance lifetime, which is the time from initial luminance of 6040 cd/m² to luminance half-life was measured to be 37.6 hours.

Example 6

Synthesis of Polymer Compound 6

After combining compound 11 (4.3884 g, 5.94 mmol) represented by the following formula:

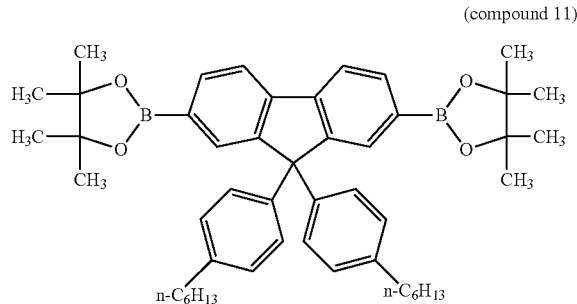
(compound 11)

compound 5 (2.9621 g, 5.40 mmol), compound 6 (0.4430 g, 0.60 mmol), palladium (II) acetate (3.24 mg), tris(o-methoxyphenyl)phosphine (19.3 mg) and toluene (67 ml) under an inert atmosphere, the mixture was heated to 105° C.

A 20 wt % tetraethylammonium hydroxide aqueous solution (20 ml) was added dropwise to the reaction mixture, which was then circulated for 2 hours. After the reaction, phenylboric acid (370 mg) was added and circulation was continued for 2 hours. Next, a sodium diethyldithocarbaminate aqueous solution was added and the mixture was stirred at 65° C. for 2 hours. After cooling, washing was performed twice with water (39 ml), twice with a 3 wt % acetic acid aqueous solution (39 ml) and twice with water (39 ml), and the obtained solution was added dropwise to methanol (500 ml) and filtered to obtain a precipitate.

The precipitate was dissolved in toluene (94 ml) and passed through an alumina column and a silica gel column in that order for purification. The obtained solution was added dropwise to methanol (325 ml) and stirred, and then the resulting precipitate was filtered and dried to obtain 3.49 g of polymer compound 6. The polystyrene equivalent number-average molecular weight of polymer compound 6 was 1.5×10⁵, and the polystyrene equivalent weight-average molecular weight was 3.8×10⁵.

Polymer compound 6 is a random copolymer comprising a constitutional unit represented by the following formula (6a):

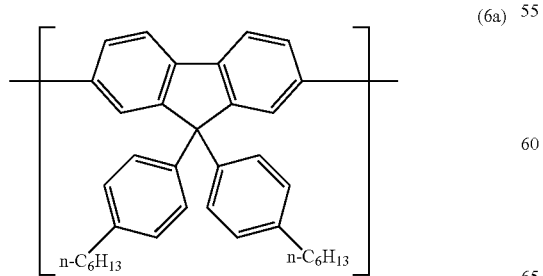
(6a)

a constitutional unit represented by the following formula (6b):

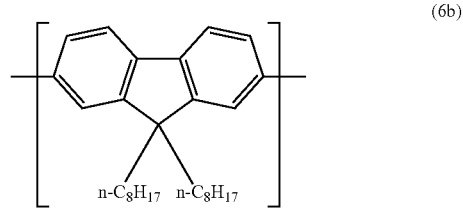
(6b)

and a constitutional unit represented by the following formula (6c):

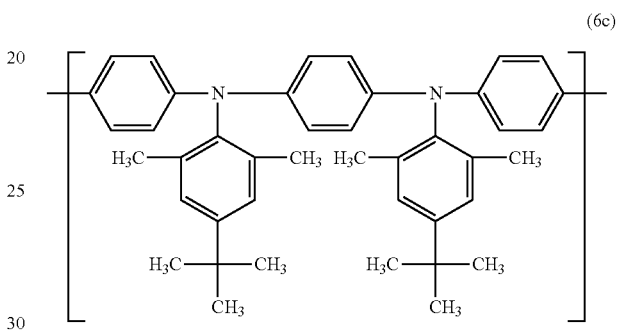
(6c)

in a molar ratio of 50:45:5, as the theoretical value calculated from the charged starting materials.

Comparative Example 4

Fabrication and Evaluation of Light Emitting Device 6

Fabrication of Light Emitting Device 6

Light emitting device 6 was fabricated in the same manner as Comparative Example 2, except that hole transport layer was formed with a film thickness of 50 nm instead of 60 nm and polymer compound 4 was used instead of polymer compound 3 in Comparative Example 2.

Evaluation

Blue electroluminescence (EL) was observed when a voltage was applied to the light emitting device 6. The maximum current efficiency of the light emitting device 6 was 6.5 cd/A, and the maximum external quantum yield was 4.6%. Also, the luminance lifetime, which is the time from initial luminance of 4030 cd/m² to luminance half-life was measured to be 8.8 hours.

Example 7

Fabrication and Evaluation of Light Emitting Device 7

Fabrication of Light Emitting Device 7

Light emitting device 7 was fabricated in the same manner as Comparative Example 2, except that hole transport layer was formed with a film thickness of 50 nm instead of 60 nm, polymer compound 6 was used instead of polymer compound 1 and polymer compound 4 was used instead of polymer compound 3 in Comparative Example 2.

Evaluation

Blue electroluminescence (EL) was observed when a voltage was applied to the light emitting device 7. The maximum current efficiency of the light emitting device 7 was 7.6 cd/A, and the maximum external quantum yield was 5.5%. A voltage was applied for the same number of emitted photons as Comparative Example 4, and the luminance lifetime, as the time from initial luminance of 3955 cd/m² to luminance half-life was 25.4 hours.

Comparative Example 5

Synthesis of Polymer Compound 7

After combining compound 12 (1.9065 g, 2.97 mmol) represented by the following formula:

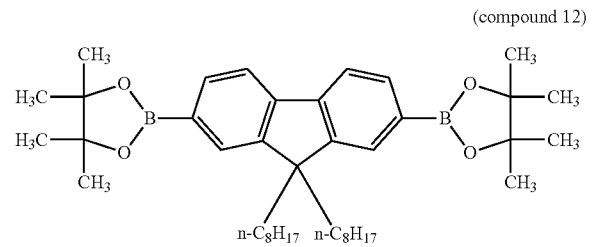
(compound 12)

compound 5 (1.4808 g, 2.70 mmol), compound 10 (0.1420 g, 0.30 mmol), dichlorobis(triphenylphosphine)palladium (2.11 mg) and toluene (71 ml) under an inert atmosphere, the mixture was heated to 105° C.

A 20 wt % tetraethylammonium hydroxide aqueous solution (10 ml) was added dropwise to the reaction mixture, which was then circulated for 3 hours. After the reaction, phenylboric acid (37 mg) and dichlorobis(triphenylphosphine)palladium (2.11 mg) were added and circulation was continued for 17 hours. Next, a sodium diethyldithiocarbaminate aqueous solution was added and the mixture was stirred at 80° C. for 2 hours. After cooling, washing was performed twice with water (39 ml), twice with a 3 wt % acetic acid aqueous solution (39 ml) and twice with water (39 ml), and the obtained solution was added dropwise to methanol (500 ml) and filtered to obtain a precipitate. The precipitate was dissolved in toluene (94 ml) and passed through an alumina column and a silica gel column in that order for purification. The obtained solution was added dropwise to methanol (325 ml) and stirred, and then the resulting precipitate was filtered and dried to obtain 1.77 g of polymer compound 7. The polystyrene equivalent number-average molecular weight of polymer compound 7 was 1.1×10⁵, and the polystyrene equivalent weight-average molecular weight was 3.5×10⁵.

Polymer compound 7 is a random copolymer comprising a constitutional unit represented by the following formula (7a):

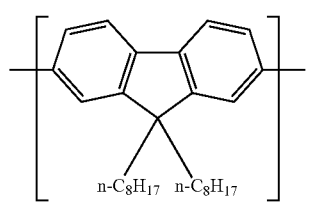
(7a)

and a constitutional unit represented by the following formula (7b):

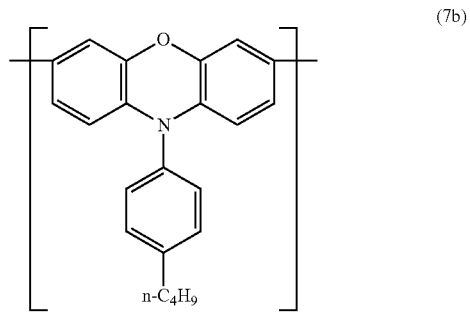
(7b)

in a molar ratio of 95:5, as the theoretical value calculated from the charged starting materials.

Synthesis Example 6

Synthesis of Compound 13

Under the nitrogen atmosphere, 3,5-dibromotoluene (40.79 g, 159.94 mmol) and tetrahydrofuran (200 ml) were added to a 4-necked flask and dissolved. Next, a 1.6 M n-butyllithium/n-hexane solution (100 ml, 159.94 mmol) was slowly added dropwise at −78° C. and stirred at the same temperature for 1 hour. Next, tetrahydrofuran (500 ml) was added at −60° C. and the mixture was obtained. Under the nitrogen atmosphere, this mixture was added to a 2 L 4-necked flask containing iodine (81.19 g, 319.88 mmol) and stirred at −70° C. or less.

Subsequently, after stirring for one hour at 0° C., an aqueous solution of 10% Na₂S₂O₃ (300 ml) was added and stirred. This reaction mixture was extracted with n-hexane (300 ml×2), the obtained organic layer was washed with saturated saline and added with sodium sulfate anhydrous and stirred. The obtained filtrate was subjected to vacuum concentration. Then, by distillation under reduced pressure, the desired chemical compound 13 (33 g, 69% yield constant) was obtained.

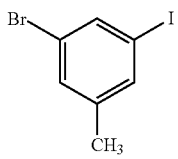
(compound 13)

Synthesis Example 7

Synthesis of Compound 15

Under the Argon atmosphere, a compound 14 (37.75 g, 183.17 mmol) represented by the following formula:

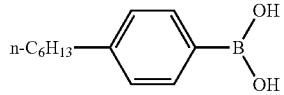
(compound 14)

compound 13 (53.45 g, 180.00 mmol), tetrahydrofuran (1800 ml), palladium [tetrakis(triphenylphosphine)] (10.58 g, 9.16 mmol) and Ag₂CO₃ (101.02 g, 366.34 mmol) was added and stirred for 14 hours at room temperature. Next, the reaction mixture was purified by silica gel column chromatography (developing solvent: hexan) and thus 40.02 g of the desired compound 15 was obtained.

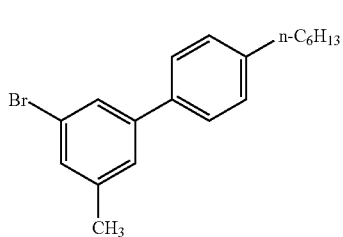

(compound 15)

Synthesis Example 8

Synthesis of Compound 17

Under the nitrogen atmosphere, a compound 15 (27.7 g, 83.57 mmol) and tetrahydrofuran (250 ml) was added to a 3-necked flask, dissolved, and cooled to −78° C. Then, 1.6 M n-butyllithium/n-hexane solution (52.2 ml) was added dropwise at −65° C., and stirred for an hour at the same temperature. Next, a solvent consisting of a compound 16 (14.72 g, 39.78 mmol) is represented by the following formula:

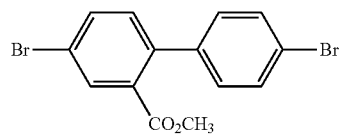

(compound 16)

and tetrahydrofuran (45 ml) was added at −60° C. or less and stirred for 2.5 hours at the same temperature. Next, after stirring for 1 hour at room temperature, the saturated ammonium chloride aqueous solvent is added dropwise and stirred. This reaction mixture was extracted by n-hexane (300 ml×2). The obtained organic layer was washed with saturated saline (300 ml), added with the sodium sulfate anhydrous, stirred, and filtered. The obtained filterate is subjected to vacuum concentration, the solvent is distilled away, and thus the concentrate A was obtained.

Next, under the nitrogen atmosphere, boron trifluoride-ethyl ether complex (BF$_3$.OEt$_2$, 28.2 g, 198.90 mmol) is added to a 3-necked flask, cooled to 0° C., and a solvent consisting of the above concentrate A and dichloromethane (80 ml) is slowly added and stirred for 2.5 hours at room temperature. Next, it is added with water (100 ml) and stirred at 0° C. This reaction mixture was extracted with chloroform (150 ml×2) at room temperature. The obtained organic layer was washed with saturated sodium bicarbonate (100 ml×2) and saturated saline (100 ml), further added with Sodium sulfate anhydrous, stirred and the filtrate obtained by filtering was subjected to vacuum concentration. Afterwards, it is recrystallized with ethyl acetate and methanol, and 12.5 g of the desired compound 17 was obtained.

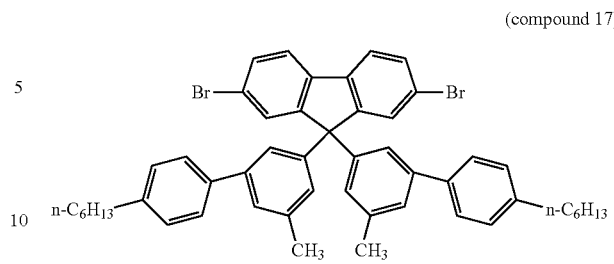

(compound 17)

Synthesis Example 9

Synthesis of Compound 19

Under the nitrogen atmosphere, a compound 17 (7.30 g, 8.86 mmol), compound 18 (5.40 g, 21.25 mmol) represented by the following formula:

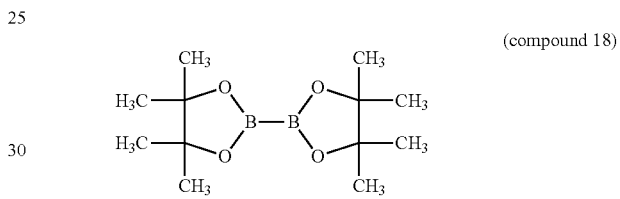

(compound 18)

[1,1′-Bis(diphenylphosphino)ferrocene]dichloropalladium (II)-dichloromethane complex (PdCl$_2$(dppf).CH$_2$Cl$_2$, 0.43 g, 0.53 mmol), 1,1′-Bis(diphenylphosphino)ferrocene (0.30 g, 0.53 mmol), potassium acetate (5.27 g, 53.13 mmol) and 1,4-dioxane (61 ml) were added to 4-necked flask and stirred at 105° C. for 8 hours.

Then, the reaction mixture was passed through the filter that is carpeted with celite at room temperature, washed with toluene, and the obtained filtrate is subjected to vacuum concentration to distill away the solvent. The obtained concentrate is added with hexan (300 ml) and activated carbon (16 g), stirred at 70° C. for an hour, passed through the filter that is carpeted with celite, and the solvent is removed by subjecting the obtained filtrate to vacuum concentration. Then, recrystallization with methanol was performed. By further recrystallizing with hexan, 3.18 g of the desired compound 19 was obtained.

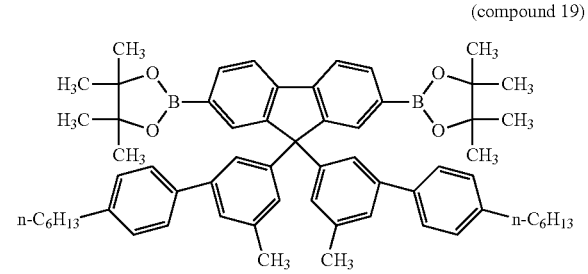

(compound 19)

Example 8

Synthesis of Polymer Compound 8

After combining compound 19 (2.7289 g, 2.97 mmol), compound 5 (1.4807 g, 2.70 mmol), compound 10 (0.1421 g, 0.30 mmol), dichlorobis(triphenylphosphine)palladium (2.18 mg) and toluene (71 ml) under an inert atmosphere, the mixture was heated to 105° C.

A 20 wt % tetraethylammonium hydroxide aqueous solution (10 ml) was added dropwise to the reaction mixture, which was then circulated for 1 hours. After the reaction, phenylboric acid (37 mg) and dichlorobis(triphenylphosphine)palladium (2.1 mg) were added and circulation was continued for 19.5 hours. Next, a sodium diethyldithocarbaminate aqueous solution was added and the mixture was stirred at 80° C. for 2 hours. After cooling, washing was performed twice with water (39 ml), twice with a 3 wt % acetic acid aqueous solution (39 ml) and twice with water (39 ml), and the obtained solution was added dropwise to methanol (500 ml) and filtered to obtain a precipitate.

The precipitate was dissolved in toluene (94 ml) and passed through an alumina column and a silica gel column in that order for purification. The obtained solution was added dropwise to methanol (325 ml) and stirred, and then the resulting precipitate was filtered and dried to obtain 2.61 g of polymer compound 8. The polystyrene equivalent number-average molecular weight of polymer compound 8 was $2.3 \times 10^5$, and the polystyrene equivalent weight-average molecular weight was $7.0 \times 10^5$.

Polymer compound 8 is a random copolymer comprising a constitutional unit represented by the following formula (8a):

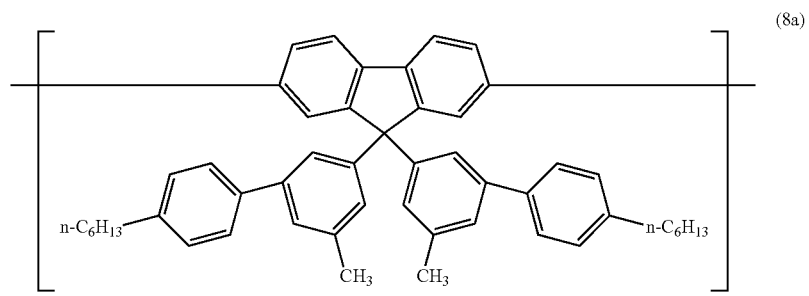

a constitutional unit represented by the following formula (8b):

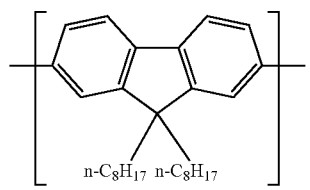

and a constitutional unit represented by the following formula (8c):

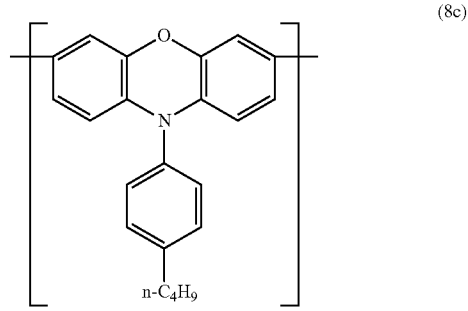

in a molar ratio of 50:45:5, as the theoretical value calculated from the charged starting materials.

Comparative Example 6

Fabrication and Evaluation of Light Emitting Device 8

Fabrication of Light Emitting Device 8
Light emitting device 8 was fabricated in the same manner as Comparative Example 2, except that hole transport layer was formed with a film thickness of 50 nm instead of 60 nm, polymer compound 7 was used instead of polymer compound 1 and polymer compound 4 was used instead of polymer compound 3 in Comparative Example 2.

Evaluation
Blue electroluminescence (EL) was observed when a voltage was applied to the light emitting device 8. The maximum current efficiency of the light emitting device 8 was 6.4 cd/A, and the maximum external quantum yield was 4.8%. Also, the luminance lifetime, which is the time from initial luminance of 3800 cd/m² to luminance half-life was measured to be 9.3 hours.

Example 9

Fabrication and Evaluation of Light Emitting Device 9

Fabrication of Light Emitting Device 9
Light emitting device 9 was fabricated in the same manner as Comparative Example 2, except that hole transport layer was formed with a film thickness of 50 nm instead of 60 nm, polymer compound 8 was used instead of polymer compound 1 and polymer compound 4 was used instead of polymer compound 3 in Comparative Example 2.

Evaluation

Blue electroluminescence (EL) was observed when a voltage was applied to the light emitting device 9. The maximum current efficiency of the light emitting device 9 was 13.3 cd/A, and the maximum external quantum yield was 7.8%. A voltage was applied for the same number of emitted photons as Comparative Example 6, and the luminance lifetime, as the time from initial luminance of 4900 cd/m$^2$ to luminance half-life was 81.8 hours.

Example 10

Fabrication and Evaluation of Light Emitting Device 10

Fabrication of Light Emitting Device 10
Light emitting device 10 was fabricated in the same manner as Comparative Example 2, except that hole transport layer was formed with a film thickness of 50 nm instead of 60 nm, polymer compound 5 was used instead of polymer compound 1 and polymer compound 4 was used instead of polymer compound 3 in Comparative Example 2.

Evaluation

Blue electroluminescence (EL) was observed when a voltage was applied to the light emitting device 10. The maximum current efficiency of the light emitting device 10 was 10.8 cd/A, and the maximum external quantum yield was 6.6%. A voltage was applied for the same number of emitted photons as Comparative Example 6, and the luminance lifetime, as the time from initial luminance of 4715 cd/m$^2$ to luminance half-life was 69.5 hours.

REFERENCE SIGNS LIST

10, 20 . . . substrate, 11, 21 . . . anode, 12, 22 . . . charge injection layer, 13 . . . hole transport layer, 14, 23 . . . luminescent layer, 15 . . . electron transport layer, 16 . . . charge injection layer, 17, 24 . . . cathode, 25 . . . protective layer, 100, 110 . . . light emitting device, 200 . . . planar light source.

What is claimed is:

1. A polymer compound comprising a constitutional unit represented by formula (1):

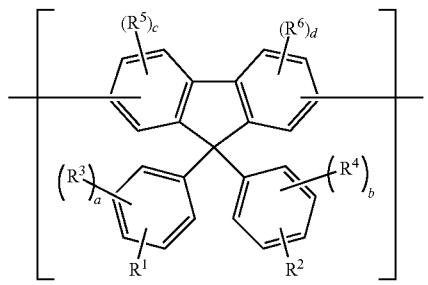

(1)

wherein in the formula (1), $R^1$ and $R^2$ each independently represent an unsubstituted alkyl group, $R^3$ and $R^4$ each independently represent a substituted aryl group, $R^5$ and $R^6$ each independently represent an unsubstituted or substituted alkyl, unsubstituted or substituted alkoxy or unsubstituted or substituted aryl group, the letters a and b represent an integer of 1, the letters c and d each independently represent an integer of 0-3, and when multiple $R^5$ and $R^6$ groups are present, they may be the same or different.

2. The polymer compound according to claim 1, wherein the constitutional unit represented by formula (1) is a constitutional unit represented by formula (2A):

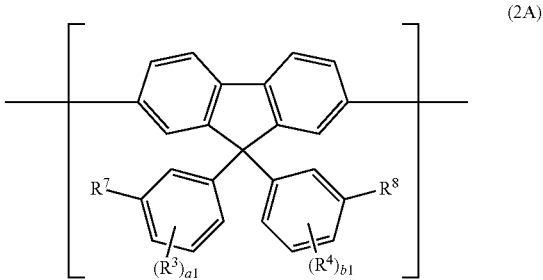

(2A)

wherein in the formula, $R^3$ and $R^4$ each independently represent a substituted aryl group, $R^7$ and $R^8$ each independently represent an unsubstituted alkyl group, the letters a1 and b1 represent an integer of 1.

3. The polymer compound according to claim 1, which further comprises one or more constitutional units selected from the group consisting of constitutional units represented by formula (6) and constitutional units represented by formula (7):

(6)

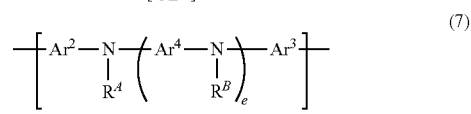

(7)

wherein in the formula (6), $Ar^1$ represents an unsubstituted or substituted arylene or unsubstituted or substituted divalent heterocyclic group, in the formula (7), $Ar^2$, $Ar^3$ and $Ar^4$ each independently represent an unsubstituted or substituted arylene group, an unsubstituted or substituted divalent aromatic heterocyclic group, or an unsubstituted or substituted divalent group bonded to two aromatic rings by a single bond, $R^A$ and $R^B$ each independently represent hydrogen, an unsubstituted or substituted alkyl group, an unsubstituted or substituted aryl group, or an unsubstituted or substituted monovalent heterocyclic group, and the letter e represents 0 or 1.

4. The polymer compound according to claim 3, wherein the constitutional unit represented by formula (6) is a constitutional unit represented by formula (8), 9) or (10):

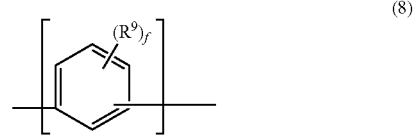

(8)

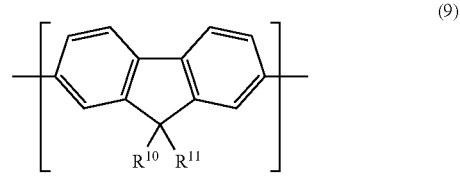

(9)

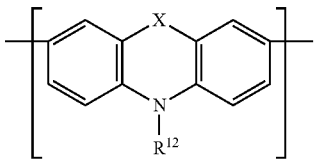

wherein in the formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group, the letter f represents an integer of 0-4, multiple $R^9$ groups may be the same or different, wherein in the formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group, and wherein in the formula (10), $R^{12}$ represents an unsubstituted alkyl, unsubstituted aryl, unsubstituted alkylaryl, unsubstituted alkoxyaryl or unsubstituted alkoxycarbonylaryl group, X is a single bond, —O—, —S— or —C($R^C$)$_2$—, $R^C$ represents an unsubstituted alkyl, unsubstituted aryl, unsubstituted alkylaryl or unsubstituted alkoxyaryl group, and the two $R^C$ groups may be the same or different.

5. The polymer compound according to claim 3, wherein the constitutional unit represented by formula (7) is a constitutional unit represented by formula (14):

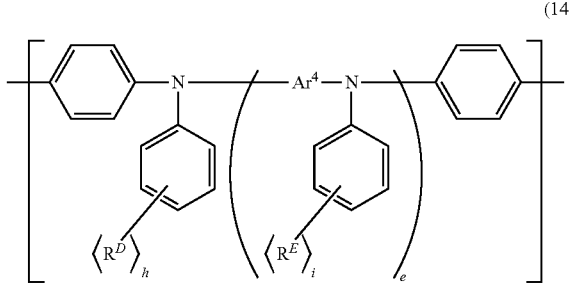

wherein in the formula (14), $Ar^4$ has the same meaning as above, $R^D$ and $R^E$ each independently represent an unsubstituted alkyl, unsubstituted alkoxy, unsubstituted aryl, unsubstituted alkylaryl, unsubstituted alkoxyaryl or unsubstituted alkoxycarbonyl group, the letters h and i each independently represent an integer of 0-5, when multiple $R^D$ and $R^E$ groups are present, they may be the same or different, and the letter e represents 0 or 1.

6. The polymer compound according to claim 1, which further comprises one or more constitutional units selected from the group consisting of constitutional units represented by formula (11), constitutional units represented by formula (12) and constitutional units represented by formula (13):

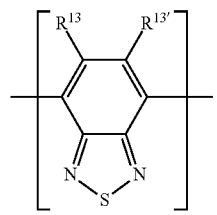

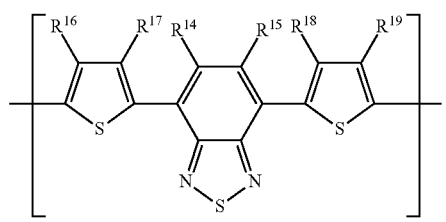

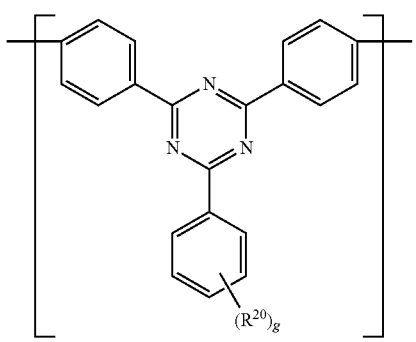

wherein in the formula (11), $R^{13}$ and $R^{13'}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group, wherein in the formula (12), $R^{14}$, $R^{15}$, $R^{16}$, $R^{17}$, $R^{18}$ and $R^{19}$ each independently represent hydrogen or an unsubstituted alkyl, unsubstituted alkoxy, unsubstituted aryl, unsubstituted alkylaryl, unsubstituted alkoxyaryl or unsubstituted alkoxycarbonylaryl group, wherein in the formula (13), $R^{20}$ represents an unsubstituted alkyl, unsubstituted alkoxy, unsubstituted aryl, alkylaryl, unsubstituted alkoxyaryl or unsubstituted alkoxycarbonylaryl group, the letter g represents an integer of 0-5, multiple $R^{20}$ groups may be the same or different.

7. The polymer compound according to claim 5, which consists of:
  a constitutional unit represented by formula (1), and
  one or more constitutional units selected from the group consisting of constitutional units represented by formula (8), constitutional units represented by formula (9), constitutional units represented by formula (10) and constitutional units represented by formula (14):

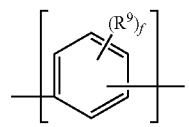

-continued

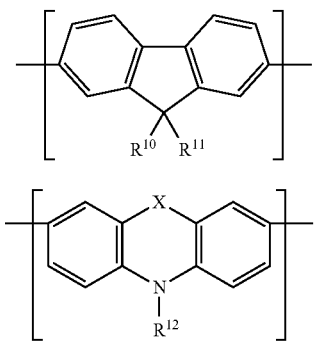

(9)

(10)

wherein in the formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group, the letter f represents an integer of 0-4, multiple $R^9$ groups may be the same or different, wherein in the formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group, and wherein in the formula (10), $R^{12}$ represents an unsubstituted alkyl, unsubstituted aryl, unsubstituted alkylaryl, unsubstituted alkoxyaryl or unsubstituted alkoxycarbonylaryl group, X is a single bond, —O—, —S— or —C($R^C$)$_2$—, $R^C$ represents an unsubstituted alkyl, unsubstituted aryl, unsubstituted alkylaryl or unsubstituted alkoxyaryl group, and the two $R^C$ groups may be the same or different.

8. The polymer compound according to claim 6, which consists of:
a constitutional unit represented by formula (1),
at least one constitutional unit selected from the group consisting of constitutional units represented by formula (8), constitutional units represented by formula (9), constitutional units represented by formula (10) and constitutional units represented by formula (14), and
at least one constitutional unit selected from the group consisting of constitutional units represented by formula (11), constitutional units represented by formula (12) and constitutional units represented by formula (13):

(8)

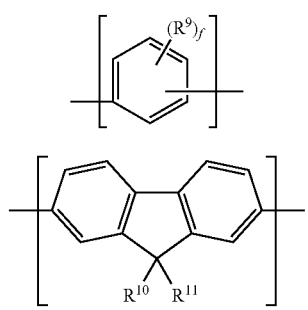

(9)

-continued (10)

(14)

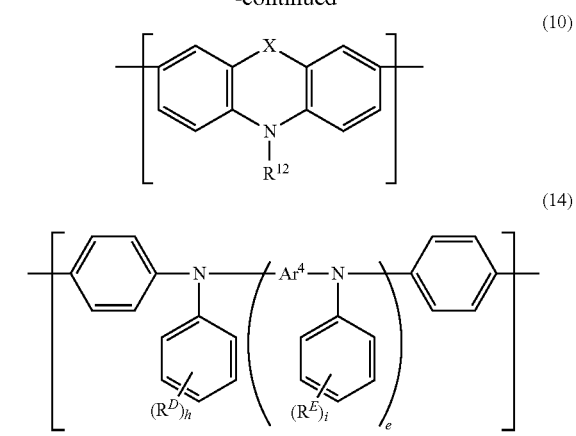

wherein in the formula (8), $R^9$ represents an unsubstituted alkyl, unsubstituted alkoxy, unsubstituted aryl, unsubstituted alkylaryl, unsubstituted alkoxyaryl or unsubstituted alkoxycarbonylaryl group, the letter f represents an integer of 0-4, multiple $R^9$ groups may be the same or different, wherein in the formula (9), $R^{10}$ and $R^{11}$ each independently represent an unsubstituted alkyl, unsubstituted alkoxy, unsubstituted aryl, unsubstituted alkoxyaryl or unsubstituted alkoxycarbonylaryl group, wherein in the formula (10), $R^{12}$ represents an unsubstituted alkyl, unsubstituted aryl, unsubstituted alkylaryl, unsubstituted alkoxyaryl or unsubstituted alkoxycarbonylaryl group, X is a single bond, —O—, —S— or —C($R^C$)$_2$—, $R^C$ represents an unsubstituted alkyl, unsubstituted aryl, unsubstituted alkylaryl or unsubstituted alkoxyaryl group, and the two $R^C$ groups may be the same or different, and wherein in the formula (14), $Ar^4$ has the same meaning as above, $R^D$ and $R^E$ each independently represent an unsubstituted alkyl, unsubstituted alkoxy, unsubstituted aryl, unsubstituted alkylaryl, unsubstituted alkoxyaryl or unsubstituted alkoxycarbonyl group, the letters h and i each independently represent an integer of 0-5, and when multiple $R^D$ and $R^E$ groups are present, they may be the same or different, and the letter e represents 0 or 1.

9. A composition comprising at least one material selected from the group consisting of hole transport materials, electron transport materials and luminescent materials, and a polymer compound according to claim 1.

10. A composition according to claim 9, wherein the luminescent materials is a triplet light emitting complex.

11. A composition comprising a polymer compound according to claim 1, and a solvent.

12. A thin-film comprising a polymer compound according to claim 1.

13. A light emitting device having electrodes consisting of an anode and a cathode, and a layer comprising a polymer compound according to claim 1 formed between the electrodes.

* * * * *